(12) United States Patent
Nakazawa et al.

(10) Patent No.: US 10,957,801 B2
(45) Date of Patent: Mar. 23, 2021

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Yasutaka Nakazawa, Tochigi (JP); Yukinori Shima, Gunma (JP); Kenichi Okazaki, Tochigi (JP); Junichi Koezuka, Tochigi (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/481,512

(22) PCT Filed: Jan. 26, 2018

(86) PCT No.: PCT/IB2018/050471
§ 371 (c)(1),
(2) Date: Jul. 29, 2019

(87) PCT Pub. No.: WO2018/146569
PCT Pub. Date: Aug. 16, 2018

(65) Prior Publication Data
US 2019/0393354 A1    Dec. 26, 2019

(30) Foreign Application Priority Data

Feb. 7, 2017 (JP) .............................. JP2017-020695

(51) Int. Cl.
*H01L 29/786* (2006.01)
*G09F 9/30* (2006.01)
(Continued)

(52) U.S. Cl.
CPC ............ *H01L 29/7869* (2013.01); *G09F 9/30* (2013.01); *H01L 21/02164* (2013.01);
(Continued)

(58) Field of Classification Search
CPC ......... H01L 21/02323; H01L 21/02164; H01L 21/02172; H01L 21/02274; H01L 21/02488; H01L 29/7869; H01L 21/3226
See application file for complete search history.

(56) References Cited

U.S. PATENT DOCUMENTS 8,748,215 B2   6/2014   Yamazaki
8,772,094 B2   7/2014   Yamade et al.
(Continued)

FOREIGN PATENT DOCUMENTS

CN   102668028 A   9/2012
EP    2504855 A    10/2012
(Continued)

OTHER PUBLICATIONS

International Search Report (Application No. PCT/IB2018/050471) dated May 1, 2018.
(Continued)

*Primary Examiner* — Changhyun Yi
(74) *Attorney, Agent, or Firm* — Fish & Richardson P.C.

(57) ABSTRACT

A semiconductor device which has favorable electrical characteristics is provided. A method for manufacturing a semiconductor device with high productivity is provided. A method for manufacturing a semiconductor device with a high yield is provided.
A method for manufacturing a semiconductor device includes a first step of forming a first insulating layer containing silicon and nitrogen, a second step of adding oxygen in a vicinity of a surface of the first insulating layer, a third step of forming a semiconductor layer containing a
(Continued)

metal oxide over and in contact with the first insulating layer, a fourth step of forming a second insulating layer containing oxygen over and in contact with the semiconductor layer, a fifth step of performing plasma treatment in an atmosphere containing oxygen at a first temperature, a sixth step of performing plasma treatment in an atmosphere containing oxygen at a second temperature lower than the first temperature, and a seventh step of forming a third insulating layer containing silicon and nitrogen over the second insulating layer.

14 Claims, 35 Drawing Sheets

(51) Int. Cl.
| | | |
|---|---|---|
| *H01L 21/02* | (2006.01) | |
| *H01L 29/51* | (2006.01) | |
| *H01L 29/66* | (2006.01) | |
| *H05B 33/10* | (2006.01) | |
| *H05B 33/14* | (2006.01) | |

(52) U.S. Cl.
CPC .. *H01L 21/02172* (2013.01); *H01L 21/02274* (2013.01); *H01L 21/02323* (2013.01); *H01L 21/02554* (2013.01); *H01L 29/517* (2013.01); *H01L 29/66742* (2013.01); *H05B 33/10* (2013.01); *H05B 33/14* (2013.01)

(56) References Cited

U.S. PATENT DOCUMENTS

| | | | |
|---|---|---|---|
| 8,803,149 | B2 * | 8/2014 | Sakata ............... H01L 29/78618 257/59 |
| 9,293,589 | B2 | 3/2016 | Yamazaki et al. |
| 9,520,287 | B2 | 12/2016 | Yamazaki |
| 9,564,535 | B2 | 2/2017 | Yamazaki et al. |
| 9,905,435 | B2 | 2/2018 | Koezuka et al. |
| 10,079,310 | B2 | 9/2018 | Yamazaki |
| 10,243,081 | B2 | 3/2019 | Yamazaki et al. |
| 10,249,764 | B2 | 4/2019 | Yamazaki |
| 10,347,771 | B2 | 7/2019 | Yamazaki |
| 2011/0127521 | A1 | 6/2011 | Yamazaki |
| 2011/0215328 | A1 | 9/2011 | Morosawa et al. |
| 2013/0137226 | A1 | 5/2013 | Yamade et al. |
| 2013/0187153 | A1 | 7/2013 | Yamazaki et al. |
| 2013/0207111 | A1 | 8/2013 | Yamazaki |
| 2013/0320334 | A1 | 12/2013 | Yamazaki et al. |
| 2015/0249157 | A1 * | 9/2015 | Yamazaki ............. H01L 29/518 257/43 |
| 2015/0340505 | A1 * | 11/2015 | Yamazaki ............. H01L 29/401 438/104 |
| 2016/0079089 | A1 | 3/2016 | Koezuka et al. |
| 2017/0141234 | A1 | 5/2017 | Yamazaki et al. |
| 2017/0162715 | A1 * | 6/2017 | Okada ............... H01L 29/78603 |
| 2018/0174862 | A1 | 6/2018 | Koezuka et al. |

FOREIGN PATENT DOCUMENTS

| | | |
|---|---|---|
| JP | 2011-135066 A | 7/2011 |
| JP | 2011-187506 A | 9/2011 |
| JP | 2013-140949 A | 7/2013 |
| JP | 2013-175713 A | 9/2013 |
| JP | 2013-179290 A | 9/2013 |
| JP | 2013-201428 A | 10/2013 |
| JP | 2014-007399 | 1/2014 |
| JP | 2015-179839 A | 10/2015 |
| JP | 2016-063225 A | 4/2016 |
| KR | 2012-0109526 A | 10/2012 |
| KR | 2013-0092463 A | 8/2013 |
| KR | 2014-0116391 A | 10/2014 |
| KR | 2015-0102742 A | 9/2015 |
| TW | 201137984 | 11/2011 |
| TW | 201338174 | 9/2013 |
| TW | 201349501 | 12/2013 |
| WO | WO-2011/065216 | 6/2011 |
| WO | WO-2013/111756 | 8/2013 |

OTHER PUBLICATIONS

Written Opinion (Application No. PCT/IB2018/050471) dated May 1, 2018.

* cited by examiner

SEMICONDUCTOR DEVICE AND METHOD FOR MANUFACTURING SEMICONDUCTOR DEVICE

CROSS REFERENCE TO RELATED APPLICATIONS

This application is a U.S. National Phase Application under 35 U.S.C. § 371 of International Application PCT/IB2018/050471, filed on Jan. 26, 2018, which claims the benefit of a foreign priority application filed in Japan as Application No. 2017-020695 on Feb. 7, 2017, both of which are incorporated by reference.

TECHNICAL FIELD

One embodiment of the present invention relates to a semiconductor device and a manufacturing method thereof. One embodiment of the present invention relates to a transistor and a manufacturing method thereof. One embodiment of the present invention relates to a display device and a manufacturing method thereof.

Note that in this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

Note that one embodiment of the present invention is not limited to the above technical field. As the technical field of one embodiment of the present invention disclosed in this specification and the like, a semiconductor device, a display device, a light-emitting device, a lighting device, a power storage device, a memory device, a driving method thereof, and a manufacturing method thereof can be given as examples.

BACKGROUND ART

As a semiconductor material that can be used in a transistor, an oxide semiconductor has been attracting attention. For example, Patent Document 1 discloses a semiconductor device whose field-effect mobility (in some cases, simply referred to as mobility or μFE) is increased, which is obtained in such a manner that a plurality of oxide semiconductor layers are stacked and among the plurality of oxide semiconductor layers, the oxide semiconductor layer serving as a channel contains indium and gallium where the proportion of indium is higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using amorphous silicon can be retrofitted and utilized. A transistor using a metal oxide has high field-effect mobility; therefore, a high-performance display device where driver circuits are integrally formed can be obtained.

REFERENCE

Patent Document

[Patent Document 1] Japanese Published Patent Application No. 2014-7399

SUMMARY OF THE INVENTION

Problems to be Solved by the Invention

One object of one embodiment of the present invention is to provide a semiconductor device which has favorable electrical characteristics. Alternatively, another object is to provide a method for manufacturing a semiconductor device with high productivity. Alternatively, another object is to provide a method for manufacturing a semiconductor device with a high yield. Alternatively, another object is to provide a semiconductor device with stable electrical characteristics. Alternatively, another object is to provide a semiconductor device with low power consumption. Alternatively, another object is to provide a highly reliable semiconductor device.

Note that the descriptions of these objects do not disturb the existence of other objects. Note that in one embodiment of the present invention, there is no need to achieve all the objects. Note that other objects can be derived from the description of the specification, the drawings, the claims, and the like.

Means for Solving the Problems

One embodiment of the present invention is a method for manufacturing a semiconductor device including a first step of forming a first insulating layer containing silicon and nitrogen, a second step of adding oxygen in a vicinity of a surface of the first insulating layer, a third step of forming a semiconductor layer containing a metal oxide over and in contact with the first insulating layer, a fourth step of forming a second insulating layer containing oxygen over and in contact with the semiconductor layer, a fifth step of performing plasma treatment in an atmosphere containing oxygen at a first temperature, a sixth step of performing plasma treatment in an atmosphere containing oxygen at a second temperature, and a seventh step of forming a third insulating layer containing silicon and nitrogen over the second insulating layer. The second temperature is preferably lower than the first temperature.

In the above, it is preferable that the first temperature be a temperature higher than or equal to 250° C. and lower than or equal to 450° C. and the second temperature be a temperature higher than or equal to 150° C. and lower than or equal to 300° C.

In the above, the fifth step is preferably performed without exposure to atmospheric air after formation of the second insulating layer.

In the above, it is preferable to include an eighth step of performing plasma treatment in an atmosphere containing oxygen at a third temperature between the third step and the fourth step. At this time, the third temperature is preferably higher than the second temperature.

In the above, formation of the second insulating layer is preferably performed at the first temperature.

Another embodiment of the present invention is a semiconductor device including a first conductive layer, a first insulating layer, a semiconductor layer, a second insulating layer, and a third insulating layer. The first conductive layer, the first insulating layer, the semiconductor layer, the second insulating layer, and the third insulating layer are stacked in this order. The first insulating layer contains silicon and nitrogen. The semiconductor layer contains a metal oxide. The second insulating layer contains oxygen. The third insulating layer contains silicon and nitrogen. The first insulating layer includes a first region including a surface in contact with the semiconductor layer and the other second region, and the first region has a higher concentration of oxygen than the second region.

In the above, the second insulating layer preferably has a lower concentration of nitrogen than the third insulating layer.

In the above, it is preferable that the second insulating layer have a smaller thickness than the third insulating layer.

In the above, the semiconductor layer preferably has a structure in which a first metal oxide film and a second metal oxide film are stacked. At this time, the first metal oxide film includes a portion in contact with the first region of the first insulating layer. In addition, the second metal oxide film includes a portion in contact with the second insulating layer. Moreover, the first metal oxide film preferably has lower crystallinity than the second metal oxide film.

In the above, a second conductive layer and a third conductive layer are preferably included. At this time, the second conductive layer and the third conductive layer each preferably include a portion in contact with the semiconductor layer and a portion positioned between the first insulating layer and the second insulating layer. Alternatively, the second conductive layer and the third conductive layer each preferably include a portion positioned over the second insulating layer and a portion in contact with the semiconductor layer through an opening provided in the second insulating layer.

In the above, the second conductive layer and the third conductive layer each preferably include a first conductive film, a second conductive film, and a third conductive film. At this time, the first conductive film includes a portion in contact with the semiconductor layer. The second conductive film is provided over the third conductive film. The third conductive film is provided to cover a top surface and a side surface of the second conductive film and includes a portion in contact with the first conductive film. In addition, it is preferable that the first conductive film and the second conductive film contain metal elements different from each other and the second conductive film and the third conductive film contain metal elements different from each other.

In the above, the first conductive film and the third conductive film preferably contain the same metal element. In addition, the second conductive film preferably contains a material having lower resistance than those of the first conductive layer and the third conductive layer.

In the above, the first conductive film and the third conductive film preferably contain titanium or molybdenum. In addition, the second conductive film preferably contains copper or aluminum.

Effect of the Invention

With one embodiment of the present invention, a semiconductor device which has favorable electrical characteristics can be provided. Alternatively, a method for manufacturing a semiconductor device with high productivity can be provided. Alternatively, a method for manufacturing a semiconductor device with a high yield can be provided. Alternatively, a semiconductor device with stable electrical characteristics can be provided. Alternatively, a semiconductor device with low power consumption can be provided. Alternatively, a highly reliable semiconductor device can be provided.

Note that the description of these effects does not preclude the existence of other effects. Note that one embodiment of the present invention does not necessarily achieve all the effects listed above. Note that other effects can be derived from the description of the specification, the drawings, the claims, and the like.

BRIEF DESCRIPTION OF THE DRAWINGS

FIGS. 3A and 3B1 A structural example of a semiconductor device.
FIGS. 6A and 6B1 A structural example of a semiconductor device.
FIGS. 11A and 11B1 Structure examples of display devices.
FIGS. 23A and 23B1 Id-Vg characteristics of transistors of Example 2.
FIGS. 25A and 25B1 A block diagram illustrating a display module of Example 3 and a circuit diagram illustrating a pixel of Example 3.
FIGS. 26A and 26B Top views illustrating pixel layouts of Example 3.

MODE FOR CARRYING OUT THE INVENTION

Figure 1A:
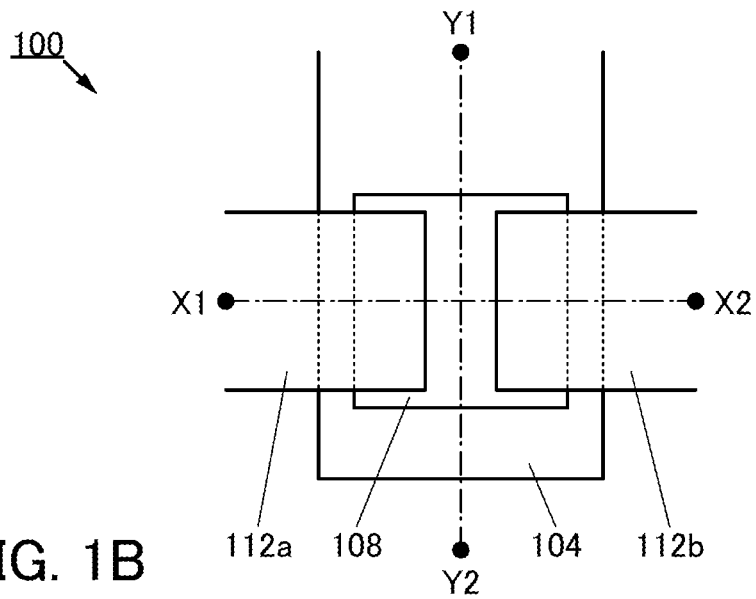
FIGS. 1A-1C A structural example of a semiconductor device.

Embodiments will be described below with reference to drawings. Note that embodiments can be implemented in many different modes, and it will be readily appreciated by those skilled in the art that modes and details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings schematically show ideal examples, and embodiments are not limited to shapes, values, or the like shown in the drawings.

Note that ordinal numbers such as "first", "second", and "third" used in this specification are used in order to avoid confusion among components, and the terms do not limit the components numerically.

In this specification, terms for describing arrangement, such as "over" and "under", are used for convenience in describing a positional relation between components with reference to drawings. Furthermore, the positional relation between components is changed as appropriate in accordance with a direction in which each component is described. Thus, terms for the description is not limited to those used in this specification, and the description can be changed appropriately depending on the situation.

In this specification and the like, a transistor is an element having at least three terminals of a gate, a drain, and a source. In addition, a channel region is provided between the drain (a drain terminal, a drain region, or a drain electrode) and the source (a source terminal, a source region, or a source electrode), and current can flow between the source and the drain through the channel region. Note that in this specification and the like, a channel region refers to a region through which current mainly flows.

Furthermore, functions of a source and a drain might be switched when a transistor of opposite polarity is employed or a direction of current is changed in circuit operation, for example. Therefore, the terms source and drain can be used interchangeably in this specification and the like.

Furthermore, in this specification and the like, "electrically connected" includes the case where connection is made through an "object having any electric function". Here, there is no particular limitation on the "object having any electric function" as long as electric signals can be transmitted and received between the connected components. Examples of an "object having any electric function" include a switching element such as a transistor, a resistor, an inductor, a capacitor, and other elements with a variety of functions as well as an electrode and a wiring.

Furthermore, in this specification and the like, "parallel" indicates a states where two straight lines are located at an angle of greater than or equal to −10° and less than or equal to 10°. Thus, the case where the angle is greater than or equal to −5° and less than or equal to 5° is also included. In addition, "perpendicular" indicates a state where two straight lines are located at an angle of greater than or equal to 80° and less than or equal to 100°. Thus, the case where the angle is greater than or equal to 85° and less than or equal to 95° is also included.

Furthermore, in this specification and the like, the term "film" and the term "layer" can be interchanged with each other. For example, the term "conductive layer" can be changed into the term "conductive film" in some cases. Alternatively, for example, the term "insulating film" can be changed into the term "insulating layer" in some cases.

Furthermore, unless otherwise specified, off-state current in this specification and the like refers to a drain current of a transistor in an off state (also referred to as a non-conducting state or a cutoff state). Unless otherwise specified, the off state of an n-channel transistor refers to a state where the voltage Vgs between its gate and source is lower than the threshold voltage Vth, and the off state of a p-channel transistor refers to a state where the voltage Vgs between its gate and source is higher than the threshold voltage Vth. For example, the off-state current of an n-channel transistor sometimes refers to a drain current at the time when the voltage Vgs between its gate and source is lower than the threshold voltage Vth.

The off-state current of a transistor depends on Vgs in some cases. Thus, when there is Vgs with which the off-state current of the transistor is lower than or equal to I, it may be said that the off-state current of the transistor is lower than or equal to I. The off-state current of a transistor means the off-state current in an off state at predetermined Vgs, the off-state current in an off state at Vgs in a predetermined range, or the off-state current in an off state at Vgs with which sufficiently reduced off-state current is obtained, for example.

As an example, the assumption is made of an n-channel transistor where the threshold voltage Vth is 0.5 V, and the drain current is $1 \times 10^{-9}$ A at Vgs of 0.5 V, the drain current is $1 \times 10^{-13}$ A at Vgs of 0.1 V, the drain current is $1 \times 10^{-19}$ A at Vgs of −0.5 V, and the drain current is $1 \times 10^{-22}$ A at Vgs of −0.8 V. The drain current of the transistor is lower than or equal to $1 \times 10^{-19}$ A at Vgs of −0.5 V or at Vgs in the range of −0.5 V to −0.8 V; therefore, it is sometimes said that the off-state current of the transistor is lower than or equal to $1 \times 10^{-19}$ A. Since there is Vgs at which the drain current of the transistor is lower than or equal to $1 \times 10^{-22}$ A, it is sometimes said that the off-state current of the transistor is lower than or equal to $1 \times 10^{-22}$ A.

Furthermore, in this specification and the like, the off-state current of a transistor with a channel width W is sometimes represented by a current value per channel width W. Alternatively, it is sometimes represented by the value of flowing current per given channel width (e.g., 1 μm). In the latter case, the off-state current may be represented by the unit with the dimension of current per length (e.g., A/μm).

The off-state current of a transistor depends on temperature in some cases. Unless otherwise specified, the off-state current in this specification may be off-state current at room temperature, 60° C., 85° C., 95° C., or 125° C. Alternatively, the off-state current may be off-state current at a temperature at which reliability of a semiconductor device or the like including the transistor is ensured or a temperature at which a semiconductor device or the like including the transistor is used (e.g., any temperature in the range of 5° C. to 35° C.). When there is Vgs at which the off-state current of a transistor at room temperature, 60° C., 85° C., 95° C., 125° C., a temperature at which reliability of a semiconductor device including the transistor is ensured, or a temperature at which the semiconductor device or the like including the transistor is used (e.g., any temperature in the range of 5° C. to 35° C.) is lower than or equal to I, it may be said that the off-state current of the transistor is lower than or equal to I.

The off-state current of a transistor depends on voltage Vds between its drain and source in some cases. Unless otherwise specified, the off-state current in this specification may be off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at Vds at which reliability of a semiconductor device or the like including the transistor is ensured or Vds used in the semiconductor device or the like including the transistor. When there is Vgs at which the off-state current of a transistor at Vds of 0.1 V, 0.8 V, 1 V, 1.2 V, 1.8 V, 2.5 V, 3 V, 3.3 V, 10 V, 12 V, 16 V, or 20 V, at Vds at which reliability of a semiconductor device including the transistor is ensured, or at Vds used in the semiconductor device or the like including the transistor is lower than or equal to I, it may be said that the off-state current of the transistor is lower than or equal to I.

In the above description of off-state current, a drain may be replaced with a source. That is, the off-state current sometimes refers to current that flows through a source of a transistor in an off state.

Furthermore, in this specification and the like, leakage current sometimes expresses the same meaning as off-state current. Furthermore, in this specification and the like, the off-state current sometimes refers to current that flows between a source and a drain of a transistor in an off state, for example.

Furthermore, in this specification and the like, the threshold voltage of a transistor refers to a gate voltage (Vg) at which a channel is formed in the transistor. Specifically, in a graph where the horizontal axis represents the gate voltage (Vg) and the vertical axis represents the square root of drain current (Id), the threshold voltage of a transistor may refer to a gate voltage (Vg) at the intersection of the square root of drain current (Id) of 0 (Id is 0 A) and an extrapolated straight line that is tangent with the highest inclination to a plotted curve (Vg-√Id characteristics). Alternatively, the threshold voltage of a transistor may refer to a gate voltage (Vg) at which the value of Id [A]×L [μm]/W [μm] is $1\times10^{-9}$ [A] where L is channel length and W is channel width.

Furthermore, in this specification and the like, a "semiconductor" has characteristics of an "insulator" in some cases when the conductivity is sufficiently low, for example. Furthermore, a "semiconductor" and an "insulator" cannot be strictly distinguished from each other in some cases because a border therebetween is not clear. Therefore, a "semiconductor" in this specification and the like can be replaced with an "insulator" in some cases.

Furthermore, in this specification and the like, a "semiconductor" has characteristics of a "conductor" in some cases when the conductivity is sufficiently high, for example. Furthermore, a "semiconductor" and a "conductor" cannot be strictly distinguished from each other in some cases because a border therebetween is not clear. Therefore, a "semiconductor" in this specification and the like can be replaced with a "conductor" in some cases.

Furthermore, in this specification and the like, an atomic ratio being In:Ga:Zn=4:2:3 or a neighborhood thereof refers to an atomic ratio where, when the proportion of In to the total number of atoms of In, Ga, and Zn is 4, the proportion of Ga is greater than or equal to 1 and less than or equal to 3 and the proportion of Zn is greater than or equal to 2 and less than or equal to 4. Furthermore, an atomic ratio being In:Ga:Zn=5:1:6 or a neighborhood thereof refers to an atomic ratio where, when the proportion of In to the total number of atoms of In, Ga, and Zn is 5, the proportion of Ga is greater than 0.1 and less than or equal to 2 and the proportion of Zn is greater than or equal to 5 and less than or equal to 7. Furthermore, an atomic ratio being In:Ga:Zn=1:1:1 or a neighborhood thereof refers to an atomic ratio where, when the proportion of In to the total number of atoms of In, Ga, and Zn is 1, the proportion of Ga is greater than 0.1 and less than or equal to 2 and the proportion of Zn is greater than 0.1 and less than or equal to 2.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is called an oxide semiconductor in some cases. In addition, in the case where an "OS FET" is stated, it can also be called a transistor including a metal oxide or an oxide semiconductor.

Furthermore, in this specification and the like, metal oxides containing nitrogen are also collectively referred to as a metal oxide in some cases. Moreover, a metal oxide containing nitrogen may be referred to as a metal oxynitride.

Furthermore, in this specification and the like, CAAC (c-axis aligned crystal) and CAC (Cloud-Aligned Composite) may be stated in some cases. Note that CAAC refers to an example of a crystal structure, and CAC refers to an example of a function or a material composition.

Furthermore, in this specification and the like, a CAC-OS or a CAC-metal oxide has a conducting function in part of the material and has an insulating function in another part of the material, and has a function of a semiconductor as a whole. Note that in the case where the CAC-OS or the CAC-metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

Furthermore, in this specification and the like, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. When carriers are made to flow in this composition, the carriers mainly flow in the component having a narrow gap. Furthermore, the component having a narrow gap complements the component having a wide gap, and the carriers also flow in the component having a wide gap in conjunction with the component having a narrow gap. Therefore, in the case where the above-described CAC-OS or CAC-metal oxide is used in a channel region of a transistor, high current drive capability in the on state of the transistor, that is, a high on-state current and high field-effect mobility, can be obtained.

In other words, the CAC-OS or the CAC-metal oxide can also be called a matrix composite or a metal matrix composite.

An example of a crystal structure of a metal oxide is described. Note that a metal oxide deposited by a sputtering method using an In—Ga—Zn oxide target (In:Ga:Zn=4:2: 4.1 [atomic ratio]) is described below as an example. A metal oxide formed by a sputtering method using the above-described target at a substrate temperature higher than or equal to 100° C. and lower than or equal to 130° C. is referred to as sIGZO, and a metal oxide formed by a sputtering method using the above-described target with a substrate temperature set at room temperature (R.T.) is referred to as tIGZO. For example, sIGZO has one or both of crystal structures of nc (nano crystal) and CAAC. Furthermore, tIGZO has a crystal structure of nc. Note that room temperature (R.T.) here also includes a temperature in the case where a substrate is not heated intentionally. Note that the CAAC structure is a crystal structure in which a plurality of IGZO nanocrystals have c-axis alignment and are connected in the a-b plane direction without alignment.

In this specification and the like, a display panel which is one embodiment of the display device has a function of displaying (outputting) an image or the like on (to) a display surface. Thus, the display panel is one embodiment of an output device.

Furthermore, in this specification and the like, a substrate of a display panel to which, for example, a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Furthermore, in this specification and the like, a touch sensor has a function of sensing the contact, press, approach, or the like of a sensing target such as a finger or a stylus. In addition, the touch sensor may have a function of sensing the positional data. Therefore, the touch sensor is one embodiment of an input device. For example, the touch sensor can have a structure including one or more sensor elements.

Furthermore, in this specification and the like, a substrate provided with a touch sensor is referred to as a touch sensor panel or simply a touch sensor or the like in some cases. In addition, in this specification and the like, a substrate of a touch sensor panel to which, for example, a connector such as an FPC or a TCP is attached, or a substrate on which an IC is mounted by a COG method or the like is referred to as a touch sensor panel module, a touch sensor module, a sensor module, or simply a touch sensor or the like in some cases.

Note that in this specification and the like, a touch panel which is one embodiment of the display device has a function of displaying (outputting) an image or the like on (to) a display surface and a function as a touch sensor capable of sensing the contact, press, approach, or the like of a sensing target such as a finger or a stylus with or to the display surface. Therefore, the touch panel is an embodiment of an input/output device.

A touch panel can be referred to as, for example, a display panel (or a display device) with a touch sensor or a display panel (or a display device) having a touch sensor function.

A touch panel can have a structure including a display panel and a touch sensor panel. Alternatively, a touch panel can have a structure having a function as a touch sensor inside or on a surface of a display panel.

Furthermore, in this specification and the like, a substrate of a touch panel to which, for example, a connector such as an FPC or a TCP is attached, or a substrate on which an IC is mounted by a COG method or the like is referred to as a touch panel module, a display module, or simply a touch panel or the like in some cases.

Embodiment 1

In this embodiment, a semiconductor device of one embodiment of the present invention and a manufacturing method thereof will be described. Here, a transistor which is one embodiment of the semiconductor device will be described.

A transistor of one embodiment of the present invention includes a first conductive layer functioning as a gate electrode, a first insulating layer functioning as a gate insulating layer, a semiconductor layer, and a second conductive layer and a third conductive layer each functioning as a source electrode or a drain electrode.

It is preferable to use a metal oxide film for the semiconductor layer. For example, it is preferable to use an oxide containing one or more of indium, gallium, and zinc.

The transistor of one embodiment of the present invention preferably has a stacked-layer structure of a first conductive layer, a first insulating layer, a semiconductor layer, a second insulating layer, and a third insulating layer.

The first insulating layer functioning as a gate insulating layer and the third insulating layer functioning as a protective layer preferably include an insulating film containing silicon and nitrogen as its main component. Such an insulating film has a feature that water, hydrogen, oxygen, and the like are less likely to be diffused. Thus, with a structure in which the semiconductor layer is sandwiched between the first insulating layer and the third insulating layer, an effect of preventing diffusion of water or hydrogen from the outside into the semiconductor layer and an effect of preventing outward diffusion (release) of oxygen from the semiconductor layer are achieved.

In particular, a silicon nitride film formed by a plasma CVD (Chemical Vapor Deposition) method can be used as the first insulating layer and the third insulating layer. A silicon nitride film formed by such a deposition method is very dense and defects such as a pinhole are less likely to be formed; thus, the silicon nitride film can be suitably used as a barrier film that suppresses diffusion of water, hydrogen, and oxygen. In addition, the deposition rate can be increased, and the productivity can be improved.

Furthermore, a region containing oxygen is preferably formed on a surface of the first insulating layer, which is in contact with the semiconductor layer, and in the vicinity thereof. For example, treatment for making oxygen contained in (adding oxygen to) a portion of the first insulating layer, which is in contact with the semiconductor layer, is performed, whereby a region partly containing a large amount of oxygen can be formed. In addition, by such treatment, a secondary effect of reducing the hydrogen concentration in the region is achieved in some cases.

Here, the silicon nitride film formed by a plasma CVD method or the like contains a large amount of hydrogen in many cases, and when provided in contact with a metal oxide film, hydrogen in the silicon nitride film is diffused into the metal oxide film and the carrier concentration of the metal oxide film increases in some cases. However, in one embodiment of the present invention, a structure in which a region where the hydrogen concentration is reduced and a large amount of oxygen is contained is sandwiched between a region of the silicon nitride film containing hydrogen and the metal oxide film can be obtained. Therefore, even in the case where the silicon nitride film formed by a plasma CVD method is used as the first insulating layer, diffusion of hydrogen into the semiconductor layer can be effectively suppressed, so that a highly reliable transistor can be obtained.

The second insulating layer in contact with a top surface of the semiconductor layer preferably contains oxygen. Furthermore, for the second insulating layer, a material with lower nitrogen concentration than the third insulating layer is preferably used. For example, an insulating film containing silicon and oxygen, an insulating film containing silicon, oxygen, and nitrogen, or the like is preferably used. Alternatively, for example, an insulating film containing aluminum or hafnium, and oxygen may be used. In particular, for example, a silicon oxide film or a silicon oxynitride film is further preferably used.

Furthermore, after the second insulating layer is formed, treatment for supplying oxygen to the second insulating layer at a first temperature is preferably performed. Plasma treatment in an atmosphere containing oxygen (hereinafter also referred to as oxygen plasma treatment) is preferably performed. The oxygen plasma treatment is preferably performed without exposure to the atmospheric air after the deposition of the second insulating layer. It is particularly preferable that the oxygen plasma treatment be performed at a temperature that is the same as the deposition temperature of the insulating film forming the second insulating layer.

Furthermore, after the oxygen plasma treatment is performed at the first temperature, plasma treatment in an atmosphere containing oxygen is preferably performed at a second temperature lower than the first temperature.

By the oxygen plasma treatment at the first temperature, oxygen can be effectively supplied to the semiconductor layer through the second insulating layer. At this time, the plasma treatment is performed at a relatively high temperature, so that part of oxygen in the second insulating layer is released in some cases. Thus, oxygen plasma treatment is performed again at the second temperature lower than the first temperature so that a large amount of oxygen can be contained in the second insulating layer.

Note that the number of times of oxygen plasma treatment is not limited to two, and may be three or more times. The second insulating layer containing a large amount of oxygen can be obtained as the number of times of the plasma treatment is larger. Furthermore, in the case of performing oxygen plasma treatment three or more times, treatment temperatures of second oxygen plasma treatment and subsequent oxygen plasma treatment are preferably temperatures that are the same as or lower than the treatment temperature of the preceding oxygen plasma treatment.

Furthermore, the third insulating layer that is less likely to transmit oxygen is formed after the oxygen plasma treatment is performed twice, whereby a large amount of oxygen can be confined in the semiconductor layer and the second insulating layer.

By performing heat treatment after the formation of the third insulating layer, a large amount of oxygen contained in the second insulating layer can be supplied to the semiconductor layer. Alternatively, when the third insulating layer is formed at a temperature higher than the second temperature, a large amount of oxygen contained in the second insulating layer can be supplied to the semiconductor layer while the third insulating layer is formed. In addition, at this time, the film formation step of the third insulating layer can also serve as the above heat treatment, whereby the process can be simplified.

The first temperature can be, for example, higher than or equal to 250° C. and lower than or equal to 450° C., preferably higher than or equal to 280° C. and lower than or equal to 400° C., further preferably higher than or equal to 300° C. and lower than or equal to 380° C., typically 350° C.

The second temperature can be, for example, higher than or equal to 150° C. and lower than or equal to 300° C., preferably higher than or equal to 170° C. and lower than or equal to 280° C., further preferably higher than or equal to 190° C. and lower than or equal to 250° C., typically 220° C.

Here, the first temperature and the second temperature are each a substrate temperature or the temperature of a stage at which a substrate is held. In addition, the temperature may be the actually measured value or a set value. Note that it is assumed that the temperature may vary in the range of 10% or less in a substrate surface.

Through the above steps, oxygen vacancies in the semiconductor layer are reduced and a highly reliable transistor can be obtained.

Furthermore, a structure in which an oxide film whose amount of nitrogen is less than that of the third insulating layer is used for the second insulating layer which is in contact with the back channel side of the semiconductor layer can be employed. Therefore, a structure in which a nitrogen oxide ($NO_x$; x is greater than 0 and less than or equal to 2, preferably greater than or equal to 1 and less than or equal to 2, typically $NO_2$ or NO) that can form a state in the second insulating layer which is in contact with the semiconductor layer is less likely to be formed can be obtained. Accordingly, a transistor with excellent electrical characteristics and high reliability can be obtained.

The second insulating layer can be located either above or below a second conductive layer and a third conductive layer functioning as a source electrode and a drain electrode.

For example, in the case where the second insulating layer is located above the second conductive layer and the third conductive layer, the second conductive layer and the third conductive layer can be provided in contact with the top surface and side surfaces of the semiconductor layer. As a transistor having such a structure, there is a transistor with a bottom-gate channel-etched structure.

On the other hand, the second insulating layer is located below the second conductive layer and the third conductive layer, whereby the second insulating layer can be used as a channel protective layer for protecting the semiconductor layer at the time of processing the source electrode and the drain electrode. At this time, the second insulating layer may be provided so as to cover the top surface and an end portion of the semiconductor layer or may be processed into an island pattern positioned over the semiconductor layer. The second conductive layer and the third conductive layer are electrically connected to the semiconductor layer in a region where the second insulating layer is not provided.

The semiconductor layer preferably has a structure in which a first metal oxide film and a second metal oxide film are stacked. At this time, a material with higher crystallinity than the first metal oxide film is preferably used for the second metal oxide film positioned on the second insulating layer side. Accordingly, in the case of a transistor with a bottom-gate channel-etched structure, the semiconductor layer can be prevented from being thinned or disappearing at the time of processing the source electrode and the drain electrode. Furthermore, the field-effect mobility of the transistor can be increased in such a manner that a material having lower crystallinity than the second metal oxide film is used for the first metal oxide film positioned on the first conductive layer side.

By the way, for a display device such as a television device having a large screen, hydrogenated amorphous silicon (a-Si: H) is often used as a semiconductor film forming a transistor. To stabilize electrical characteristics, a transistor using hydrogenated amorphous silicon is subjected to treatment for terminating a dangling bond of silicon with hydrogen released from the silicon nitride containing a large amount of hydrogen. Therefore, in a manufacturing line of a display device using hydrogenated amorphous silicon, a deposition apparatus of a silicon nitride film is often provided.

In the semiconductor device of one embodiment of the present invention, even when a silicon nitride film containing a large amount of hydrogen is employed as the insulating layers that sandwich the metal oxide films forming the semiconductor layer, favorable electrical characteristics can be obtained because diffusion of hydrogen into the metal oxide films is suppressed. Therefore, as the manufacturing line of a display device using the transistor of one embodiment of the present invention, many apparatuses in the manufacturing line of the display device using hydrogenated amorphous silicon can be used. Thus, a conventional manufacturing line using hydrogenated amorphous silicon can be transferred to the manufacturing line of the display device using the metal oxide film of one embodiment of the present invention without large capital investment.

A more specific example of one embodiment of the present invention will be described below with reference to drawings. Description will be made below giving, as an example, a transistor as an example of the semiconductor device.

Structural Example 1

Figure 1B:
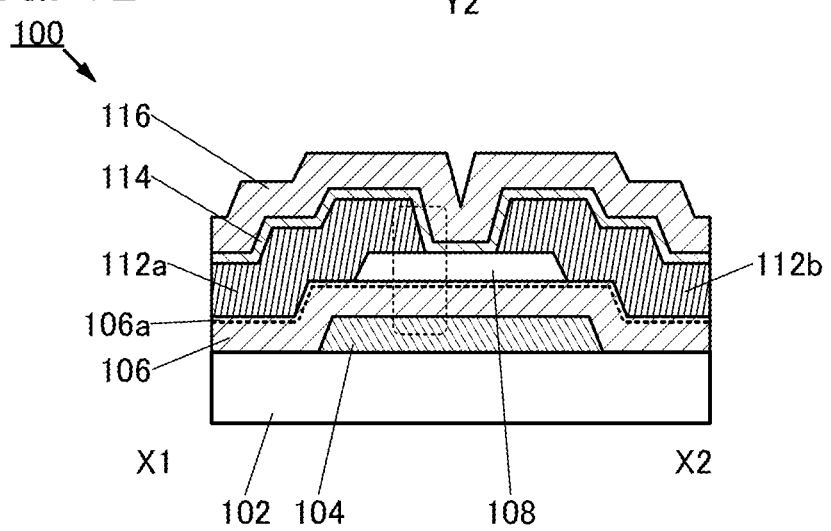
Figure 1C:
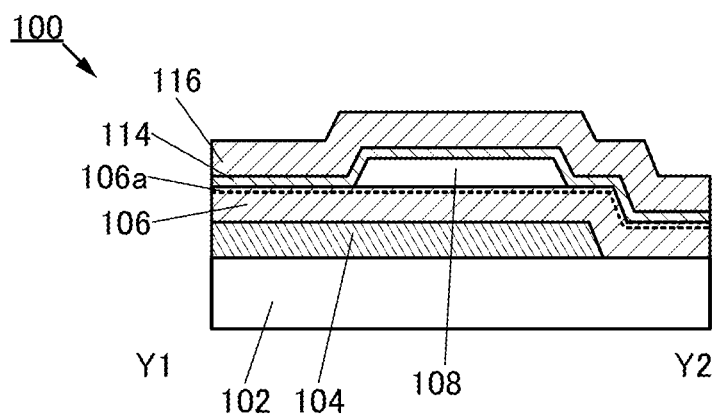

FIG. 1(A) is a top view of a transistor 100. FIG. 1(B) is a schematic cross-sectional view taken along the cutting line X1-X2 in FIG. 1(A). FIG. 1(C) is a schematic cross-sectional view taken along the cutting line Y1-Y2 in FIG. 1(A). Note that in FIG. 1(A), some components of the transistor 100 (an insulating layer or the like) are not illustrated to avoid complexity. The direction of the X1-X2 may be referred to as a channel length direction, and the direction of the Y1-Y2 may be referred to as a channel width direction.

The transistor 100 includes a conductive layer 104 over a substrate 102, an insulating layer 106 over the substrate 102 and the conductive layer 104, a semiconductor layer 108 over the insulating layer 106, and a conductive layer 112a and a conductive layer 112b that are in contact with a top surface of the semiconductor layer 108 and spaced from each other over the semiconductor layer 108. In addition, an insulating layer 114 and an insulating layer 116 are provided to cover the conductive layer 112a, the conductive layer 112b, and the semiconductor layer 108.

Part of the conductive layer 104 functions as a gate electrode. Part of the insulating layer 106 functions as a gate insulating layer. The conductive layer 112a functions as one of a source electrode and a drain electrode and the conductive layer 112b functions as the other of the source electrode and the drain electrode. The insulating layer 114 and the insulating layer 116 each function as a protective layer.

Note that the transistor 100 is what is called a channel-etched transistor.

The semiconductor layer 108 preferably contains a metal oxide. In particular, the semiconductor layer 108 preferably contains In, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and Zn. In particular, M is preferably Al, Ga, Y, or Sn.

Furthermore, the semiconductor layer 108 preferably includes a region where the proportion of the number of atoms of In is higher than that of M. For example, the atomic ratio of In to M and Zn in the semiconductor layer 108 is preferably In:M:Zn=4:2:3 or the neighborhood thereof.

Note that the composition of the semiconductor layer 108 is not limited to the above composition. For example, the atomic ratio of In to M and Zn in the semiconductor layer 108 is preferably In:M:Zn=5:1:6 or the neighborhood thereof. Here, the term neighborhood includes the following: when In is 5, M is greater than or equal to 0.5 and less than or equal to 1.5, and Zn is greater than or equal to 5 and less than or equal to 7.

Furthermore, as the composition of the semiconductor layer 108, the proportions of the numbers of atoms of In, M, and Zn in the semiconductor layer 108 may be approximately equal to each other. That is, a material having an atomic ratio of In to M and Zn being In:M:Zn=1:1:1 or the neighborhood thereof may be included.

When the semiconductor layer 108 includes a region where the proportion of the number of In atoms is higher than that of M atoms, the transistor 100 can have high field-effect mobility. Specifically, the field-effect mobility of the transistor 100 can exceed 10 $cm^2/Vs$, further preferably the field-effect mobility of the transistor 100 can exceed 30 $cm^2/Vs$.

For example, when the above transistor with high field-effect mobility is located in a pixel, the aperture ratio of the pixel (the proportion of area of a region contributing to display with respect to the pixel area) can be increased. Furthermore, with the use of the above transistor with high field-effect mobility in a gate driver that generates a gate signal, a display device with a small frame width (also referred to as a narrow frame) can be provided. Furthermore, with the use of the above transistor with high field-effect mobility in a source driver included in a display device (particularly a demultiplexer connected to an output terminal of a shift register included in the source driver), a display device to which fewer wirings are connected can be provided.

Note that even when the semiconductor layer 108 includes the region where the proportion of the number of atoms of In is higher than that of M atoms, the field-effect mobility may sometimes be low if the semiconductor layer 108 has high crystallinity.

The crystallinity of the semiconductor layer 108 can be analyzed by using X-ray diffraction (XRD) or analyzed with a transmission electron microscope (TEM), for example.

For each of the insulating layer 106 and the insulating layer 116, an insulating film through which impurities such as hydrogen or oxygen are less likely to be diffused can be used. For example, an insulating film with high barrier properties, such as a nitride insulating film, can be used. In particular, it is preferable to use an insulating film containing silicon and nitrogen as main components. It is preferable that a region of the insulating layer 106 except a region 106a and the insulating layer 116 each do not contain oxygen as main components.

The insulating layer 106 includes the region 106a positioned in the vicinity of a top surface thereof. In FIGS. 1(B) and (C), the outline of the region 106a is indicated by a dashed line. The region 106a is a region having a higher oxygen concentration than the other region of the insulating layer 106. Furthermore, the region 106a is preferably a region having lower hydrogen concentration than the other region of the insulating layer 106. The semiconductor layer 108 is provided in contact with the region 106a.

The presence of the region 106a can be confirmed by elementary analysis of a region including an interface of the insulating layer 106 with the semiconductor layer 108, for example. At this time, a large amount of oxygen is detected in a region of the insulating layer 106 close to the semiconductor layer 108. Furthermore, a region with high oxygen concentration is observed in the vicinity of the interface between the insulating layer 106 and the semiconductor layer 108 in some cases. Moreover, a region with lower hydrogen concentration than the other part may be observed in a region of the insulating layer 106 close to the semiconductor layer 108. Examples of an elementary analysis method include energy dispersive X-ray spectroscopy (EDX) and secondary ion mass spectrometry (SIMS). Furthermore, in some cases, the presence of the region 106a can be observed in a cross-sectional image of a transmission electron microscope (TEM) or the like as a region with a different contrast from the other parts.

For the insulating layer 114, an insulating film containing oxygen can be used. It is preferable to use a material with lower nitrogen concentration than the insulating layer 116 for the insulating layer 114. For example, it is preferable to use an insulating film containing silicon and oxygen, an insulating film containing silicon, oxygen, and nitrogen, or the like. Alternatively, for example, an insulating film containing aluminum or hafnium, and oxygen may be used. For example, a silicon oxide film, a silicon oxynitride film, an aluminum oxide film, or a hafnium oxide film can be used as the insulating layer 114. In particular, a silicon oxide film or a silicon oxynitride film is further preferably used.

In the case where a silicon oxide film, a silicon oxynitride film, or the like is used as the insulating layer 114, it is preferably formed with a plasma CVD apparatus. This is preferable because the plasma CVD apparatus enables the formation of an insulating film with high density, few defects, and preferable step coverage with a surface where the film is formed.

Furthermore, in the case of using an aluminum oxide film, a hafnium oxide film, or the like, it is preferably formed using a sputtering apparatus. In the case where an aluminum oxide film is formed using a sputtering apparatus, oxygen can be suitably added to the semiconductor layer 108 by film formation in an atmosphere containing an oxygen gas. Furthermore, the case of forming an aluminum oxide film with a sputtering apparatus is preferable because the film can have high density.

It is preferable that the insulating layer 114 have a smaller thickness than the insulating layer 116. By forming the insulating layer 114 thin, oxygen can be easily supplied to the semiconductor layer 108 through the insulating layer 114 by plasma treatment described later. Furthermore, productivity can be improved by forming the insulating layer 114 thin. In contrast, the insulating layer 116 can have a high deposition rate and thus the thickness is made larger than that of the insulating layer 114, whereby the mechanical strength of the transistor 100 can be increased.

Here, the conductive layer 112a and the conductive layer 112b are each provided in contact with the region 106a of the insulating layer 106. Accordingly, even in the case where a material through which hydrogen is likely to be diffused is used for the conductive layer 112a and the conductive layer 112b, hydrogen contained in the insulating layer 106 can be prevented from being diffused into the semiconductor layer 108 through the conductive layer 112a and the conductive layer 112b.

Figure 2:
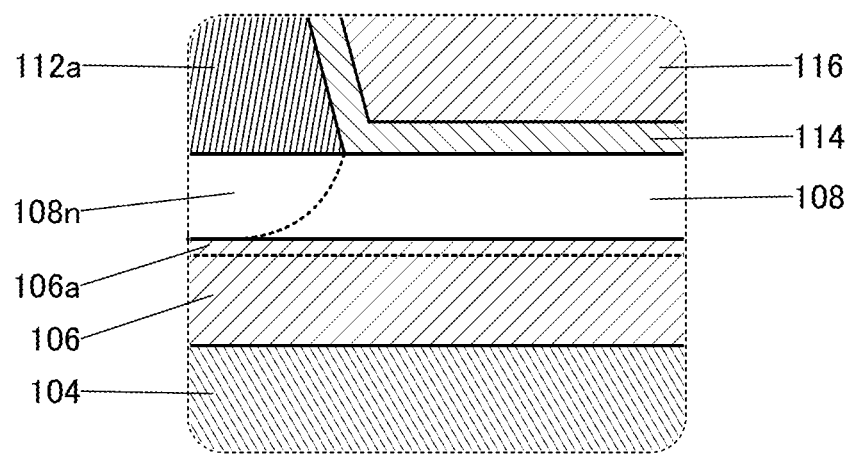
FIG. 2 A structural example of a semiconductor device.

FIG. 2 is an enlarged view of a region that is surrounded by a dashed line in FIG. 1(B). FIG. 2 is an enlarged view of a channel formation region and its vicinity of the semiconductor layer 108.

The transistor 100 has a stacked-layer structure in which the conductive layer 104, the insulating layer 106, the semiconductor layer 108, the insulating layer 114, and the insulating layer 116 are stacked in this order. Furthermore, a region of the insulating layer 106, which is in contact with the semiconductor layer 108, includes the region 106a containing oxygen.

Here, in the case where a metal oxide film is used for the semiconductor layer 108, an oxide is used for a layer in contact with this, so that formation of defect states at the interface therebetween can be suppressed. As illustrated in FIG. 2, the insulating layer 114 in contact with the semiconductor layer 108 includes an oxide film. The region 106a in contact with the semiconductor layer 108 is a region containing a large amount of oxygen and thus has a composition close to that of an oxide film. Thus, with such a stacked-layer structure, the electrical characteristics of the transistor 100 can be made favorable.

Furthermore, the transistor 100 has a structure in which the stacked-layer structure of the region 106a, the semiconductor layer 108, and the insulating layer 114 is sandwiched between the insulating layer 106 and the insulating layer 116. The insulating layer 106 and the insulating layer 116 are layers through which water, hydrogen, oxygen, and the like are less likely to be diffused; thus, diffusion of water or hydrogen from the outside to the semiconductor layer 108 and diffusion (release) of oxygen from the semiconductor layer 108 into the outside can be prevented. As a result, not only the electrical characteristics of the transistor 100 can be favorable but also the reliability thereof can be increased.

Furthermore, in the semiconductor layer 108, a pair of regions 108n positioned in portions in contact with the conductive layer 112a and the conductive layer 112b or in the vicinity thereof may be formed. The regions 108n are parts of the semiconductor layer 108 and have resistance lower than that of the channel formation region. In addition, the regions 108n can also be referred to as regions with high carrier density, n-type regions, or the like. Furthermore, in the semiconductor layer 108, a region which is sandwiched between the pair of regions 108n and which overlaps with the conductive layer 104 functions as a channel formation region.

Note that the shapes or range of the regions 108n can be changed variously depending on the manufacturing conditions of the transistor; thus, they are not limited to the example shown in FIG. 2 and the like. For example, the shape of the region 108n is positioned outward from the conductive layer 112a in some cases. Furthermore, the border of the region 108n is shown by a dashed line in FIG. 2 and the like because it is not clear in many cases.

The above is the description of Structural Example 1.

A structural example of a transistor whose structure is partly different from Structural Example 1 described above will be described below. Note that description of the same portions as those in Structural Example 1 described above is skipped in some cases. Furthermore, in the drawings that are referred to later, the same hatching pattern is applied to portions having functions similar to those in Structural Example 1 described above, and the portions are not denoted by reference numerals in some cases.

Structural Example 2

Figure 3A:
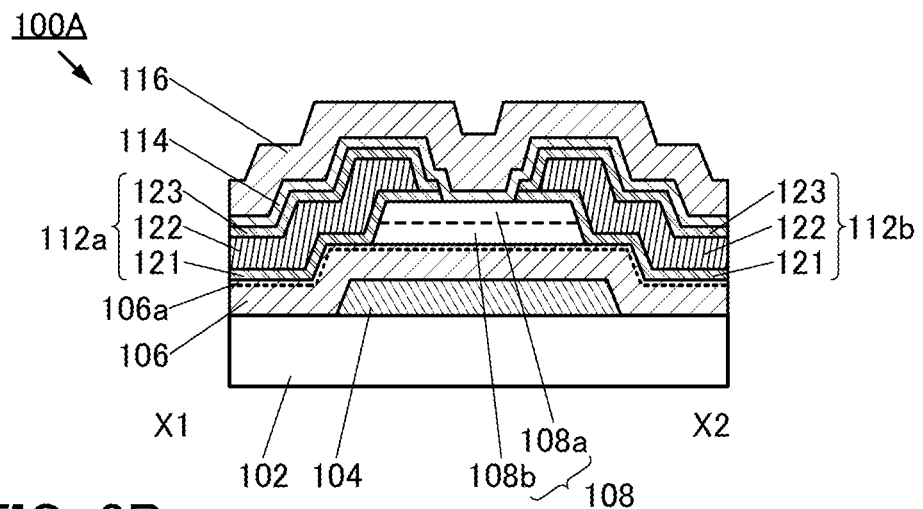
Figure 3B:
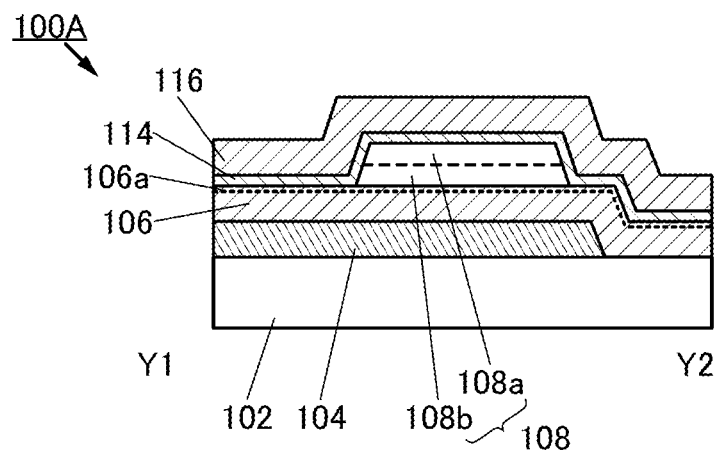

FIG. 3(A) is a cross-sectional view in the channel length direction of a transistor 100A exemplified below, and FIG. 3(B) is a cross-sectional view in the channel width direction. Note that FIG. 1(A) can be referred to for a top view.

The transistor 100A differs from the transistor 100 exemplified in Structural Example 1 mainly in that the semiconductor layer 108 has a stacked-layer structure and the conductive layer 112a and the conductive layer 112b have a stacked-layer structure.

The semiconductor layer 108 has a stacked-layer structure in which a semiconductor layer 108a and a semiconductor layer 108b are stacked from the above. The semiconductor layer 108b is provided over the region 106a of the insulating layer 106. Furthermore, the semiconductor layer 108a is provided over the semiconductor layer 108b and is in contact with the conductive layer 112a and the conductive layer 112b.

Each of the semiconductor layer 108a and the semiconductor layer 108b preferably includes a metal oxide film. Furthermore, a metal oxide film with higher crystallinity than the semiconductor layer 108b is preferably used for the semiconductor layer 108a positioned on the insulating layer 114 side.

In addition, the semiconductor layer 108a and the semiconductor layer 108b are preferably formed in succession without exposure to the atmospheric air using the same oxide target under different deposition conditions.

For example, the oxygen flow rate ratio (the proportion of the flow rate of the oxygen gas to the total flow rate of the deposition gas) at the formation of the semiconductor layer 108a is larger than the oxygen flow rate ratio at the formation of the semiconductor layer 108b. Accordingly, oxygen can be effectively supplied to the semiconductor layer 108b when the semiconductor layer 108a is formed. Furthermore, the semiconductor layer 108b can be a film having lower crystallinity and higher electrical conductivity than the semiconductor layer 108a. On the other hand, the semiconductor layer 108a provided in the upper portion can be a film with higher crystallinity than the semiconductor layer 108b, whereby damage at the time of processing the semiconductor layer 108, at the time of processing the conductive layer 112a and the conductive layer 112b, and at the time of forming the insulating layer 114, for example, can be suppressed. A CAC-OS film can be used for the semiconductor layer 108b and a CAAC-OS film can be used for the semiconductor layer 108a, for example.

Specifically, the oxygen flow rate ratio at the time of forming the semiconductor layer 108b is higher than or equal to 0% and lower than 50%, preferably higher than or equal to 0% and lower than or equal to 30%, further preferably higher than or equal to 0% and lower than or equal to 20%, typically 10%. The oxygen flow rate ratio at the time of forming the semiconductor layer 108a is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Furthermore, although conditions at the time of the film formation, such as pressure, temperature, or power, may be made to vary between the semiconductor layer 108a and the semiconductor layer 108b, it is preferable to employ the same conditions other than the oxygen flow rate ratio because the time taken in the film formation step can be shortened.

When the semiconductor layer 108 has such a stacked-layer structure, a transistor with excellent electrical characteristics and high reliability can be obtained.

Note that the semiconductor layer 108a and the semiconductor layer 108b may be films whose compositions are different from each other. At this time, in the case where an In—Ga—Zn oxide is used for both the semiconductor layer 108a and the semiconductor layer 108b, an oxide target in which the In proportion is higher than that in the semiconductor layer 108a is preferably used for the semiconductor layer 108b.

The conductive layer 112a and the conductive layer 112b each have a stacked-layer structure in which a conductive layer 121, a conductive layer 122, and a conductive layer 123 are stacked in this order.

The conductive layer 121 is provided to cover a top surface and side surfaces of the semiconductor layer 108a and side surfaces of the semiconductor layer 108b. Furthermore, the conductive layer 121 is provided over and in contact with the region 106a of the insulating layer 106. The conductive layer 122 is provided over the conductive layer 121. In a plan view, the conductive layer 122 is positioned inward from the conductive layer 121. The conductive layer 123 is provided over the conductive layer 122. The conductive layer 123 is provided to cover a top surface and side surfaces of the conductive layer 122. Furthermore, part of the conductive layer 123 is provided in contact with a top surface of the conductive layer 121. In the plan view, the conductive layer 121 and the conductive layer 123 are processed so that end portions thereof are aligned with each other.

In such a structure, the conductive layer 122 can be surrounded by the conductive layer 121 and the conductive layer 123. In other words, a structure in which the surface of the conductive layer 122 is not exposed can be employed. Accordingly, a material that is likely to be diffused into the semiconductor layer 108 can be used for the conductive layer 122.

For the conductive layer 122, a material having resistance lower than those of the conductive layer 121 and the conductive layer 123 is preferably used. Furthermore, for the conductive layer 121 and the conductive layer 123, a material that is less likely to be diffused into the semiconductor layer 108 than the conductive layer 122 can be used.

For the conductive layer 122, at least a conductive material different from those for the conductive layer 121 and the conductive layer 123 can be used. Note that for the conductive layer 121 and the conductive layer 123, conductive materials different from each other can also be used. It is particularly preferable that the same conductive materials be used for the conductive layer 121 and the conductive layer 123 because the same manufacturing apparatus can be used and further the contact resistance at the end portions thereof can be reduced.

For example, for the conductive layer 121 and the conductive layer 123, a titanium film or a molybdenum film is preferably used. Furthermore, for the conductive layer 122, an aluminum film or a copper film is preferably used. With such a structure, while wiring resistance of the conductive layer 112a and the conductive layer 112b is lowered, a transistor with favorable electrical characteristics can be obtained.

The semiconductor layer 108 having a single-layer structure and the semiconductor layer 108a and the semiconductor layer 108b of the semiconductor layer 108 having a stacked-layer structure will be described below.

Each of the semiconductor layer 108, the semiconductor layer 108a, and the semiconductor layer 108b preferably contains a metal oxide. It is particularly preferable that each layer include an oxide containing one or more of indium, gallium, and zinc. Alternatively, each layer preferably contains indium, zinc, and M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium). In particular, the element M is preferably aluminum, gallium, yttrium, or tin.

For example, the atomic ratios of In to M and Zn of the semiconductor layer 108, the semiconductor layer 108a, and the semiconductor layer 108b are preferably In:M:Zn=4:2:3 or the neighborhood thereof, or In:M:Zn=5:1:7 or the neighborhood thereof.

For example, in the case where the semiconductor layer has a stacked-layer structure of two layers, a CAC-OS is used for the semiconductor layer 108b positioned on the lower side. Accordingly, the on-state current of the transistor can be increased. Furthermore, a CAAC-OS is used for the semiconductor layer 108a positioned on the upper side. The use of a film with high crystallinity for the semiconductor layer 108a positioned on the uppermost side increases etching resistance, which can prevent part of the semiconductor layer 108a from disappearing at the time of forming the conductive layer 112a and the conductive layer 112b.

Furthermore, the semiconductor layer may have a stacked-layer structure of three layers. At this time, the semiconductor layer positioned on the lowermost side can have a structure similar to that of the semiconductor layer 108a or the semiconductor layer 108b. For example, with a structure similar to that of the semiconductor layer 108a for the semiconductor layer positioned on the lowermost side, the reliability of the semiconductor layer 108 having a stacked-layer structure can be increased. Moreover, with a structure similar to that of the semiconductor layer 108b for the semiconductor layer positioned on the lowermost side, the on-state current of the transistor can be further increased.

As described above, as the semiconductor layer 108 having a stacked-layer structure in one embodiment of the present invention, a structure in which a metal oxide with low crystallinity is used for the semiconductor layer 108b positioned on the lower side and a metal oxide with high crystallinity is used for the semiconductor layer 108a positioned on the upper side of this to cover the upper portion of the semiconductor layer 108b is employed. The region with low crystallinity of the semiconductor layer 108b sometimes increases the carrier density. At this time, the semiconductor layer 108b can serve as a main current path. Accordingly, a transistor having a high on-state current and increased reliability can be obtained.

Note that in the case where the semiconductor layer 108 has a single-layer structure, the on-state current of the transistor can be increased with the structure similar to that of the semiconductor layer 108b. Furthermore, the reliability of the transistor can be increased with the structure similar to that of the semiconductor layer 108a for the semiconductor layer 108.

The above is the description of Structural Example 2.

Modification Example 1

Figure 4A:
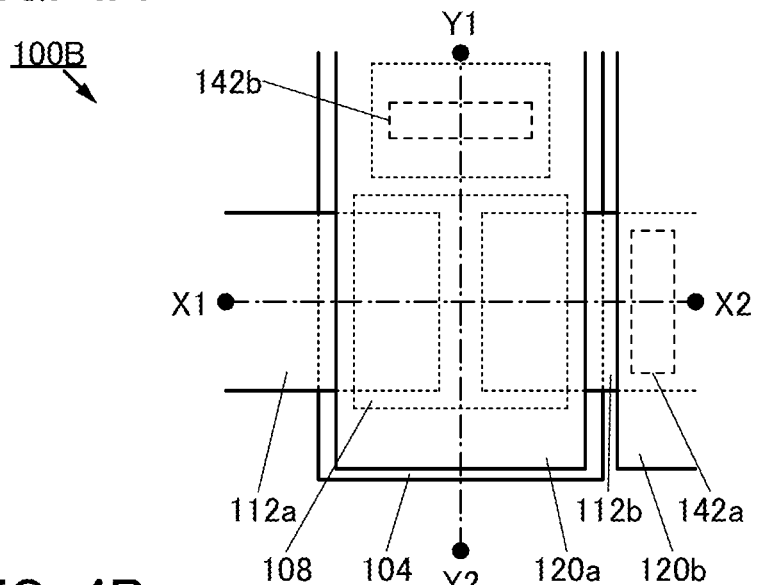
FIGS. 4A-4C A structural example of a semiconductor device.
Figure 4B:
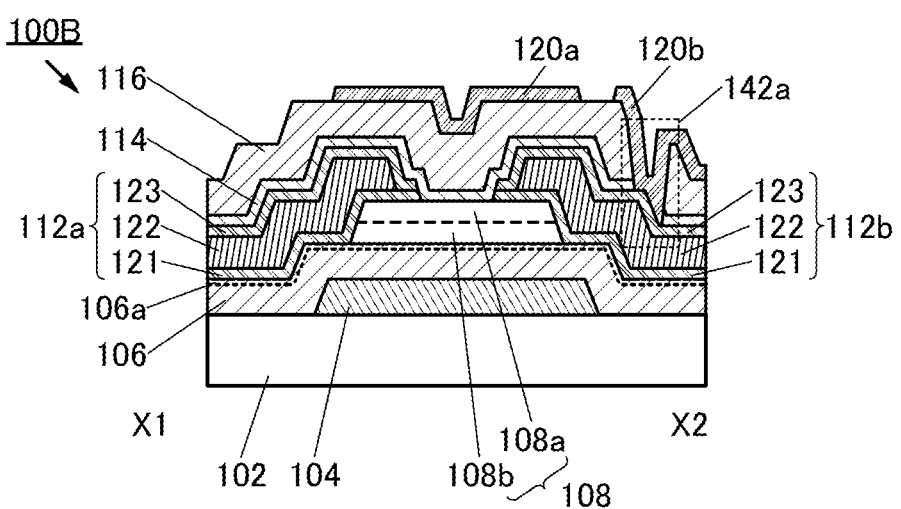
Figure 4C:
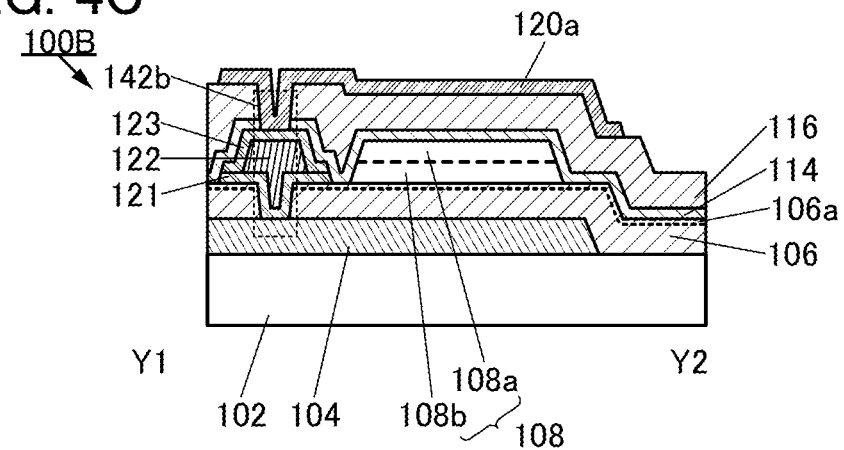

FIG. 4(A) is a top view of a transistor 100B exemplified below, FIG. 4(B) is a cross-sectional view of the transistor 100B in the channel length direction, and FIG. 4(C) is a cross-sectional view in the channel width direction.

The transistor 100B differs from the transistor 100A exemplified above in Structural Example 2 mainly in that a conductive layer 120a and a conductive layer 120b are included.

The conductive layer 120a has a portion that is provided over the insulating layer 116 and overlaps with the semiconductor layer 108. At this time, the conductive layer 104 functions as a first gate electrode, and the conductive layer 120a functions as a second gate electrode. Part of the insulating layer 106 functions as a first gate insulating layer, and part of each of the insulating layer 114 and the insulating layer 116 functions as a second gate insulating layer. The transistor 100B is a transistor including a pair of gate electrodes.

In a connection portion 142a, the conductive layer 120b is electrically connected to the conductive layer 123 in the conductive layer 112b through an opening provided in the insulating layer 116 and the insulating layer 114.

It is preferable to employ a structure in which the conductive layer 120a and the conductive layer 104 are electrically connected to each other through a connection portion 142b as illustrated in FIG. 4(C). In the connection portion 142b, the conductive layer 121, the conductive layer 122, and the conductive layer 123 are provided. In the connection portion 142b, the conductive layer 120a is electrically connected to the conductive layer 123 through an opening provided in the insulating layer 116 and the insulating layer 114, and the conductive layer 121 is electrically connected to the conductive layer 104 through the opening provided in the insulating layer 106.

The semiconductor layer 108 is interposed between the conductive layer 104 and the conductive layer 120a. FIGS. 4(A) and (C) illustrate an example in which the lengths of the conductive layer 104 and the conductive layer 120a in the channel length direction and the channel width direction are longer than the lengths of the semiconductor layer 108 in the channel length direction and the channel width direction. Therefore, the semiconductor layer 108 has a structure of being covered with the conductive layer 104 and the conductive layer 120a, with the insulating layer 106, and the insulating layer 114 and the insulating layer 116 interposed therebetween. In other words, the conductive layer 104 and the conductive layer 120a have a structure of surrounding the semiconductor layer 108 in the channel width direction of the transistor 100B.

With such a structure, the semiconductor layer 108 can be electrically surrounded by electric fields of the conductive layer 104 and the conductive layer 120a. A device structure of a transistor like that of the transistor 100B, in which electric fields of the conductive layer 104 and the conductive layer 120a electrically surround a semiconductor layer where a channel region is formed can be referred to as a Surrounded channel (S-channel) structure.

Since the transistor 100B has an S-channel structure, an electric field for inducing a channel can be effectively applied to the semiconductor layer 108 from the conductive layer 104 and the conductive layer 120a. Accordingly, the driving capability of the transistor 100B is increased, so that high on-state current characteristics can be obtained. Moreover, owing to a high on-state current, the transistor 100B can be miniaturized. Furthermore, since the transistor 100B has a structure in which the semiconductor layer 108 is surrounded by the conductive layer 104 and the conductive layer 120a, the mechanical strength of the transistor 100B can be increased.

Furthermore, in the above-described structure, regions where carriers flow in the semiconductor layer 108 are formed on both the conductive layer 104 side of the semiconductor layer 108 and the conductive layer 120a side of the semiconductor layer 108, so that carriers flow in a wide region and the amount of moving carriers in the transistor 100B increases. Thus, the on-state current of the transistor 100B can be made higher than that when a predetermined potential is applied to any one of the conductive layer 104 and the conductive layer 120a.

The above is the description of the modification example.

Structural Example 3

A structure in which the insulating layer 114 is used as a channel protective layer for protecting the semiconductor layer 108 at the time of processing the conductive layer 112a and the conductive layer 112b will be described below.

Figure 5A:
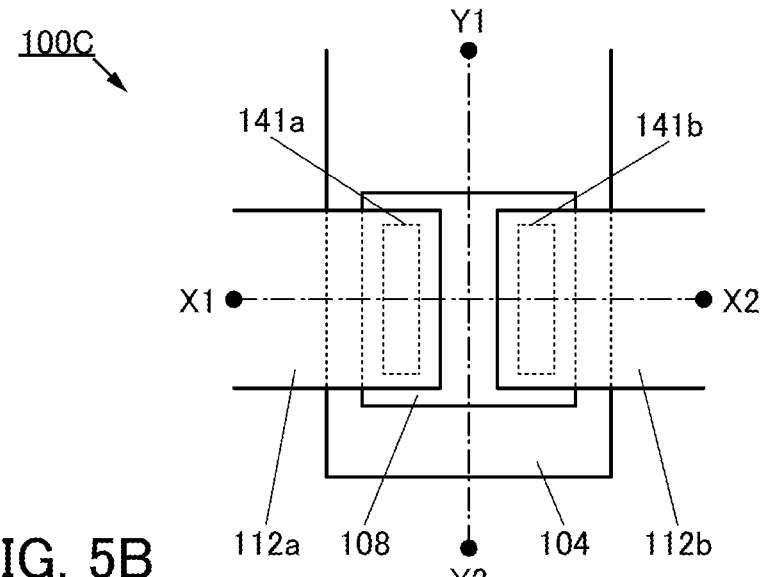
FIGS. 5A-5C A structural example of a semiconductor device.
Figure 5B:
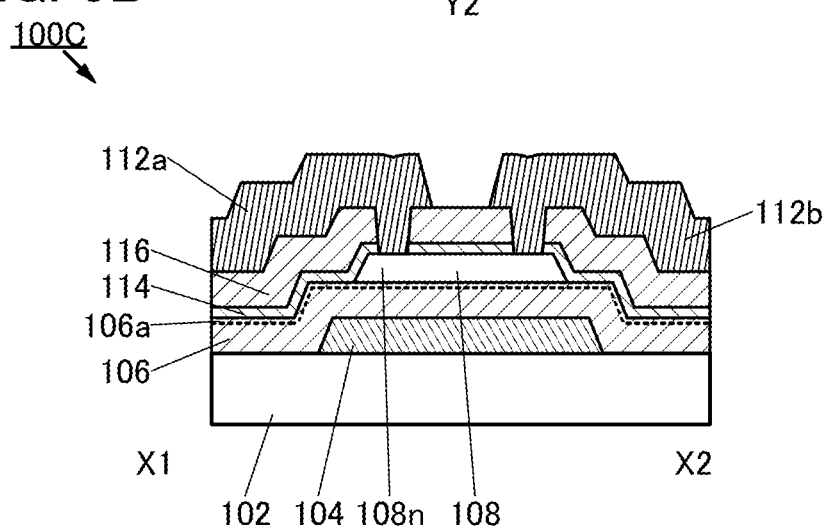
Figure 5C:
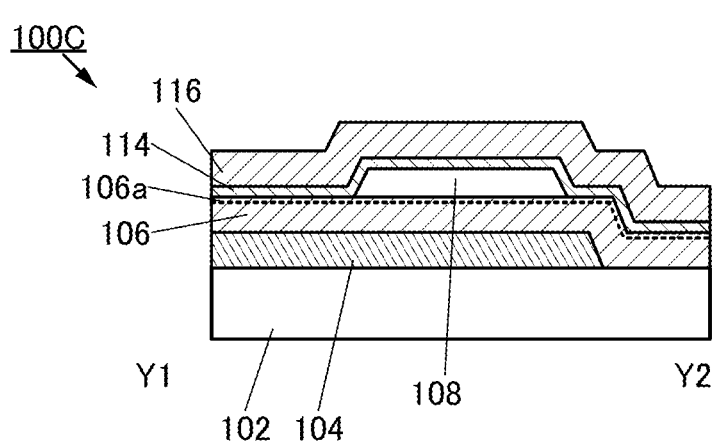

FIG. 5(A) is a top view of a transistor 100C exemplified below, FIG. 5(B) is a cross-sectional view of the transistor 100C in the channel length direction, and FIG. 5(C) is a cross-sectional view of the transistor 100C in the channel width direction.

The transistor 100C differs from the transistor 100 exemplified in Structural Example 1 mainly in that the conductive layer 112a and the conductive layer 112b are positioned on the upper side than the insulating layer 114 and the insulating layer 116.

The insulating layer 114 is provided to cover the top surface and the side surfaces of the semiconductor layer 108 and the insulating layer 106. Moreover, the insulating layer 116 is provided to cover the insulating layer 114.

The conductive layer 112a and the conductive layer 112b are each provided over the insulating layer 116 and in contact with the semiconductor layer 108 through openings provided in the insulating layer 116 and the insulating layer 114.

With such a structure, an etching step for processing the conductive layer 112a and the conductive layer 112b is performed in a state where the semiconductor layer 108 is covered with the insulating layer 114 and the insulating layer 116; thus, the semiconductor layer 108 is less likely to be damaged by the etching. Furthermore, such a structure is preferable because the range of choices for materials for the conductive layer 112a and the conductive layer 112b is widened.

Note that although the structure in which the insulating layer 114 and the insulating layer 116 cover the side surfaces of the semiconductor layer 108 as well as the top surface thereof is employed here, the structure of one embodiment of the present invention is not limited thereto. For example, a structure in which the insulating layer 114 and the insulating layer 116 are processed into an island shape and positioned over the channel formation region of the semiconductor layer 108 may be employed.

The above is the description of Structural Example 3.

Structural Example 4

Figure 6A:
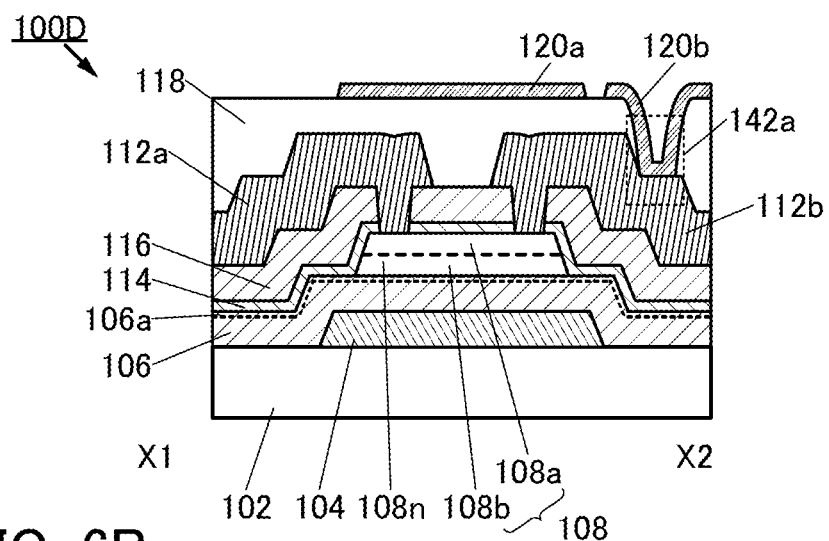
Figure 6B:
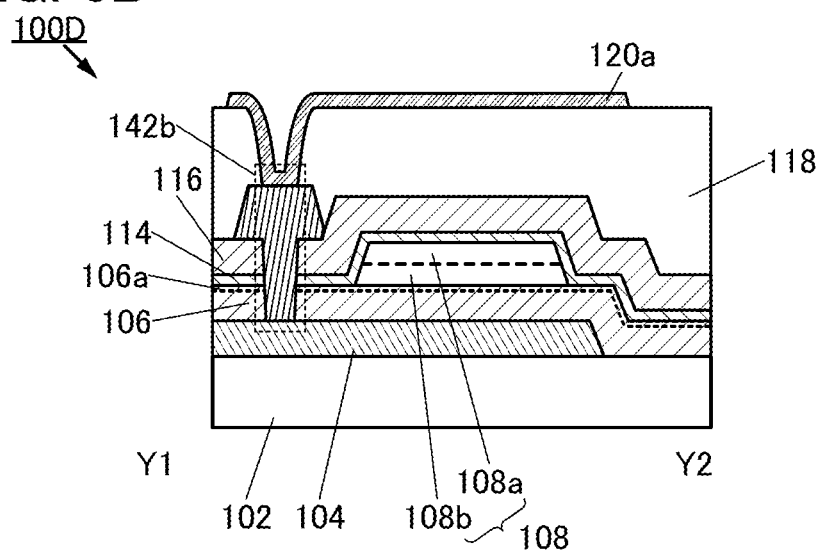

FIG. 6(A) is a cross-sectional view in the channel length direction of a transistor 100D exemplified below, and FIG. 6(B) is a cross-sectional view in the channel width direction.

The transistor 100D differs from the transistor 100C exemplified above in Structural Example 3 mainly in that the semiconductor layer 108 has a stacked-layer structure and the conductive layer 120a and the conductive layer 120b are included.

The semiconductor layer 108 has a stacked-layer structure in which the semiconductor layer 108a and the semiconductor layer 108b are stacked from the above. Moreover, the insulating layer 114 covers the top surface and the side surfaces of the semiconductor layer 108a and the side surfaces of the semiconductor layer 108b.

Furthermore, an insulating layer 118 is provided to cover the insulating layer 116, the conductive layer 112a, and the conductive layer 112b, and the conductive layer 120a and the conductive layer 120b are provided over the insulating layer 118. It is preferable that the insulating layer 118 function as a planarization film. An organic resin can be suitably used for the insulating layer 118.

In the connection portion 142a, the conductive layer 120b is electrically connected to the conductive layer 112b through an opening provided in the insulating layer 118.

Furthermore, the conductive layer 120a and the conductive layer 104 are electrically connected to each other through the connection portion 142b. The connection portion 142b includes a conductive layer formed by processing the same conductive film as the conductive layer 112a or the like. The conductive layer is electrically connected to the conductive layer 104 through an opening provided in the insulating layer 116, the insulating layer 114, and the insulating layer 106. In addition, the conductive layer 120a and the conductive layer are electrically connected to each other through an opening provided in the insulating layer 118.

The above is the description of Structural Example 4.

[Components of Semiconductor Device]

Components included in the semiconductor device of this embodiment will be described below in detail.

[Substrate]

Although there is no particular limitation on a material and the like of the substrate 102, it is necessary that the substrate have heat resistance high enough to withstand at least heat treatment performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon or silicon carbide, a compound semiconductor substrate made of silicon germanium or the like, an SOI substrate, or the like can be used, or any of these substrates provided with a semiconductor element may be used as the substrate 102. Note that in the case where a glass substrate is used as the substrate 102, a large-sized substrate having any of the following sizes is used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm); thus, a large-sized display device can be fabricated.

Alternatively, a flexible substrate may be used as the substrate 102, and the transistor 100 may be formed directly on the flexible substrate. Alternatively, a separation layer may be provided between the substrate 102 and the transistor 100. The separation layer can be used when part or the whole of a semiconductor device completed thereover is separated from the substrate 102 and transferred onto another substrate. In such a case, the transistor 100 can be transferred onto a substrate having low heat resistance or a flexible substrate as well.

[Conductive Layer]

The conductive layer 104, the conductive layer 112a, the conductive layer 112b, the conductive layer 120a, and the conductive layer 120b can each be formed using a metal element selected from chromium, copper, aluminum, gold, silver, zinc, molybdenum, tantalum, titanium, tungsten, manganese, nickel, iron, and cobalt; an alloy containing any of these metal elements as its component; an alloy including a combination of any of these metal elements; or the like.

Furthermore, for the conductive layer 104, the conductive layer 112a, the conductive layer 112b, the conductive layer 120a, and the conductive layer 120b, an oxide conductor or an oxide semiconductor, such as an oxide containing indium and tin (In—Sn oxide), an oxide containing indium and tungsten (In—W oxide), an oxide containing indium, tungsten, and zinc (In—W—Zn oxide), an oxide containing indium and titanium (In—Ti oxide), an oxide containing indium, titanium, and tin (In—Ti—Sn oxide), an oxide containing indium and zinc (In—Zn oxide), an oxide containing indium, tin, and silicon (In—Sn—Si oxide), or an oxide containing indium, gallium, and zinc (In—Ga—Zn oxide) can also be used.

Here, an oxide conductor will be described. In this specification and the like, an oxide conductor may be referred to as OC (Oxide Conductor). For example, the oxide conductor is obtained in such a manner that oxygen vacancy is formed in a metal oxide having semiconductor characteristics, and then hydrogen is added to the oxygen vacancy, so that a donor level is formed in the vicinity of the conduction band. As a result, the conductivity of the metal oxide is increased, so that the metal oxide becomes a conductor. The metal oxide having become a conductor can be referred to as an oxide conductor. Metal oxides having semiconductor characteristics generally has visible light transmitting property because of their large energy gap. Meanwhile, an oxide conductor is a metal oxide having a donor level in the vicinity of the conduction band. Therefore, an oxide conductor is less likely to be influenced by absorption due to the donor level, and has a visible light transmitting property comparable to that of a metal oxide having semiconductor characteristics.

Moreover, a Cu—X alloy film (X is Mn, Ni, Cr, Fe, Co, Mo, Ta, or Ti) may be used for the conductive layer 104, conductive layer 112a, and the conductive layer 112b. The use of a Cu—X alloy film enables the manufacturing cost to be reduced because processing can be performed by a wet etching process.

It is particularly preferable that the conductive layer 112a and the conductive layer 112b contain any one or more elements selected from copper, titanium, tungsten, tantalum, and molybdenum among the above-described metal elements. Furthermore, a copper film or an aluminum film is suitably used for the conductive layer 112a and the conductive layer 112b because the resistance of the conductive layer 112a and the conductive layer 112b can be reduced.

[Insulating Layer]

For the insulating layer 106 functioning as a gate insulating layer and the insulating layer 116 functioning as a protective layer, insulating layers including one or more kinds of a silicon nitride oxide film, a silicon nitride film, an aluminum nitride film, an aluminum nitride oxide film, and the like formed by a plasma enhanced chemical vapor deposition (PECVD) method, a sputtering method, or the like can be used. Note that the insulating layer 106 or the insulating layer 116 may have a stacked-layer structure of two or more layers.

For the insulating layer 114 provided over the semiconductor layer 108, insulating layers including one or more kinds of a silicon oxide film, a silicon oxynitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, and the like formed by a PECVD method, a sputtering method, an ALD (Atomic Layer Deposition) method, or the like can be used. It is particularly preferable to use a silicon oxide film or a silicon oxynitride film formed by a plasma CVD method. Note that the insulating layer 114 may have a stacked-layer structure of two or more layers.

As the insulating layer 114, an insulating film with a thickness greater than or equal to 5 nm and less than or equal to 150 nm, preferably greater than or equal to 5 nm and less than or equal to 50 nm can be suitably used.

[Semiconductor Layer]

For the semiconductor layer 108, the materials described above can be used.

In the case where the semiconductor layer 108 is an In-M-Zn oxide, the atomic ratio of the metal elements in a sputtering target used to deposit the In-M-Zn oxide preferably satisfies In >M. Examples of the atomic ratio of the metal elements in such a sputtering target includes In:M:Zn=1:1:1, In:M:Zn=1:1:1.2, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, In:M:Zn=5:2:5, and the like.

In the case where the semiconductor layer 108 is an In-M-Zn oxide, a target containing a polycrystalline In-M-Zn oxide is preferably used as the sputtering target. The use of the target containing a polycrystalline In-M-Zn oxide facilitates formation of the semiconductor layer 108 having crystallinity. Note that the atomic ratio in the semiconductor layer 108 to be formed varies in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the semiconductor layer 108 to be deposited is in some cases in the vicinity of In:Ga:Zn=4:2:3 [atomic ratio].

The energy gap of the semiconductor layer 108 is 2 eV or more, preferably 2.5 eV or more. With the use of a metal oxide having such a wide energy gap, the off-state current of the transistor can be reduced.

Furthermore, the semiconductor layer 108 preferably has a non-single-crystal structure. The non-single-crystal structure includes, for example, a CAAC-OS (C Axis Aligned Crystalline Oxide Semiconductor), a polycrystalline structure, a microcrystalline structure, or an amorphous structure. Among the non-single-crystal structures, the amorphous structure has the highest density of defect states, whereas the CAAC-OS has the lowest density of defect states.

[Example of Manufacturing Method of Transistor]

A manufacturing method example of a transistor of one embodiment of the present invention will be described below. Here, description will be made giving, as an example, the transistor 100A exemplified above in Structural Example 2.

Note that thin films that form the semiconductor device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. In addition, as an example of the thermal CVD method, a metal organic CVD (MOCVD) method can be given.

Alternatively, the thin films that form the semiconductor device (insulating films, semiconductor films, conductive films, and the like) can be formed by a method such as spin coating, dipping, spray coating, ink-jetting, dispensing, screen printing, offset printing, a doctor knife, a slit coater, a roll coater, a curtain coater, or a knife coater.

When the thin films that form the semiconductor device are processed, a photolithography method or the like can be used for the processing. Besides, a nanoimprinting method, a sandblasting method, a lift-off method, or the like may be used for the processing of the thin films. Alternatively, island-shaped thin films may be directly formed by a film formation method using a blocking mask such as a metal mask.

There are two typical examples of a photolithography method. In one of the methods, a resist mask is formed over a thin film that is to be processed, and the thin film is processed by etching or the like, so that the resist mask is removed. In the other method, after a photosensitive thin film is formed, exposure and development are performed, so that the thin film is processed into a desired shape.

For light for exposure in a photolithography method, for example, an i-line (with a wavelength of 365 nm), a g-line (with a wavelength of 436 nm), an h-line (with a wavelength of 405 nm), or light in which these lines are mixed can be used. Besides, ultraviolet light, KrF laser light, ArF laser light, or the like can be used. Furthermore, exposure may be performed by liquid immersion light exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblast method, or the like can be used.

Each of the drawings illustrated in FIG. 7 to FIG. 10 illustrates a method for manufacturing the transistor 100A. In each of the drawings, a cross section in the channel length direction is shown on the left side, and a cross section in the channel width direction is shown on the right side.

[Formation of Conductive Layer 104]

Figure 7A:
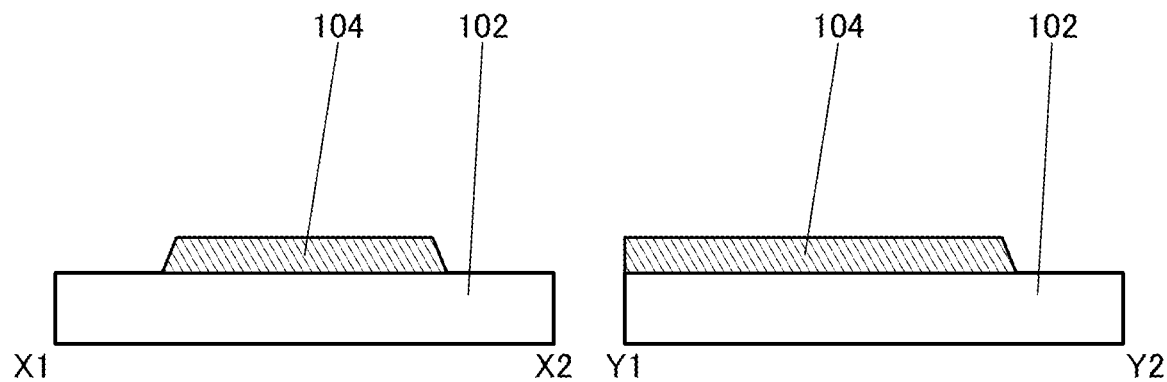
FIGS. 7A-7C Drawings illustrating a method for manufacturing a semiconductor device.
Figure 7B:
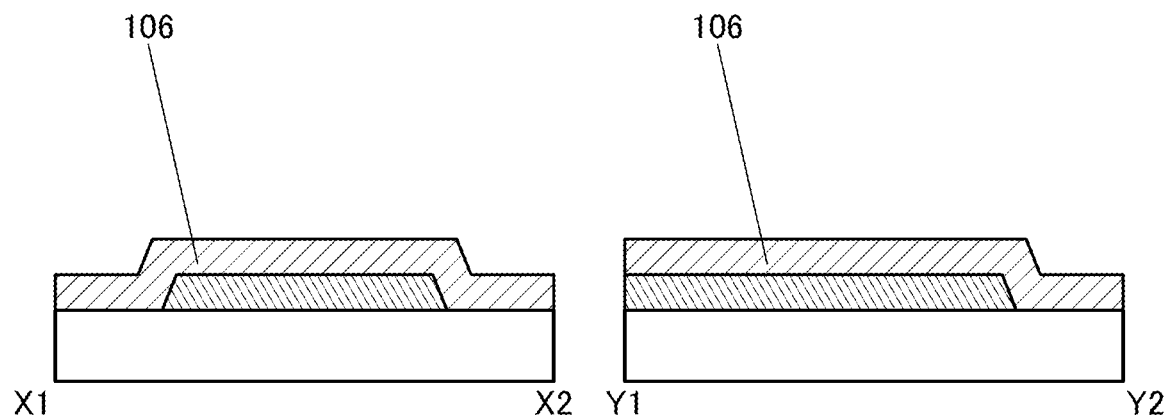
Figure 7C:
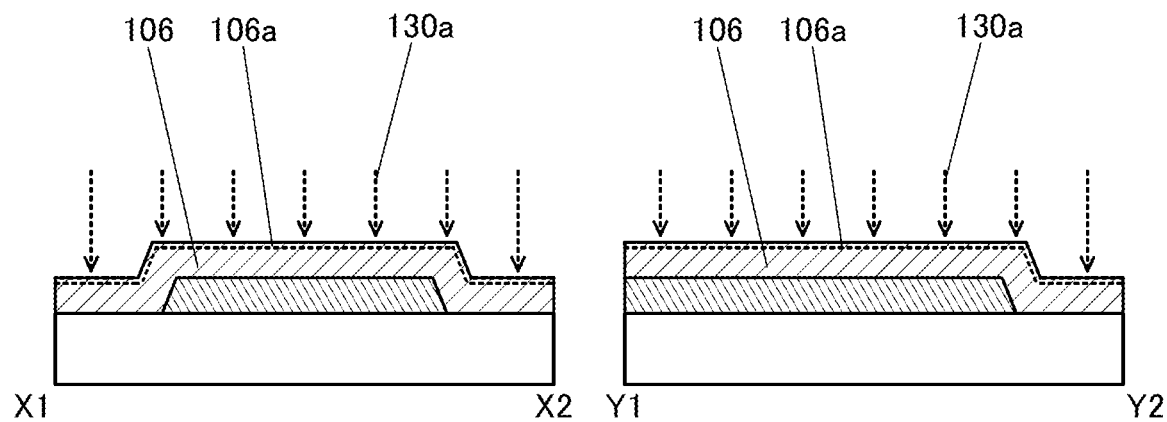

A conductive film is formed over the substrate 102 and a lithography process and an etching process are performed to process the conductive film, whereby the conductive layer 104 functioning as a gate electrode is formed (FIG. 7(A)).

[Formation of Insulating Layer 106]

The insulating layer 106 is formed to cover the conductive layer 104 and the substrate 102. The insulating layer 106 can be formed, for example, by a PECVD method, or the like.

[Formation of Region 106a]

Next, oxygen 130a is added to the insulating layer 106, so that the region 106a containing oxygen is formed in the vicinity of the surface.

Examples of the oxygen 130a added to the insulating layer 106 include an oxygen radical, an oxygen atom, an oxygen atomic ion, and an oxygen molecular ion. Examples of an addition method include an ion doping method, an ion implantation method, and a plasma treatment method. Alternatively, a film that suppresses oxygen release may be formed over the insulating layer 106, and then, the oxygen 130a may be added to the insulating layer 106 through the film. It is preferable to remove the film after addition of the oxygen 130a.

As the above film that suppresses oxygen release, a conductive film or a semiconductor film containing one or more of indium, zinc, gallium, tin, aluminum, chromium, tantalum, titanium, molybdenum, nickel, iron, cobalt, and tungsten can be used.

Furthermore, in the case where the oxygen 130a is added by plasma treatment, in which oxygen is excited by a microwave to generate high-density oxygen plasma, the amount of oxygen added to the insulating layer 106 can be increased. By performing plasma treatment in an atmosphere containing oxygen, water, hydrogen, or the like adsorbed on the surface of the insulating layer 106 can be removed. Accordingly, the amount of water or hydrogen which might exist in the semiconductor layer 108 formed later or at an interface between the semiconductor layer 108 and the insulating layer 106 can be reduced.

In the case where silicon nitride, silicon nitride oxide, or the like is used as the insulating layer 106, hydrogen is contained in the insulating layer 106 in some cases. At this time, the above-described plasma treatment or the like can reduce the hydrogen concentration at least in the region 106a in contact with the semiconductor layer 108.

Furthermore, before the oxygen 130a is added, heat treatment for releasing water or hydrogen from the surface and inside of the insulating layer 106 may be performed. For example, the heat treatment is performed in a nitrogen atmosphere at a temperature higher than or equal to 300° C. and lower than the heat resistant temperature of the conductive layer 104, preferably higher than or equal to 300° C. and lower than or equal to 450° C.

[Formation of Semiconductor Layer 108]

Figure 8A:
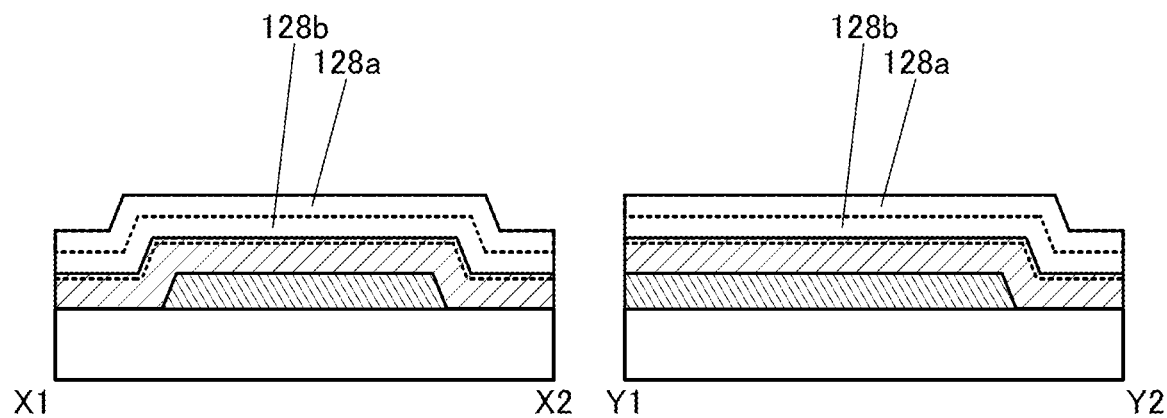
FIGS. 8A-8C Drawings illustrating a method for manufacturing a semiconductor device.

Next, a metal oxide film 128b and a metal oxide film 128a are stacked over the insulating layer 106 (FIG. 8(A)).

The metal oxide film 128b and the metal oxide film 128a are each preferably formed by a sputtering method using a metal oxide target.

In forming the metal oxide film 128b and the metal oxide film 128a, an inert gas (e.g., a helium gas, an argon gas, or a xenon gas) may be mixed in addition to the oxygen gas.

When a metal oxide film with relatively low crystallinity is formed with a low oxygen flow rate ratio, a metal oxide film having high conductivity can be obtained. In contrast, when a metal oxide film with relatively high crystallinity is formed with a high oxygen flow rate ratio, a metal oxide film having resistance to etching and electrical stability can be obtained.

More specifically, the oxygen flow rate ratio at the time of formation of the metal oxide film 128b (the proportion of the oxygen gas in the whole deposition gas) is higher than or equal to 0% and lower than 50%, preferably higher than or equal to 0% and lower than or equal to 30%, further preferably higher than or equal to 0% and lower than or equal to 20%, typically 10%. The oxygen flow rate ratio at the time of formation of the metal oxide film 128a is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Furthermore, although conditions at the time of the film formation, such as pressure, temperature, or power, may be made to vary between the metal oxide film 128a and the metal oxide film 128b, it is preferable to employ the same conditions other than the oxygen flow rate ratio because the time required for the film formation step can be shortened.

The metal oxide film 128b and the metal oxide film 128a are formed under the deposition conditions where a substrate temperature is higher than or equal to room temperature and lower than or equal to 180° C., preferably higher than or equal to room temperature and lower than or equal to 140° C. The substrate temperature at the time of formation of the metal oxide film is preferably, for example, higher than or equal to room temperature and lower than 140° C. because the productivity is increased.

Note that the metal oxide film 128a and the metal oxide film 128b may be films with different compositions from each other. At this time, in the case where an In—Ga—Zn oxide is used for both the metal oxide film 128a and the metal oxide film 128b, an oxide target in which the In proportion is higher than that in the metal oxide film 128a is preferably used for the metal oxide film 128b.

Figure 8B:
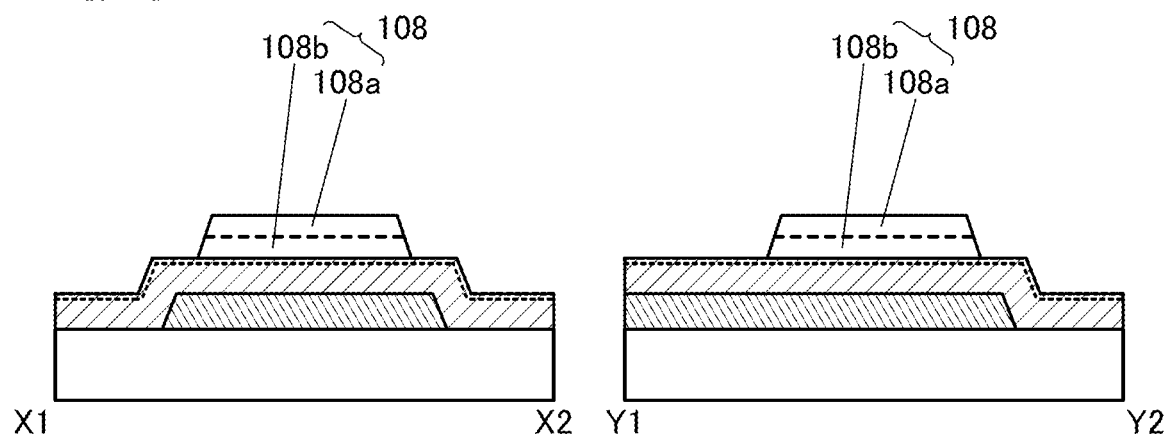

Next, a resist mask is formed over the metal oxide film 128a, the metal oxide film 128a and the metal oxide film 128b are processed by etching, and then the resist mask is removed, whereby the semiconductor layer 108a and the semiconductor layer 108b are formed (FIG. 8(B)).

[Formation of Conductive Layer 112a and Conductive Layer 112b]

Next, a conductive film 121a that is to be the conductive layer 121 later and a conductive film 122a that is to be the conductive layer 122 later are stacked.

Figure 8C:
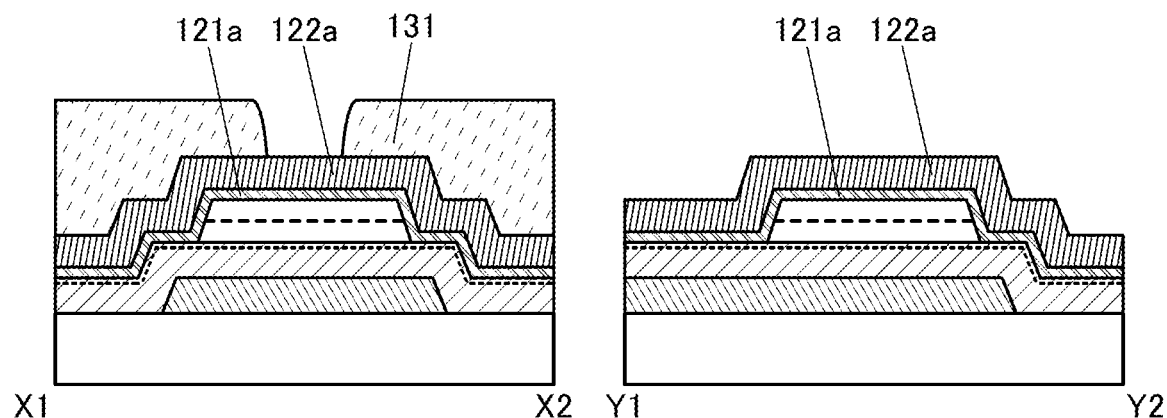

Then, a resist mask 131 is formed over the conductive film 122a (FIG. 8(C)). The resist mask 131 is provided to have a gap over a region where a channel of the semiconductor layer 108 might be formed.

Figure 9A:
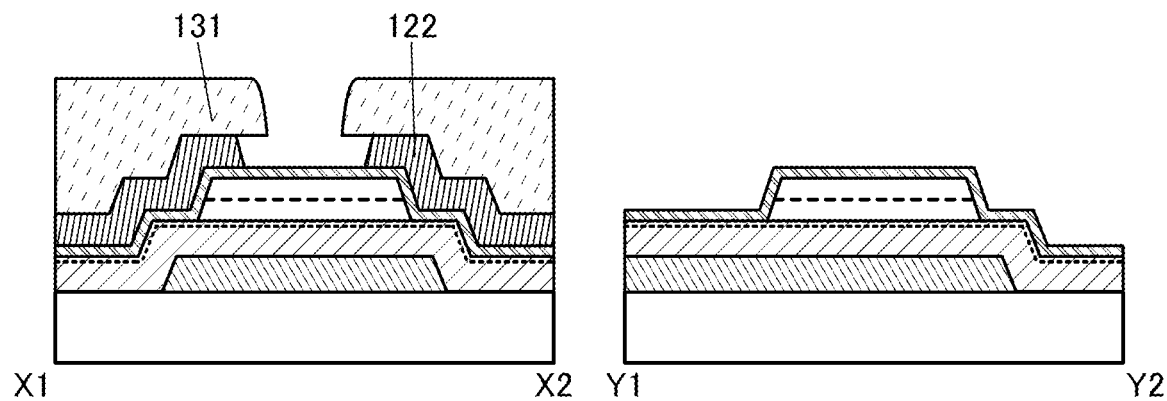
FIGS. 9A-9C Drawings illustrating a method for manufacturing a semiconductor device.

After that, the conductive film 122a is processed by etching, so that the conductive layer 122 is formed (FIG. 9(A)). At this time, it is preferable to perform processing so that the end portions of the conductive layer 122 are positioned inward from the end portions of the resist mask 131 as illustrated in FIG. 9(A).

For the etching of the conductive film 122a, an isotropic etching method is preferably used. A wet etching method can be suitably used. Accordingly, etching can be performed so that the end portions of the conductive layer 122 are recessed.

After formation of the conductive layer 122, the resist mask 131 is removed.

Next, a conductive film 123a is formed to cover the conductive layer 122 and the conductive film 121a. The conductive film 123a is a conductive film to be the conductive layer 123 later.

Figure 9B:
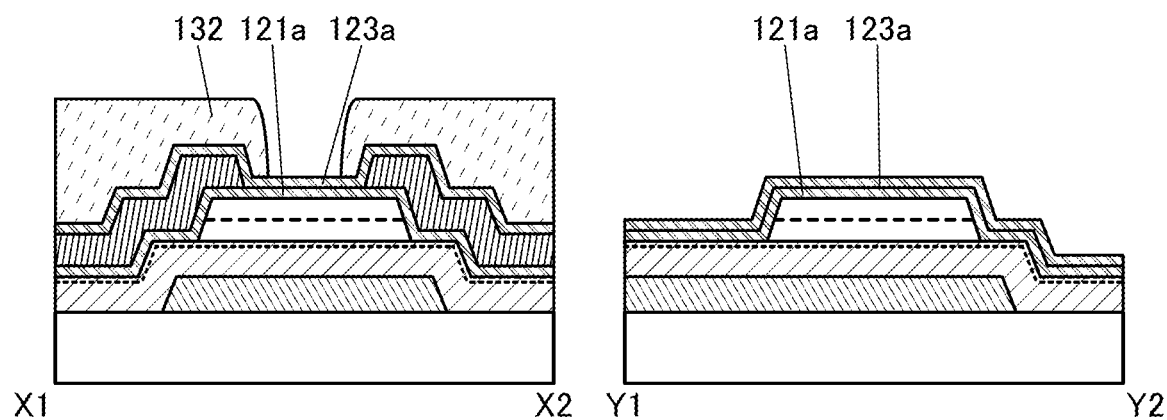
Figure 9C:
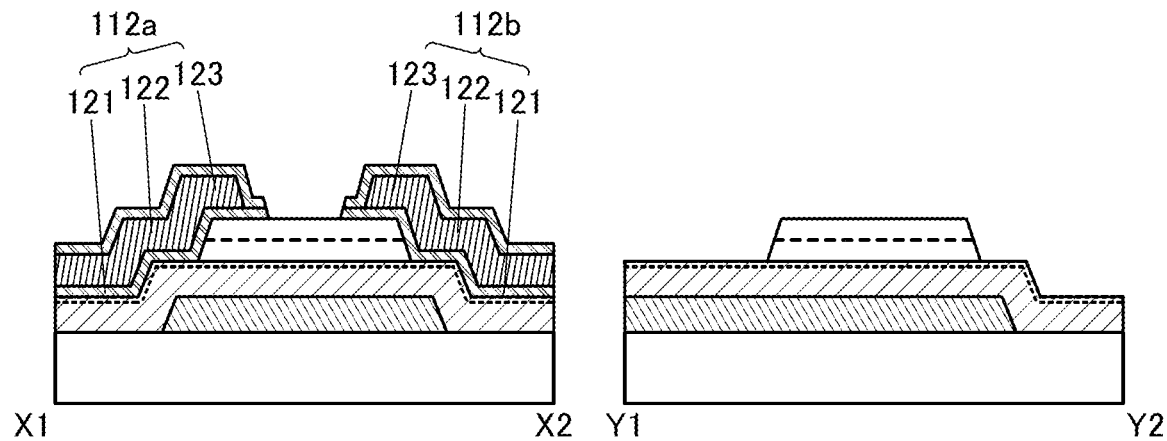

Next, a resist mask 132 is formed over the conductive film 123a (FIG. 9(B)). At this time, the resist mask 132 can be formed using the same photomask as the resist mask 131. Thus, the same photomask can be used, and the manufacturing cost can be reduced.

Then, the conductive film 123a and the conductive film 121a are processed by etching, whereby the conductive layer 123 and the conductive layer 121 are formed. At this time, it is preferable to perform processing so that end portions of the conductive layer 123 and the conductive layer 121 are in contact with each other and the conductive layer 122 is not exposed.

For the etching of the conductive film 123a and the conductive film 121a, an anisotropic etching method is preferably used. The use of a dry etching method is suitable because processing can be performed so that the end portions of the conductive layer 123 and the conductive layer 121 are not recessed. Accordingly, the conductive layer 121 and the conductive layer 123 can be formed to surround the conductive layer 122, and a variation in channel length of transistors can be suppressed as well.

Furthermore, when the same conductive film is used as the conductive film 123a and the conductive film 121a, the etching can be easily performed. In addition, the end portions of the conductive layer 121 and the conductive layer 123 are less likely to have unevenness, which is preferable.

After that, the resist mask 132 is removed. Through the above steps, the conductive layer 112a and the conductive layer 112b can be formed (FIG. 9(C)).

[Formation of Insulating Layer 114]

Figure 10A:
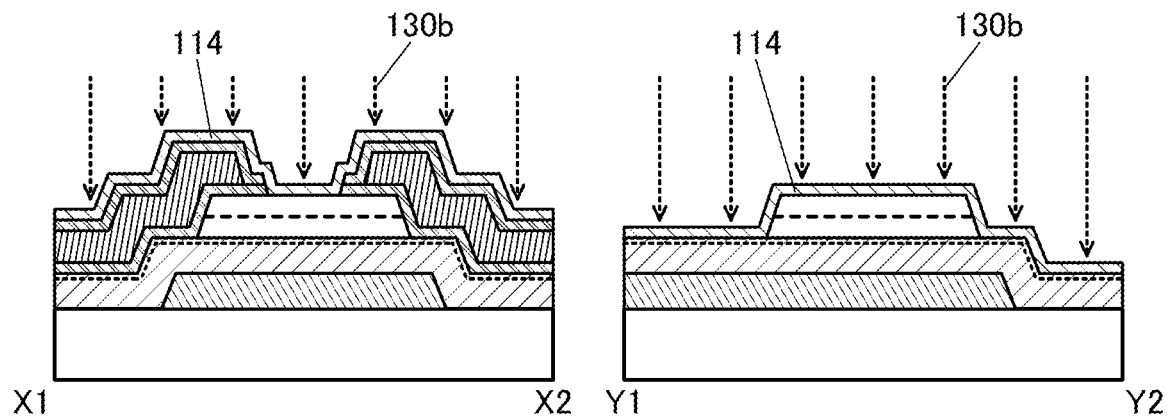
FIGS. 10A-10C Drawings illustrating a method for manufacturing a semiconductor device.

Next, the insulating layer 114 is formed to cover the conductive layer 112a, the conductive layer 112b, the semiconductor layer 108, and the like (FIG. 10(A)).

The insulating layer 114 is preferably deposited under, for example, an atmosphere containing oxygen. In particular, the insulating layer 114 is preferably formed by a plasma CVD method in an atmosphere containing oxygen. Thus, the insulating layer 114 with few defects can be formed.

As the insulating layer 114, for example, an oxide film such as a silicon oxide film or a silicon oxynitride film is preferably formed with a plasma-enhanced chemical vapor deposition apparatus (a PECVD apparatus or simply referred to as a plasma CVD apparatus). In this case, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

In addition, the insulating layer 114 is formed with a PECVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa or lower than or equal to 50 Pa, so that a silicon oxynitride film having few defects can be formed.

Furthermore, the insulating layer 114 may be formed by a PECVD method using a microwave. A microwave refers to the frequency range of 300 MHz to 300 GHz. In a microwave, electron temperature is low and electron energy is low. Furthermore, in supplied power, the proportion used for acceleration of electrons is low, and therefore, power can be used for dissociation and ionization of more molecules; thus, plasma with a high density (high-density plasma) can be excited. Thus, little plasma damage to the deposition surface and a deposit is caused, so that the insulating layer 114 having few defects can be formed.

[First Oxygen Supply Treatment]

Next, treatment for supplying oxygen 130b to the insulating layer 114 (also referred to as first oxygen supply treatment) is performed. At this time, the temperature of the oxygen supply treatment (also referred to as a first temperature) can be, for example, higher than or equal to 250° C. and lower than or equal to 450° C., preferably higher than or equal to 280° C. and lower than or equal to 400° C., further preferably higher than or equal to 300° C. and lower than or equal to 380° C., typically 350° C.

As the oxygen supply treatment, plasma treatment in an atmosphere containing oxygen (also referred to as oxygen plasma treatment) is preferably performed. When oxygen is made to be plasma, an oxygen radical, an oxygen atom, or an oxygen ion can be added to the insulating layer 114. It is preferable that the oxygen flow rate ratio in a gas introduced into an apparatus be as high as possible, for example, higher than or equal to 50% and lower than or equal to 100%, preferably higher than or equal to 60% and lower than or equal to 100%, further preferably higher than or equal to 80% and lower than or equal to 100%, still further preferably 100%.

As a gas introduced into a treatment chamber when oxygen plasma treatment is performed, an oxidizing gas such as an ozone gas, a dinitrogen monoxide gas, or a nitrogen dioxide gas as well as an oxygen gas can be used.

Furthermore, as the treatment apparatus, a dry etching apparatus, an ashing apparatus, a PECVD apparatus, or the like is preferably used because the above apparatus can also be used in other treatment. In particular, a PECVD apparatus is preferably used because the treatment can be performed in the deposition apparatus of the insulating layer 114.

The first oxygen supply treatment is preferably performed in the deposition apparatus of the insulating layer 114. At this time, plasma treatment is preferably performed after the deposition of the insulating layer 114 without exposure to the atmospheric air. In particular, the plasma treatment is preferably performed using a film formation chamber for forming the insulating layer 114. Furthermore, the temperature of the first oxygen supply treatment and the deposition temperature of the insulating layer 114 are preferably the same. This allows the processing time to be shortened.

Note that the oxygen supply treatment is not limited to the above, and a method enabling the supply of oxygen to the insulating layer 114 can be used. For example, oxygen may be supplied to the insulating layer 114 by an ion implantation method, an ion doping method, a plasma immersion ion implantation method, or the like. Alternatively, oxygen may be supplied to the insulating layer 114 by performing heat treatment in an oxygen atmosphere.

[Second Oxygen Supply Treatment]

Then, second oxygen supply treatment for supplying oxygen 130c to the insulating layer 114 is performed. At this time, it is assumed that the temperature of the oxygen supply treatment (also referred to as a second temperature) is lower than the first temperature in the first oxygen supply treatment. For example, the temperature can be higher than or equal to 150° C. and lower than or equal to 300° C., preferably higher than or equal to 170° C. and lower than or equal to 280° C., further preferably higher than or equal to 190° C. and lower than or equal to 250° C., typically 220° C.

The description of the first oxygen supply treatment can be referred to for conditions other than the apparatus and temperatures of the second oxygen supply treatment.

Note that the second oxygen supply treatment is preferably performed in a treatment chamber which is different from the deposition chamber for depositing the insulating layer 114. In the case where the temperature of a treatment chamber for performing treatment such as deposition (e.g., a temperature of a stage that holds a substrate) is changed, it sometimes takes a long time to stabilize the temperature of a stage or a deposition chamber itself. Therefore, in the case where the treatment temperatures are different, the use of different treatment chambers or different treatment apparatuses can improve the productivity.

After the first oxygen supply treatment is performed, the second oxygen supply treatment is performed at a temperature lower than the temperature of the first oxygen supply treatment, whereby the insulating layer 114 can be a film containing an extremely large amount of oxygen. Accordingly, a large amount of oxygen can be supplied from the insulating layer 114 to the semiconductor layer 108 at the time of subsequent deposition of the insulating layer 116 or in heat treatment performed later.

Note that although an example in which oxygen supply treatment is performed twice on the insulating layer 114 is described here, the number of times of oxygen supply treatment is not limited to twice and may be three or more times. However, in the case where oxygen supply treatment is performed three or more times, productivity is reduced in some cases. Therefore, as described in this embodiment, the number of times of oxygen supply treatment is suitably twice. On the other hand, as the number of times of oxygen supply treatment increases, the insulating layer 114 containing a large amount of oxygen can be obtained. Furthermore, in the case of performing oxygen supply treatment on the insulating layer 114 three or more times, treatment temperatures of second or later oxygen supply treatment are preferably the same as or lower than the treatment temperature of the proceeding oxygen supply treatment.

Note that before the insulating layer 114 is deposited, treatment similar to the first oxygen supply treatment may be performed on the semiconductor layer 108. Thus, oxygen can be selectively supplied to the channel formation region of the semiconductor layer 108 (i.e., a region not covered with the conductive layer 112a and the conductive layer 112b). At this time, the temperature of the oxygen supply treatment is preferably higher than the second temperature of the second oxygen supply treatment. In particular, the temperature is preferably the same as the deposition temperature of the insulating layer 114 or the first temperature of the first oxygen supply treatment.

For example, the oxygen supply treatment on the semiconductor layer 108, the deposition of the insulating layer 114, and the first oxygen supply treatment are preferably performed successively without exposure to the atmospheric air in the same film formation chamber of the same deposition apparatus. At this time, it is preferable that these treatment temperatures also be set to the same temperature. For example, the substrate 102 is introduced into a film formation chamber of the deposition apparatus of the insulating layer 114, plasma treatment is performed in an atmosphere containing oxygen, the insulating layer 114 is deposited in succession, and then the first oxygen supply treatment can be performed.

[Formation of Insulating Layer 116]

Figure 10B:
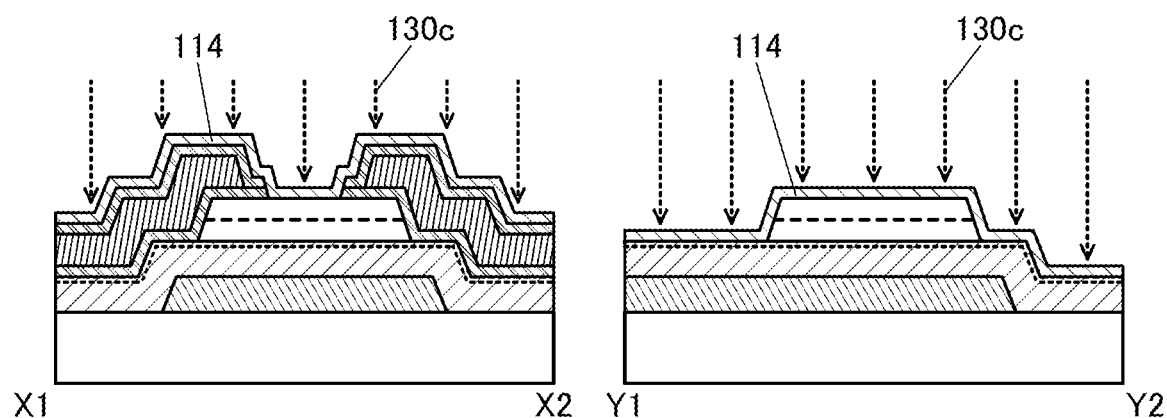
Figure 10C:
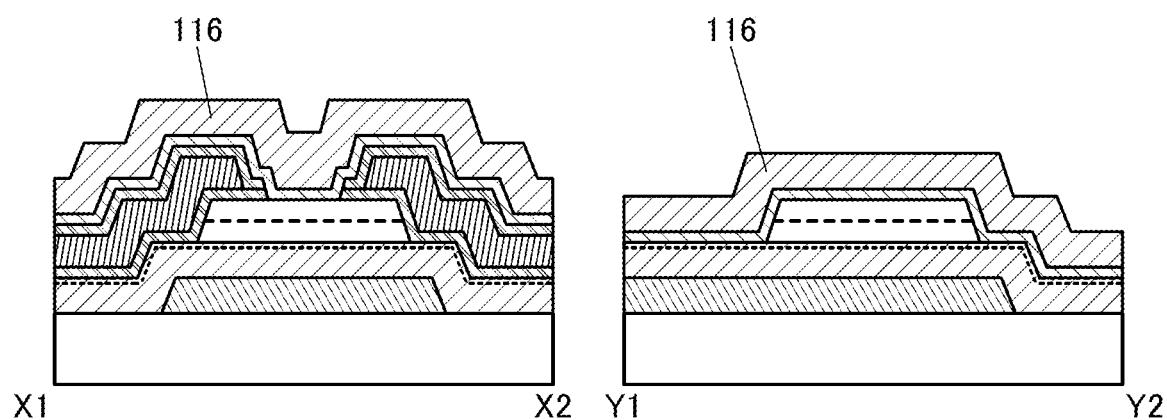

Next, the insulating layer 116 is formed to cover the insulating layer 114 (FIG. 10(B)). The insulating layer 116 can be formed in a manner similar to that of the insulating layer 106.

For example, the deposition temperature of the insulating layer 116 can be set to the same temperature as the second temperature. Alternatively, the deposition temperature of the insulating layer 116 can be set to the same temperature as the first temperature. The productivity can be improved as the deposition temperature is lower. On the other hand, as the deposition temperature is higher, impurities such as hydrogen in the film can be reduced.

Here, heat treatment is preferably performed at a temperature higher than the temperature of the second oxygen supply treatment (the second temperature) after the deposition of the insulating layer 116. Accordingly, oxygen contained in the insulating layer 114 can be supplied to the semiconductor layer 108. Moreover, at this time, since the insulating layer 114 is covered with the insulating layer 116 into which oxygen is less likely to be diffused, a large amount of oxygen can be supplied to the semiconductor layer 108 without release of oxygen to the outside through the insulating layer 116.

Alternatively, when the deposition temperature of the insulating layer 116 is higher than the temperature of the second oxygen supply treatment (the second temperature), the heat treatment can serve as the above heat treatment.

Through the above steps, the transistor 100A can be manufactured.

The above is the description of the manufacturing method example of the transistor.

At least part of the structural examples, the manufacturing method examples, the drawings corresponding thereto, and the like exemplified in this embodiment can be implemented in combination with the other structural examples, the other manufacturing method examples, the other drawings corresponding thereto, and the like as appropriate.

At least part of this embodiment can be implemented in combination with the other embodiments described in this specification as appropriate.

Embodiment 2

In this embodiment, an example of a display device that includes the transistors exemplified in the above embodiment will be described.

Structural Example

Figure 11A:
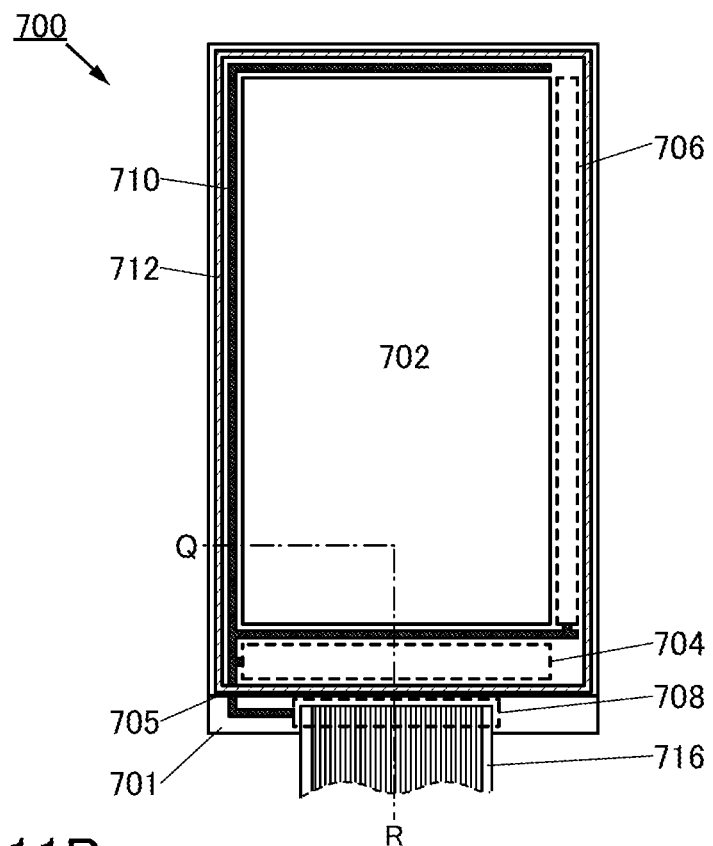

FIG. 11(A) is a top view of an example of a display device. A display device 700 illustrated in FIG. 11(A) includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. Note that the first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 11(A), a display element is provided between the first substrate 701 and the second substrate 705.

In addition, in the display device 700, an FPC terminal portion 708 (FPC: Flexible printed circuit) electrically connected to the pixel portion 702, the source driver circuit portion 704, and the gate driver circuit portion 706 is provided in a region, which is different from the region over the first substrate 701 and surrounded by the sealant 712. An FPC 716 is connected to the FPC terminal portion 708, and a variety of signals and the like are supplied from the FPC 716 to the pixel portion 702, the source driver circuit portion 704, and the gate driver circuit portion 706. A signal line 710 is connected to the pixel portion 702, the source driver circuit portion 704, the gate driver circuit portion 706, and the FPC terminal portion 708. A variety of signals and the like are supplied from the FPC 716 to the pixel portion 702, the source driver circuit portion 704, the gate driver circuit portion 706, and the FPC terminal portion 708 via the signal line 710.

A plurality of gate driver circuit portions 706 may be provided in the display device 700. In addition, an example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a structure may be employed in which a substrate over which a source driver circuit, a gate driver circuit, or the like is formed (e.g., a driver circuit substrate formed using a single-crystal semiconductor film or a polycrystalline semiconductor film) is formed on the first substrate 701. Note that there is no particular limitation on the method for connecting a separately prepared driver circuit substrate, and a COG (Chip On Glass) method, a wire bonding method, or the like can be used.

Furthermore, the pixel portion 702, the source driver circuit portion 704, and the gate driver circuit portion 706 included in the display device 700 include a plurality of transistors, and the transistor that is a semiconductor device of one embodiment of the present invention can be used.

Moreover, the display device 700 can include a variety of elements. Examples of the elements include an electroluminescent (EL) element (an EL element containing an organic matter and an inorganic matter, an organic EL element, an inorganic EL element, an LED, and the like), a light-emitting transistor element (a transistor that emits light depending on current), an electron emitter, a liquid crystal element, an electronic ink element, an electrophoretic element, an electrowetting element, a plasma display panel (PDP), a MEMS (microelectromechanical systems) display (e.g., a grating light valve (GLV), a digital micromirror device (DMD), a digital micro shutter (DMS) element, and an interferometric modulation (IMOD) element), and a piezoelectric ceramic display.

Furthermore, examples of a display device using an EL element include an EL display. Examples of display devices using electron emitters include a field emission display (FED) and an SED-type flat panel display (SED: Surface-conduction Electron-emitter Display). Examples of display devices using liquid crystal elements include liquid crystal displays (a transmissive liquid crystal display, a transflective liquid crystal display, a reflective liquid crystal display, a direct-view liquid crystal display, and a projection liquid crystal display). Examples of a display device using an electronic ink element or an electrophoretic element include electronic paper. Note that in the case where a transflective liquid crystal display or a reflective liquid crystal display is obtained, some or all of pixel electrodes function as reflective electrodes. For example, some or all of pixel electrodes contain aluminum, silver, or the like. Moreover, in such a case, a memory circuit such as an SRAM can be provided under the reflective electrodes. Thus, the power consumption can be further reduced.

Note that as a display method in the display device 700, a progressive method, an interlace method, or the like can be used. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be employed. Alternatively, a color element may be composed of two colors among R, G, and B as in PenTile layout, and two different colors may be selected depending on color elements. Alternatively, one or more colors of yellow, cyan, magenta, and the like may be added to R, G, and B. Note that the size of a display region may differ between dots of the color elements. Note that the disclosed invention is not limited to a display device for color display and can also be applied to a display device for monochrome display.

In addition, a coloring layer (also referred to as a color filter) may be used to make a display device perform full-color display in which white light (W) is used for a backlight (an organic EL element, an inorganic EL element, an LED, a fluorescent lamp, or the like). For example, for the coloring layer, red (R), green (G), blue (B), and yellow (Y) can be used in combination as appropriate. With the use of the coloring layer, higher color reproducibility can be obtained as compared with the case without the coloring layer. At this time, by providing a region with the coloring layer and a region without the coloring layer, white light in the region without the coloring layer may be directly utilized for display. By partly providing the region without the coloring layer, a decrease in luminance of a bright image due to the coloring layer can be suppressed, and approximately 20% to 30% of power consumption can be reduced in some cases. Note that in the case where full-color display is performed using a self-luminous element such as an organic EL element or an inorganic EL element, elements may emit light of their respective colors R, G, B, Y, and W. By using a self-luminous element, power consumption may be further reduced as compared with the case of using a coloring layer.

Furthermore, as a coloring system, in addition to the above-described system (color filter system) in which part of white light is converted into red light, green light, and blue light through color filters, a system (three-color system) in which red light, green light, and blue light are used or a system (color conversion system or quantum dot system) in which part of blue light is converted into red or green may be used.

Figure 11B:
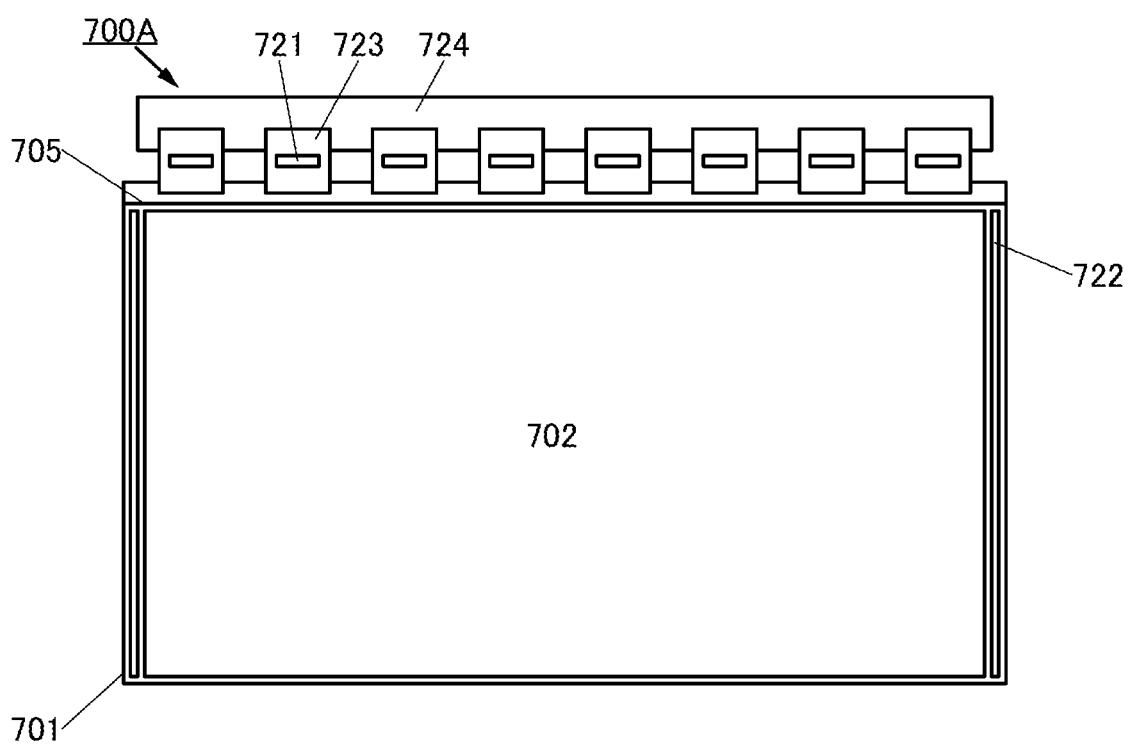

A display device 700A illustrated in FIG. 11(B) is a display device suitably used for an electronic device with a large screen. For example, the display device 700A can be suitably used for a television device, a monitor device, digital signage, or the like.

The display device 700A includes a plurality of source driver ICs 721 and a pair of gate driver circuits 722.

The plurality of source driver ICs 721 are attached to respective FPCs 723. In each of the plurality of FPCs 723, one of terminals is connected to the substrate 701, and the other terminal is connected to a printed board 724. The printed board 724 can be mounted on the electronic device in such a manner that the FPCs 723 are bent so that the printed board 724 is located on the back side of the pixel portion 702.

On the other hand, the gate driver circuits 722 are provided over the substrate 701. Thus, an electronic device with a narrow frame can be obtained.

With such a structure, a large-size and high-resolution display device can be obtained. For example, such a structure can be used for a display device whose screen diagonal is 30 inches or more, 40 inches or more, 50 inches or more, or 60 inches or more. Furthermore, a display device with extremely high resolution such as full high definition, 4K2K, or 8K4K can be obtained.

[Cross-Sectional Structural Example]

Figure 12:
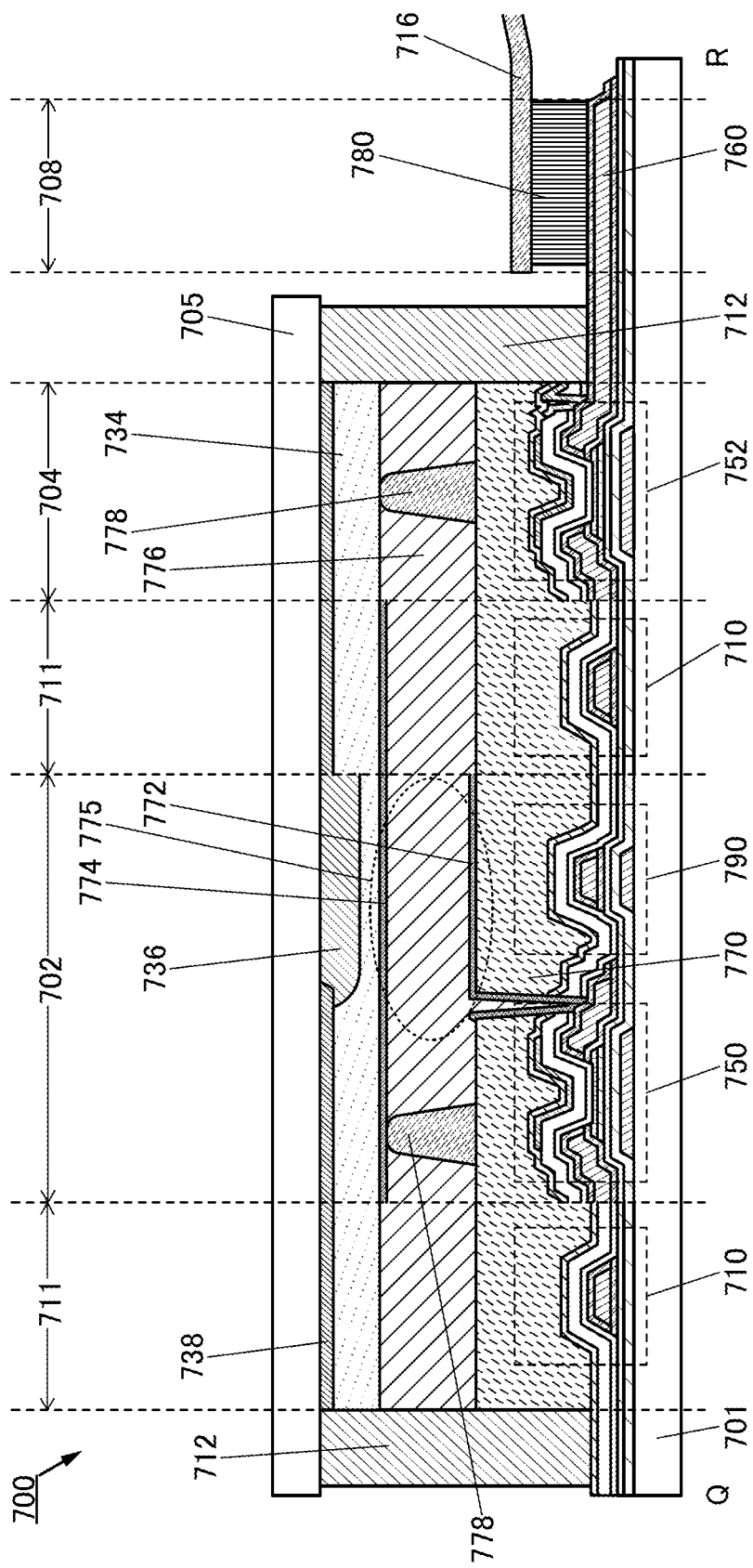
FIG. 12 A structural example of a display device.
Figure 13:
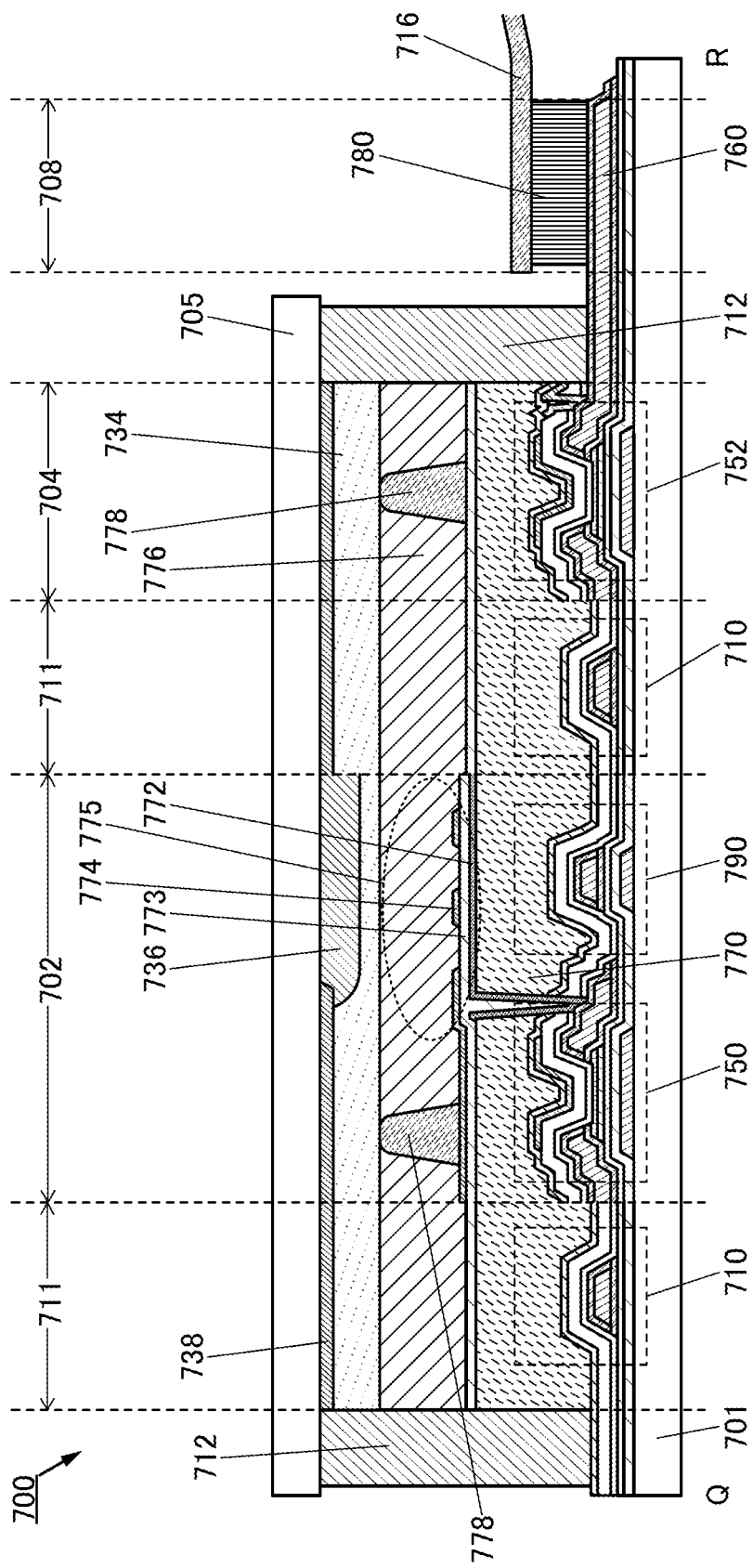
FIG. 13 A structural example of a display device.

Structures including a liquid crystal element and an EL element as display elements are described below with reference to FIG. 12 to FIG. 14. Note that FIG. 12 and FIG. 13 are cross-sectional views taken along the dashed-dotted line Q-R illustrated in FIG. 11 and are structures including a liquid crystal element as a display element. In addition, FIG. 14 is a cross-sectional view taken along the dashed-dotted line Q-R illustrated in FIG. 11 and is a structure including an EL element as a display element.

Portions common to FIG. 12 to FIG. 14 will be described first, and then, different portions will be described.
[Description of Common Portions in Display Devices]

Figure 14:
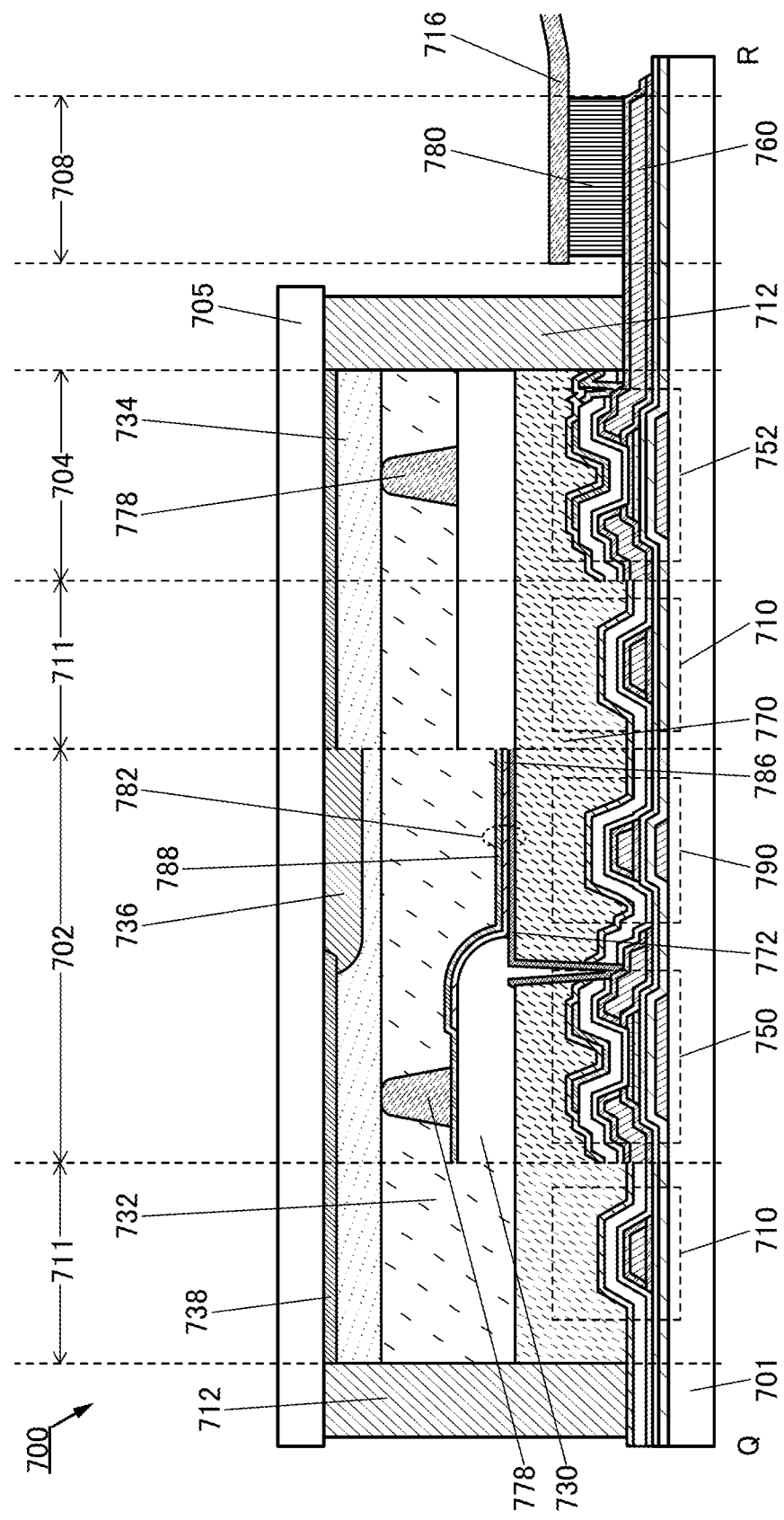
FIG. 14 A structural example of a display device.

The display device 700 illustrated in FIG. 12 to FIG. 14 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

As the transistor 750 and the transistor 752, the transistors exemplified in Embodiment 1 can be used.

The transistor used in this embodiment includes a highly purified oxide semiconductor film in which formation of oxygen vacancy is suppressed. The transistor can have a low off-state current. Accordingly, the holding time of an electrical signal such as an image signal can be made longer, and a writing interval can also be set longer in an on state. Accordingly, the frequency of refresh operation can be reduced, which leads to an effect of suppressing power consumption.

In addition, the transistor used in this embodiment can have relatively high field-effect mobility and thus is capable of high-speed operation. For example, with the use of such a transistor capable of high-speed operation for a display device, a switching transistor in a pixel portion and a driver transistor in a driver circuit portion can be formed over one substrate. That is, a semiconductor device formed using a silicon wafer or the like is not additionally needed as a driver circuit; thus, the number of components of the semiconductor device can be reduced. Moreover, the use of the transistor capable of high-speed operation in the pixel portion can provide a high-quality image.

The capacitor 790 includes a lower electrode that is formed through a step of processing the same conductive film as a conductive film functioning as a first gate electrode included in the transistor 750 and an upper electrode that is formed through a step of processing the same conductive film as a conductive film functioning as a second gate electrode included in the transistor 750. In addition, between the lower electrode and the upper electrode, an insulating film formed through a step of forming the same insulating film as an insulating film functioning as a first gate insulating film included in the transistor 750 and an insulating film formed through a step of forming the same insulating film as an insulating film functioning as a protective insulating film over the transistor 750 are provided. That is, the capacitor 790 has a stacked-layer structure in which the insulating films functioning as dielectric films are interposed between a pair of electrodes.

Furthermore, in FIG. 12 to FIG. 14, a planarization insulating film 770 is provided over the transistor 750, the transistor 752, and the capacitor 790.

Although FIG. 12 to FIG. 14 exemplify structures in which transistors having the same structures as the transistor 750 included in the pixel portion 702 and the transistor 752 included in the source driver circuit portion 704, one embodiment of the present invention is not limited thereto. For example, different transistors may be used in the pixel portion 702 and the source driver circuit portion 704. Specifically, a structure in which a top-gate transistor is used in the pixel portion 702 and a bottom-gate transistor is used in the source driver circuit portion 704, a structure in which a bottom-gate transistor is used in the pixel portion 702 and a top-gate transistor is used in the source driver circuit portion 704, and the like can be employed. Note that the source driver circuit portion 704 described above may be replaced with a gate driver circuit portion.

In addition, the signal line 710 is formed through the same step as conductive films functioning as source electrodes and drain electrodes of the transistors 750 and 752. In the case where a material containing a copper element is used for the signal line 710, for example, signal delay or the like due to wiring resistance is reduced, which enables display on a large screen.

In addition, the FPC terminal portion 708 includes a connection electrode 760, an anisotropic conductive film 780, and the FPC 716. Note that the connection electrode 760 is formed through the same step as the conductive films functioning as the source electrodes and the drain electrodes of the transistors 750 and 752. Moreover, the connection electrode 760 is electrically connected to a terminal included in the FPC 716 through the anisotropic conductive film 780.

For example, glass substrates can be used as the first substrate 701 and the second substrate 705. Alternatively, flexible substrates may be used as the first substrate 701 and the second substrate 705. Examples of the flexible substrate include a plastic substrate.

A structure body 778 is provided between the first substrate 701 and the second substrate 705. The structure body 778, which is a columnar spacer, is provided to control the distance (cell gap) between the first substrate 701 and the second substrate 705. Note that a spherical spacer may also be used as the structure body 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

[Structural Example of Display Device Using Liquid Crystal Element]

The display device 700 illustrated in FIG. 12 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 illustrated in FIG. 12 is capable of displaying an image in such a manner that transmission or non-transmission of light is controlled by a change in the alignment state of the liquid crystal layer 776 depending on a voltage applied to the conductive film 772 and the conductive film 774.

In addition, the conductive film 772 is electrically connected to the conductive film functioning as the source electrode or the drain electrode included in the transistor 750. The conductive film 772 is formed over the planarization insulating film 770 and functions as a pixel electrode, i.e., one electrode of the display element.

A conductive film that has a property of transmitting visible light or a conductive film that has a property of reflecting visible light can be used as the conductive film 772. As the conductive film that has a property of transmitting visible light, for example, a material containing one kind selected from indium, zinc, and tin is preferably used. As the conductive film that has a property of reflecting visible light, for example, a material containing aluminum or silver is preferably used.

In the case where the conductive film that has a property of reflecting visible light is used as the conductive film 772, the display device 700 is a reflective liquid crystal display device. In the case where the conductive film that has a property of transmitting visible light is used as the conductive film 772, the display device 700 is a transmissive liquid crystal display device. In the case of a reflective liquid crystal display device, a polarizing plate is provided on the viewer side. On the other hand, in the case of a transmissive liquid crystal display device, a pair of polarizing plates between which a liquid crystal element is sandwiched is provided.

Furthermore, a method for driving a liquid crystal element can be changed with the change in the structure over the conductive film 772. FIG. 13 illustrates an example of this case. The display device 700 illustrated in FIG. 13 is an example of a structure in which a horizontal electric field mode (e.g., an FFS mode) is used as a driving mode of the liquid crystal element. In the structure illustrated in FIG. 13, an insulating film 773 is provided over the conductive film 772, and the conductive film 774 is provided over the insulating film 773. In this case, the conductive film 774 has a function of a common electrode, and an electric field generated between the conductive film 772 and the conductive film 774 through the insulating film 773 can control the alignment state in the liquid crystal layer 776.

Although not illustrated in FIG. 12 and FIG. 13, a structure in which either one or both of the conductive film 772 and the conductive film 774 are provided with an alignment film on a side in contact with the liquid crystal layer 776 may be employed. Alternatively, although not illustrated in FIG. 12 and FIG. 13, an optical member (optical substrate) such as a polarizing member, a retardation member, or an anti-reflection member, or the like may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

In the case of employing a horizontal electric field mode, a liquid crystal exhibiting a blue phase for which an alignment film is not used may be used. A blue phase is one of liquid crystal phases, which is generated just before a cholesteric phase changes into an isotropic phase while temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition that contains a liquid crystal exhibiting the blue phase and a chiral material has a short response time and optical isotropy, which makes the alignment process unneeded. In addition, an alignment film does not need to be provided and rubbing treatment is thus not necessary; accordingly, electrostatic discharge damage caused by the rubbing treatment can be prevented and defects and damage of the liquid crystal display device in the manufacturing process can be reduced. Moreover, the liquid crystal material exhibiting the blue phase has small viewing angle dependence.

Furthermore, in the case where a liquid crystal element is used as the display element, a TN (Twisted Nematic) mode, an IPS (In-Plane-Switching) mode, an FFS (Fringe Field Switching) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, or the like can be used.

Furthermore, a normally black liquid crystal display device, for example, a transmissive liquid crystal display device employing a vertical alignment (VA) mode may be used. Some examples can be given as a vertical alignment mode, which include an MVA (Multi-Domain Vertical Alignment) mode, a PVA (Patterned Vertical Alignment) mode, or an ASV mode.

[Display Device Using Light-Emitting Element]

The display device 700 illustrated in FIG. 14 includes a light-emitting element 782. The light-emitting element 782 includes the conductive film 772, an EL layer 786, and a conductive film 788. The display device 700 illustrated in FIG. 14 can display an image by light emission from the EL layer 786 included in the light-emitting element 782 provided in each pixel. Note that the EL layer 786 contains an organic compound or an inorganic compound such as a quantum dot.

Examples of materials that can be used for an organic compound include a fluorescent material and a phosphorescent material. In addition, examples of materials that can be used for a quantum dot include a colloidal quantum dot material, an alloyed quantum dot material, a core-shell quantum dot material, and a core quantum dot material. Moreover, a material containing elements belonging to Groups 12 and 16, elements belonging to Groups 13 and 15, or elements belonging to Groups 14 and 16 may be used. Alternatively, a quantum dot material containing an element such as cadmium, selenium, zinc, sulfur, phosphorus, indium, tellurium, lead, gallium, arsenic, or aluminum may be used.

In the display device 700 illustrated in FIG. 14, an insulating film 730 is provided over the planarization insulating film 770 and the conductive film 772. The insulating film 730 covers part of the conductive film 772. Note that the light-emitting element 782 has a top-emission structure. Therefore, the conductive film 788 has a light-transmitting property and transmits light emitted from the EL layer 786. Note that although the top-emission structure is exemplified in this embodiment, one embodiment of the present invention is not limited thereto. For example, a bottom-emission structure in which light is emitted to the conductive film 772 side or a dual-emission structure in which light is emitted to both the conductive film 772 and the conductive film 788 can also be employed.

In addition, the coloring film 736 is provided at a position overlapping with the light-emitting element 782, and the light-blocking film 738 is provided at a position overlapping with the insulating film 730, in the lead wiring portion 711, and in the source driver circuit portion 704. In addition, the coloring film 736 and the light-blocking film 738 are covered with the insulating film 734. Moreover, a space between the light-emitting element 782 and the insulating film 734 is filled with a sealing film 732. Note that although the structure in which the coloring film 736 is provided is exemplified in the display device 700 illustrated in FIG. 14, one embodiment of the present invention is not limited thereto. For example, a structure without the coloring film 736 may also be employed in the case where the EL layer 786 is formed into an island shape per pixel, i.e., formed by separate coloring.

[Structural Example of Display Device Provided with Input/Output Device]

An input/output device may be provided in the display device 700 illustrated in FIG. 12 to FIG. 14. Examples of the input/output device include a touch panel.

Figure 15:
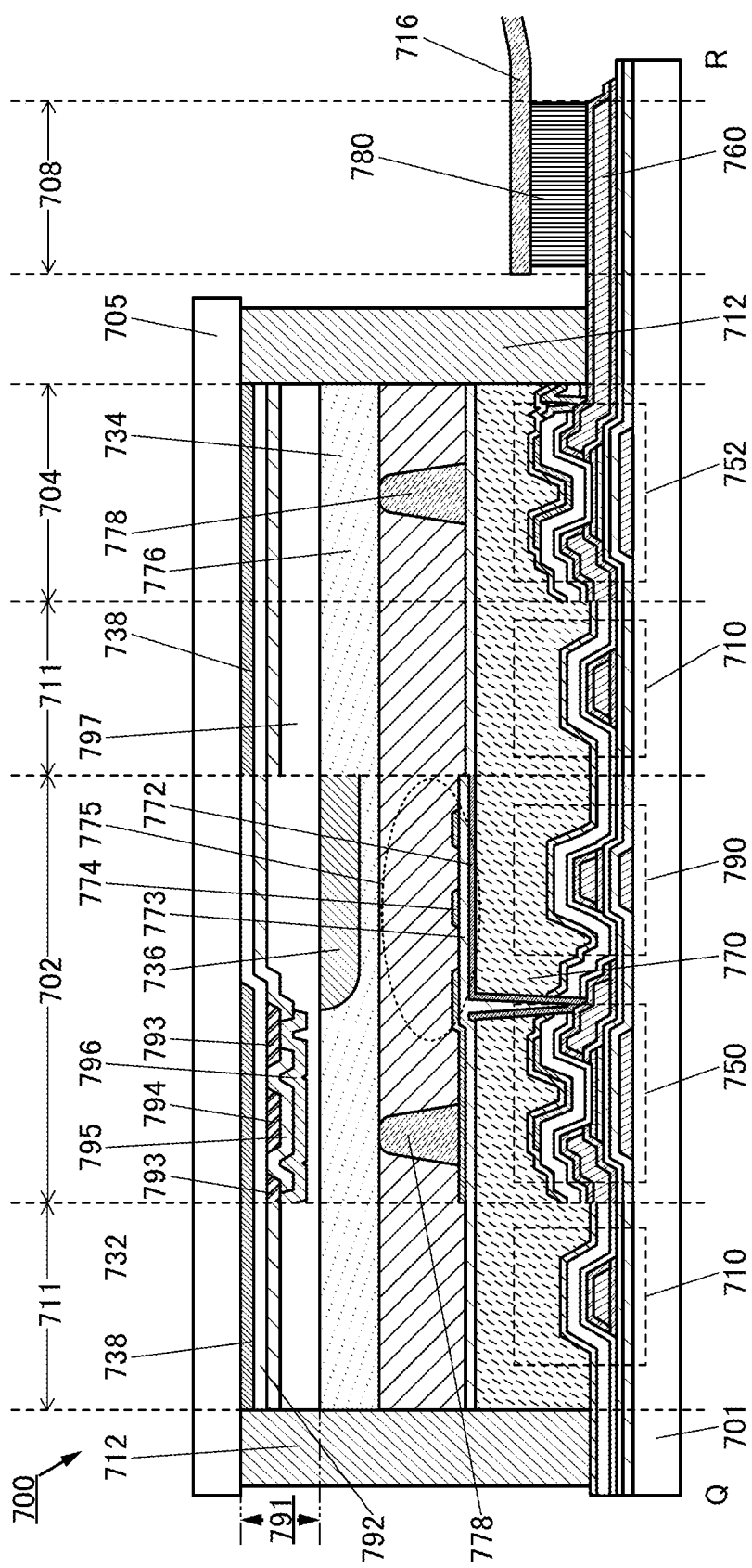
FIG. 15 A structural example of a display device.
Figure 16:
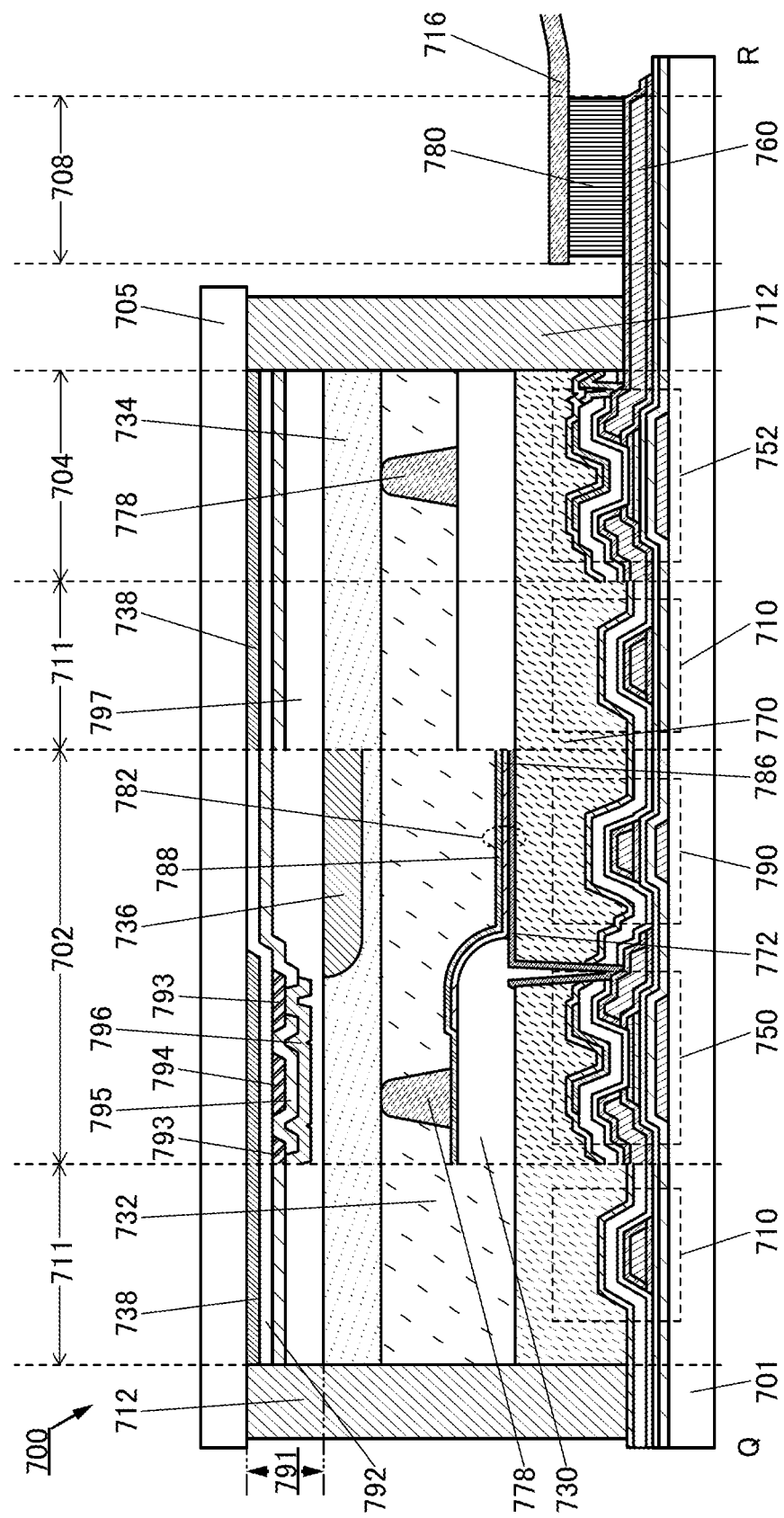
FIG. 16 A structural example of a display device.

FIG. 15 illustrates a structure in which the display device 700 illustrated in FIG. 13 is provided with a touch panel 791, and FIG. 16 illustrates a structure in which the display device 700 illustrated in FIG. 14 is provided with the touch panel 791.

FIG. 15 is a cross-sectional view of the structure in which the display device 700 illustrated in FIG. 13 is provided with the touch panel 791, and FIG. 16 is a cross-sectional view of the structure in which the display device 700 illustrated in FIG. 14 is provided with the touch panel 791.

First, the touch panel 791 illustrated in FIG. 15 and FIG. 16 will be described below.

The touch panel 791 illustrated in FIG. 15 and FIG. 16 is what is called an in-cell touch panel provided between the substrate 705 and the coloring film 736. The touch panel 791 is formed on the substrate 705 side before the coloring film 736 is formed.

Note that the touch panel 791 includes an insulating film 792, an electrode 793, an electrode 794, an insulating film 795, an electrode 796, and an insulating film 797. A change in the capacitance between the electrode 793 and the electrode 794 can be sensed when a sensing target such as a finger or a stylus approaches, for example.

In addition, a portion in which the electrode 793 intersects with the electrode 794 is illustrated in the upper portion of the transistor 750 illustrated in FIG. 15 and FIG. 16. Through openings provided in the insulating film 795, the electrode 796 is electrically connected to the two electrodes 793 between which the electrode 794 is sandwiched. Note that a structure in which a region provided with the electrode 796 is provided in the pixel portion 702 is exemplified in FIG. 15 and FIG. 16; however, one embodiment of the present invention is not limited thereto and may be formed in the source driver circuit portion 704, for example.

The electrode 793 and the electrode 794 are provided in a region overlapping with the light-blocking film 738. As illustrated in FIG. 15 and FIG. 16, it is preferable that the electrode 793 not overlap with the liquid crystal element 775 or the light-emitting element 782. In other words, the electrode 793 has an opening in a region overlapping with the light-emitting element 782 or the liquid crystal element 775. That is, the electrode 793 has a mesh shape. With such a structure, a structure in which the electrode 793 does not block light emitted from the light-emitting element 782 or light transmitted through the liquid crystal element 775 can be obtained.

Thus, since a reduction in luminance due to the placement of the touch panel 791 is extremely small, a display device with high visibility and low power consumption can be obtained. Note that the electrode 794 can have a similar structure.

In addition, since the electrode 793 and the electrode 794 do not overlap with the light-emitting element 782 or the liquid crystal element 775, a metal material with low visible light transmittance can be used for the electrode 793 and the electrode 794.

Accordingly, the resistance of the electrode 793 and the electrode 794 can be reduced as compared with an electrode using an oxide material with high visible light transmittance, so that the sensitivity of the touch panel can be increased.

For example, a conductive nanowire may be used for the electrodes 793, 794, and 796. The nanowire has a mean diameter of greater than or equal to 1 nm and less than or equal to 100 nm, preferably greater than or equal to 5 nm and less than or equal to 50 nm, further preferably greater than or equal to 5 nm and less than or equal to 25 nm. Moreover, as the above nanowire, a metal nanowire such as an Ag nanowire, a Cu nanowire, or an Al nanowire, a carbon nanotube, or the like is used. For example, in the case where an Ag nanowire is used for any one of or all of the electrodes 793, 794, and 796, the visible light transmittance can be greater than or equal to 89% and the sheet resistivity can be greater than or equal to 40 Ω/square and less than or equal to 100 Ω/square.

Although the structure of the in-cell touch panel is exemplified in FIG. 15 and FIG. 16, one embodiment of the present invention is not limited thereto. For example, a touch panel formed over the display device 700, what is called an on-cell touch panel, or a touch panel attached to the display device 700, what is called an out-cell touch panel, may be used.

In this manner, the display device of one embodiment of the present invention can be combined with various types of touch panels.

At least part of this embodiment can be implemented in combination with the other embodiments described in this specification as appropriate.

Embodiment 3

In this embodiment, a display device that includes a semiconductor device of one embodiment of the present invention will be described with reference to FIG. 17.
[Circuit Configuration of Display Device]

The display device illustrated in FIG. 17(A) includes a region including pixels (hereinafter referred to as a pixel portion 502), a circuit portion provided outside the pixel portion 502 and including a circuit for driving the pixels (hereinafter referred to as a driver circuit portion 504), circuits having a function of protecting an element (hereinafter referred to as protection circuits 506), and a terminal portion 507. Note that a structure in which the protection circuits 506 are not provided may be employed.

Part or the whole of the driver circuit portion 504 is desirably formed over the same substrate as the pixel portion 502. Thus, the number of components and the number of terminals can be reduced. In the case where part or the whole of the driver circuit portion 504 is not formed over the same substrate as the pixel portion 502, the part or the whole of the driver circuit portion 504 can be mounted by COG or TAB (Tape Automated Bonding).

The pixel portion 502 includes a plurality of circuits for driving display elements arranged in X rows (X is a natural number of 2 or more) and Y columns (Y is a natural number of 2 or more) (hereinafter referred to as pixel circuits 501), the driver circuit portion 504 includes driver circuits such as a circuit for outputting a signal (scan signal) to select a pixel (hereinafter referred to as a gate driver 504a) and a circuit for supplying a signal (data signal) to drive a display element in a pixel (hereinafter referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided and the scan lines GL_1 to GL_X may be separately controlled by the plurality of gate drivers 504a. Alternatively, the gate driver 504a has a function of supplying an initialization signal. However, without being limited thereto, the gate driver 504a can supply another signal.

The source driver 504b includes a shift register or the like. The source driver 504b receives a signal (image signal) from which a data signal is derived, as well as a signal for driving the shift register, through the terminal portion 507. The source driver 504b has a function of generating a data signal to be written to the pixel circuit 501 on the basis of the image signal. In addition, the source driver 504b has a function of controlling output of a data signal in response to a pulse signal obtained by input of a start pulse, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. However, without being limited thereto, the source driver 504b can supply another signal.

The source driver 504b is formed using a plurality of analog switches, for example. The source driver 504b can output, as the data signals, signals obtained by time-dividing the image signal by sequentially turning on the plurality of analog switches. In addition, the source driver 504b may be formed using a shift register or the like.

A pulse signal and a data signal are inputted to each of the plurality of pixel circuits 501 through one of the plurality of scan lines GL supplied with scan signals and one of the plurality of data lines DL supplied with data signals, respectively. In addition, writing and holding of data of the data signal to and in each of the plurality of pixel circuits 501 are controlled by the gate driver 504a. For example, to the pixel circuit 501 in the m-th row and the n-th column, a pulse signal is inputted from the gate driver 504a through the scan line GL_m (m is a natural number less than or equal to X) and a data signal is inputted from the source driver 504b through the data line DL_n (n is a natural number less than or equal to Y) in accordance with the potential of the scan line GL_m.

Figure 17A:
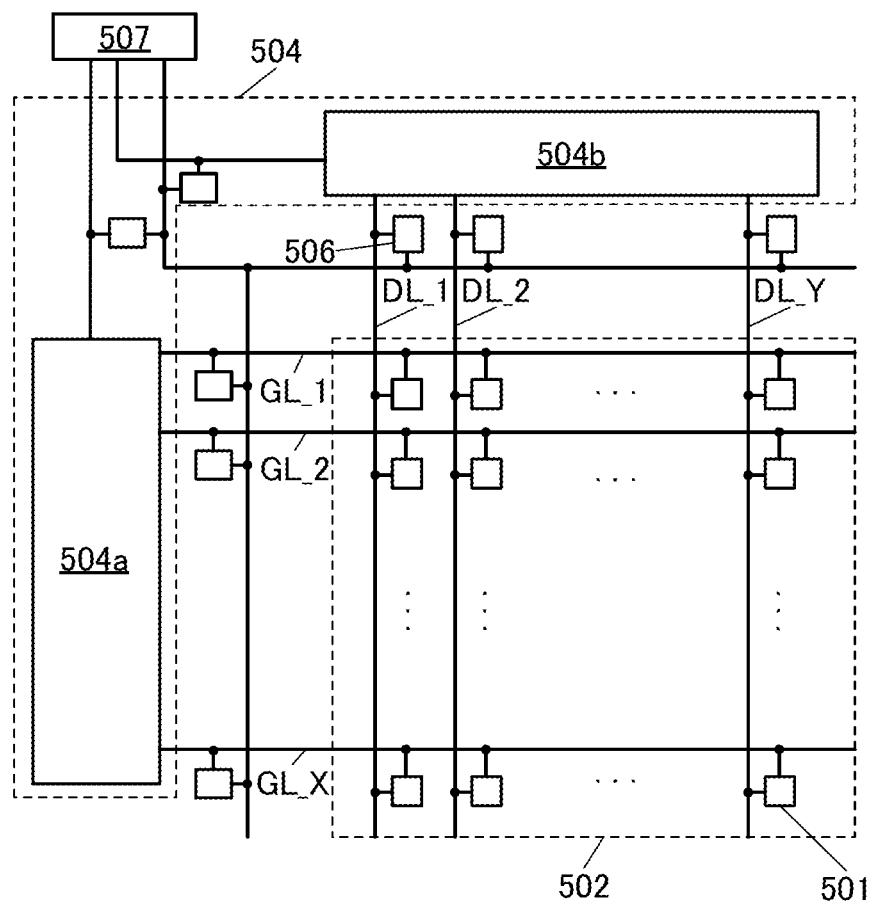
FIGS. 17A-17C A block diagram and circuit diagrams of a display device.

The protection circuit 506 illustrated in FIG. 17(A) is connected to, for example, the scan line GL, which is a wiring between the gate driver 504a and the pixel circuit 501. Alternatively, the protection circuit 506 is connected to the data line DL, which is a wiring between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion provided with terminals for inputting power, control signals, and image signals to the display device from external circuits.

The protection circuit 506 is a circuit that makes, when a potential out of a certain range is applied to the wiring connected to the protection circuit, the wiring and another wiring be in conduction state.

As illustrated in FIG. 17(A), the protection circuit 506 is provided for each of the pixel portion 502 and the driver circuit portion 504, so that the resistance of the display device to overcurrent generated by ESD (Electro Static Discharge) or the like can be improved. Note that the configuration of the protection circuits 506 is not limited thereto; for example, a configuration in which the protection circuit 506 is connected to the gate driver 504a or a configuration in which the protection circuit 506 is connected to the source driver 504b can be employed. Alternatively, a configuration in which the protection circuit 506 is connected to the terminal portion 507 can be employed.

In FIG. 17(A), an example in which the driver circuit portion 504 is formed by the gate driver 504a and the source driver 504b is shown; however, the structure is not limited thereto. For example, a structure may be employed in which only the gate driver 504*a* is formed and a separately prepared substrate where a source driver circuit is formed (e.g., a driver circuit substrate formed with a single crystal semiconductor film or a polycrystalline semiconductor film) is mounted.

Figure 18:
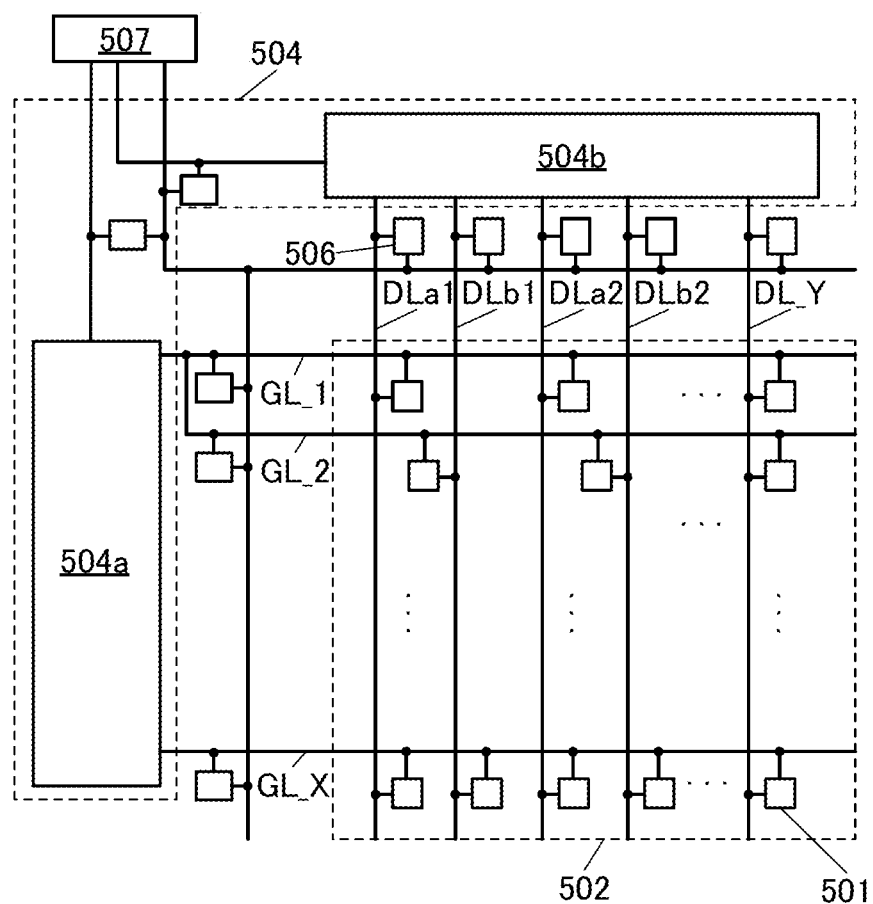
FIG. 18 A block diagram of a display device.

Here, FIG. 18 illustrates a configuration different from that in FIG. 17(A). In FIG. 18, a pair of source lines (e.g., a source line DLa1 and a source line DLb1) is provided so that a plurality of pixels arranged in the source line direction are sandwiched therebetween. In addition, two adjacent gate lines (e.g., a gate line GL_1 and a gate line GL_2) are electrically connected to each other.

Furthermore, pixels connected to the gate line GL_1 are connected to one of the source lines (such as the source line DLa1 or a source line DLa2), and pixels connected to the gate line GL_2 are connected to the other source line (such as the source line DLb1 or a source line DLb2).

In such a configuration, two gate lines can be selected concurrently. Accordingly, one horizontal period can have a length twice that in the configuration illustrated in FIG. 17(A). This facilitates an increase in resolution and an increase in screen size of a display device.

Figure 17B:
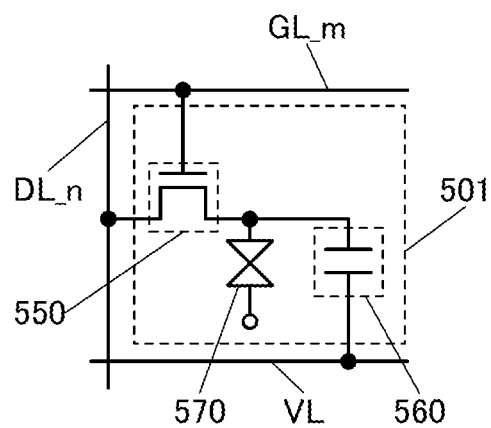

Furthermore, the plurality of pixel circuits 501 illustrated in FIG. 17(A) can have the configuration illustrated in FIG. 17(B), for example.

The pixel circuit 501 illustrated in FIG. 17(B) includes a liquid crystal element 570, a transistor 550, and a capacitor 560. As the transistor 550, the transistors described in the above embodiments can be used.

The potential of one of a pair of electrodes of the liquid crystal element 570 is set in accordance with the specifications of the pixel circuit 501 as appropriate. The alignment state of the liquid crystal element 570 is set depending on written data. Note that a common potential may be supplied to one of the pair of electrodes of the liquid crystal element 570 included in each of the plurality of pixel circuits 501. Moreover, a different potential may be supplied to one of the pair of electrodes of the liquid crystal element 570 of the pixel circuit 501 in each row.

For example, as a driving method of the display device including the liquid crystal element 570, a TN mode, an STN mode, a VA mode, an ASM mode, an OCB mode, an FLC mode, an AFLC mode, an MVA mode, a PVA mode, an IPS mode, an FFS mode, or a TBA (Transverse Bend Alignment) mode may be used. Examples of the driving method of the display device include an ECB (Electrically Controlled Birefringence) mode, a PDLC (Polymer Dispersed Liquid Crystal) mode, a PNLC (Polymer Network Liquid Crystal) mode, and a guest-host mode, in addition to the above driving methods. However, without being limited to the above, a variety of liquid crystal elements and the driving methods thereof can be used.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. In addition, a gate electrode of the transistor 550 is electrically connected to the scan line GL_m. The transistor 550 has a function of controlling writing of data of a data signal by being turned on or turned off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. Note that the value of the potential of the potential supply line VL is set in accordance with the specifications of the pixel circuit 501 as appropriate. The capacitor 560 has a function of a storage capacitor for holding written data.

For example, in the display device including the pixel circuit 501 in FIG. 17(B), the pixel circuits 501 in each row are sequentially selected by, for example, the gate driver 504*a* illustrated in FIG. 17(A), whereby the transistors 550 are turned on and data of a data signal is written.

When the transistors 550 are turned off, the pixel circuits 501 in which the data has been written are brought into a holding state. This operation is sequentially performed row by row; thus, an image can be displayed.

Figure 17C:
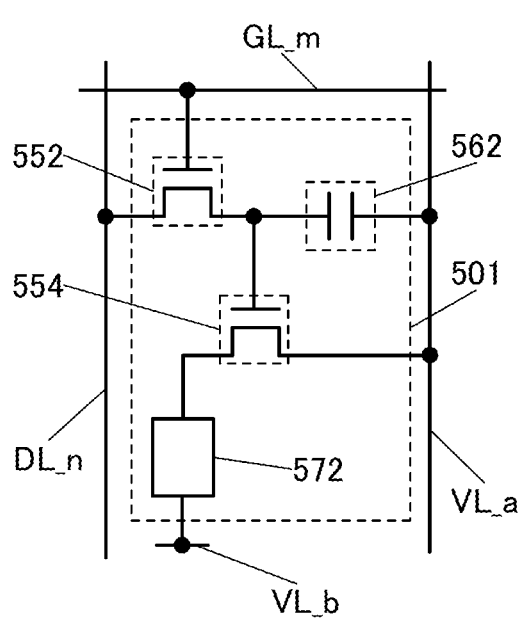

Furthermore, the plurality of pixel circuits 501 illustrated in FIG. 17(A) can have the configuration illustrated in FIG. 17(C), for example.

The pixel circuit 501 illustrated in FIG. 17(C) includes transistors 552 and 554, a capacitor 562, and a light-emitting element 572. The transistors described in the above embodiments can be used as one or both of the transistor 552 and the transistor 554.

One of a source electrode and a drain electrode of the transistor 552 is electrically connected to a data line DL_n, and a gate electrode is electrically connected to a scan line GL_m.

The transistor 552 has a function of controlling writing of data of a data signal by being turned on or turned off.

One of a pair of electrodes of the capacitor 562 is electrically connected to a potential supply line VL_a, and the other is electrically connected to the other of the source electrode and the drain electrode of the transistor 552.

The capacitor 562 has a function of a storage capacitor for holding written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited thereto; an inorganic EL element including an inorganic material may be used.

Note that a high power supply potential VDD is supplied to one of the potential supply line VL_a and the potential supply line VL_b, and a low power supply potential VSS is supplied to the other.

In the display device including the pixel circuit 501 in FIG. 17(C), the pixel circuits 501 in each row are sequentially selected by, for example, the gate driver 504*a* illustrated in FIG. 17(A), whereby the transistors 552 are turned on and data of a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal, and the light-emitting element 572 emits light with a luminance corresponding to the amount of flowing current. This operation is sequentially performed row by row; thus, an image can be displayed.

At least part of this embodiment can be implemented in combination with the other embodiments described in this specification as appropriate.

Embodiment 4

In this embodiment, electronic devices of one embodiment of the present invention will be described with reference to drawings.

Electronic devices exemplified below include a display device of one embodiment of the present invention in a display portion. Thus, the electronic devices achieve high resolution. In addition, the electronic devices can achieve both high resolution and a large screen.

The display portion of the electronic device of one embodiment of the present invention can display a video with a resolution of, for example, full high definition, 4K2K, 8K4K, 16K8K, or more. In addition, as a screen size of the display portion, the diagonal can be greater than or equal to 20 inches, greater than or equal to 30 inches, greater than or equal to 50 inches, greater than or equal to 60 inches, or greater than or equal to 70 inches.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device or the lighting device of one embodiment of the present invention can be incorporated along a curved inside/outside wall surface of a house or a building or a curved interior/exterior surface of a car.

The electronic device of one embodiment of the present invention may include an antenna. When a signal is received by the antenna, the electronic device can display a video, data, or the like on a display portion. In addition, when the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, it can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 19A:
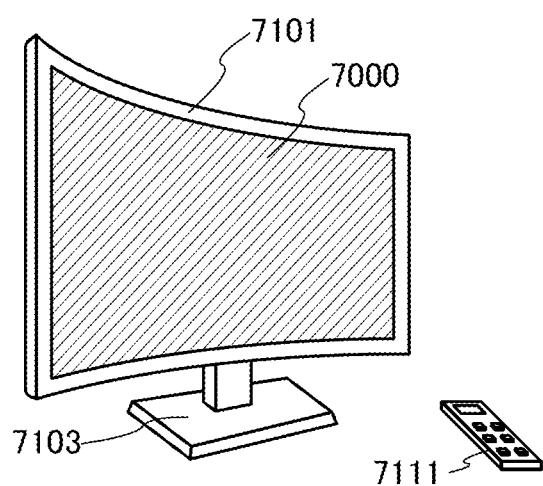
FIGS. 19A-19D Structural examples of electronic devices.

FIG. 19(A) illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used for the display portion 7000.

Operation of the television device 7100 illustrated in FIG. 19(A) can be performed with an operation switch provided in the housing 7101 or a separate remote controller 7111.

Alternatively, the display portion 7000 may include a touch sensor, and the television device 7100 can be operated by touch on the display portion 7000 with a finger or the like. The remote controller 7111 may be provided with a display portion for displaying data outputted from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. In addition, when connected to a communication network with or without wires via the modem, one-way (from a transmitter to a receiver) or two-way (between a transmitter and a receiver or between receivers) data communication can also be performed.

Figure 19B:
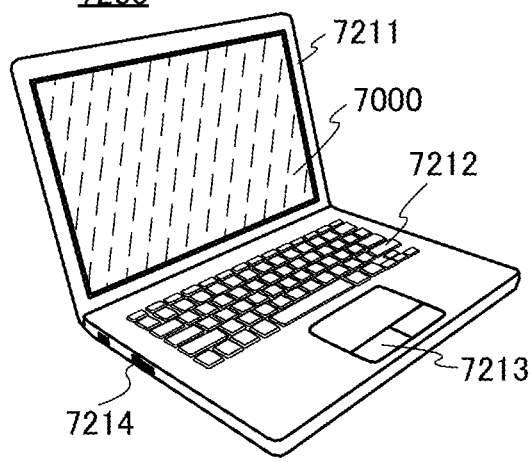

FIG. 19(B) illustrates a laptop personal computer 7200. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 19C:
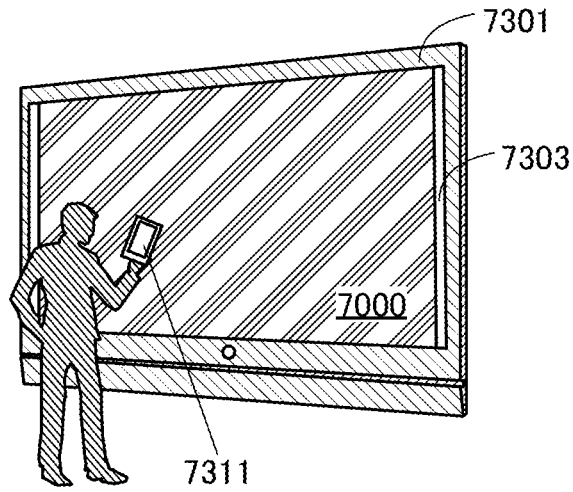

FIGS. 19(C) and (D) illustrate examples of digital signage.

Digital signage 7300 illustrated in FIG. 19(C) includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

Figure 19D:
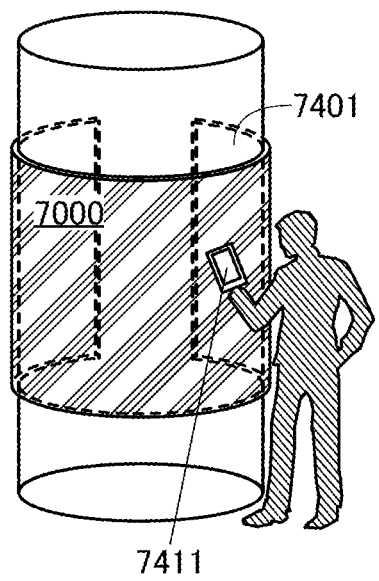

In addition, FIG. 19(D) is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIGS. 19(C) and (D).

A larger area of the display portion 7000 can increase the amount of data that can be provided at a time. In addition, the larger display portion 7000 attracts more attention, so that the effectiveness of the advertisement can be increased, for example.

It is preferable to use a touch panel for the display portion 7000 because not only a still image or a moving image is displayed in the display portion 7000 but also users can operate intuitively. Moreover, for an application for providing information such as route information or traffic information, usability can be enhanced by intuitive operation.

Furthermore, as illustrated in FIGS. 19(C) and (D), it is preferable that the digital signage 7300 or the digital signage 7400 work with an information terminal 7311 or an information terminal 7411 such as a smartphone a user has through wireless communication. For example, information of an advertisement displayed on the display portion 7000 can be displayed on a screen of the information terminal 7311 or the information terminal 7411. Moreover, by operation of the information terminal 7311 or the information terminal 7411, a displayed image on the display portion 7000 can be switched.

Furthermore, it is possible to make the digital signage 7300 or the digital signage 7400 execute a game with the use of the screen of the information terminal 7311 or the information terminal 7411 as an operation means (controller). Thus, an unspecified number of people can join in and enjoy the game concurrently.

At least part of this embodiment can be implemented in combination with the other embodiments described in this specification as appropriate.

Embodiment 5

In this embodiment, an example of a television device for which a display device of one embodiment of the present invention is used will be described with reference to drawings.

Figure 20A:
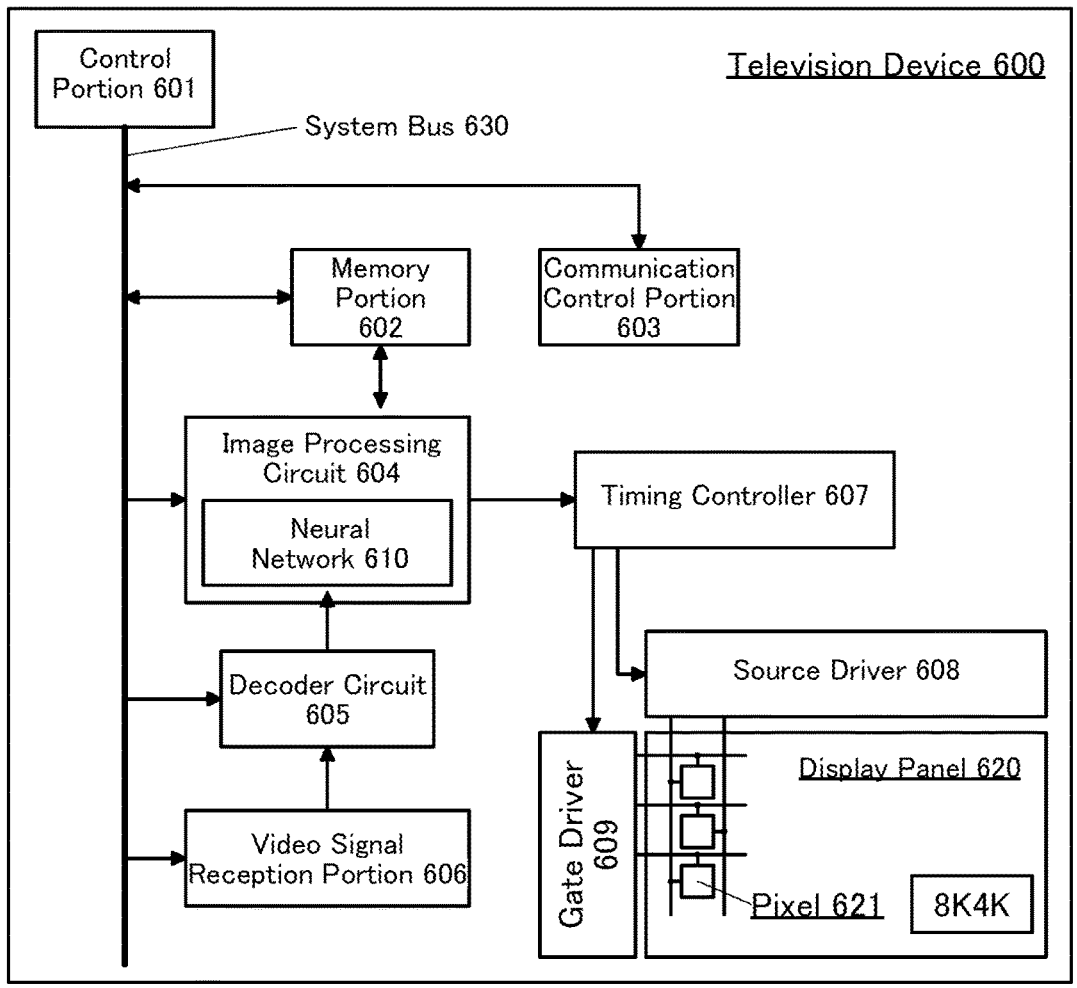
FIGS. 20A and 20B Structure examples of a television device.

FIG. 20(A) is a block diagram of a television device 600.

Note that in the drawings attached to this specification, the block diagram in which components are classified according to their functions and shown as independent blocks is illustrated; however, it is difficult to separate completely actual components according to their functions, and it is possible for one component to relate to a plurality of functions.

The television device 600 includes a control portion 601, a memory portion 602, a communication control portion 603, an image processing circuit 604, a decoder circuit 605, a video signal reception portion 606, a timing controller 607, a source driver 608, a gate driver 609, a display panel 620, and the like.

The display device exemplified in the above embodiment can be used for the display panel 620 in FIG. 20(A). Thus, the television device 600 with a large size, high definition, and high visibility can be obtained.

The control portion 601 can function as, for example, a central processing unit (CPU). For example, the control portion 601 has a function of controlling components such as the memory portion 602, the communication control portion 603, the image processing circuit 604, the decoder circuit 605, and the video signal reception portion 606 via a system bus 630.

Signals are transmitted between the control portion 601 and the components via the system bus 630. In addition, the control portion 601 has a function of processing signals inputted from the components which are connected via the system bus 630, a function of generating signals to be outputted to the components, and the like, so that the components connected to the system bus 630 can be controlled comprehensively.

The memory portion 602 functions as a register, a cache memory, a main memory, a secondary memory, or the like that can be accessed by the control portion 601 and the image processing circuit 604.

As a memory device that can be used as a secondary memory, a memory device that uses a rewritable nonvolatile memory element can be used, for example. For example, a flash memory, an MRAM (Magnetoresistive Random Access Memory), a PRAM (Phase change RAM), a ReRAM (Resistive RAM), and an FeRAM (Ferroelectric RAM) can be used.

In addition, as a memory device that can be used as a temporary memory such as a register, a cache memory, or a main memory, a volatile memory element such as a DRAM (Dynamic RAM) or an SRAM (Static Random Access Memory) may be used.

For example, as a RAM provided in the main memory, a DRAM is used, for example, in which case a memory space as a workspace for the control portion 601 is virtually allocated and used. An operating system, an application program, a program module, program data, and the like which are stored in the memory portion 602 are loaded into the RAM for execution. The data, program, and program module which are loaded into the RAM are directly accessed and operated by the control portion 601.

In the ROM, a BIOS (Basic Input/Output System), firmware, and the like for which rewriting is not needed can be stored. As the ROM, a mask ROM, an OTPROM (One Time Programmable Read Only Memory), an EPROM (Erasable Programmable Read Only Memory), or the like can be used. Examples of an EPROM include an UV-EPROM (Ultra-Violet Erasable Programmable Read Only Memory) which can erase stored data by irradiation with ultraviolet rays, an EEPROM (Electrically Erasable Programmable Read Only Memory), and a flash memory.

Moreover, a structure in which, besides the memory portion 602, a detachable memory device can be connected may be employed. For example, it is preferable to include a terminal connected to a storage media drive functioning as a storage device such as a hard disk drive (HDD) or a solid state drive (SSD) or a storage medium such as a flash memory, a Blu-ray Disc, or a DVD. Accordingly, a video can be stored.

The communication control portion 603 has a function of controlling communication performed via a computer network. For example, the communication control portion 603 controls a control signal for connection to a computer network in response to instructions from the control portion 601 and transmits the signal to the computer network. Accordingly, communication can be performed by connection with a computer network such as the Internet, which is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network).

Furthermore, the communication control portion 603 may have a function of communicating with a computer network or another electronic device with a communication standard such as Wi-Fi (registered trademark), Bluetooth (registered trademark), or ZigBee (registered trademark).

The communication control portion 603 may have a function of wireless communication. For example, an antenna and a high frequency circuit (an RF circuit) are provided to receive and transmit an RF signal. The high frequency circuit performs conversion between an electromagnetic signal and an electric signal in a frequency band that is set by national laws and performs wireless communication with another communication device using the electromagnetic signal. As a practical frequency band, several tens of kilohertz to several tens of gigahertz are generally used. A structure can be employed in which the high frequency circuit connected to an antenna includes a high frequency circuit portion compatible with a plurality of frequency bands and the high frequency circuit portion includes an amplifier, a mixer, a filter, a DSP, an RF transceiver, or the like.

The video signal reception portion 606 includes, for example, an antenna, a demodulation circuit, an AD converter circuit (analog-digital conversion circuit), and the like. The demodulation circuit has a function of demodulating a signal inputted from the antenna. Moreover, the AD converter circuit has a function of converting the demodulated analog signal into a digital signal. The signal processed in the video signal reception portion 606 is transmitted to the decoder circuit 605.

The decoder circuit 605 has a function of decoding video data included in a digital signal inputted from the video signal reception portion 606, in accordance with the specifications of the broadcasting standard of the data to be transmitted, and a function of generating a signal transmitted to the image processing circuit. Examples of the broadcasting standard in 8K broadcasts include H.265|MPEG-H High Efficiency Video Coding (abbreviation: HEVC).

Examples of airwaves that can be received by the antenna included in the video signal reception portion 606 include a ground wave, and a radio wave transmitted from a satellite. In addition, examples of airwaves that can be received by the antenna include airwaves for analog broadcasting, digital broadcasting, video-audio-only broadcasting, and audio-only broadcasting. For example, the antenna can receive airwaves transmitted in a certain frequency band in a UHF band (about 300 MHz to 3 GHz) or a VHF band (30 MHz to 300 MHz). Furthermore, for example, a plurality of pieces of data received in a plurality of frequency bands is used, whereby the transfer rate can be increased and more information can be thus obtained. Accordingly, a video with a resolution exceeding the full high definition can be displayed in the display panel 620. A video with a resolution of, for example, 4K2K, 8K4K, 16K8K, or more can be displayed.

Alternatively, a structure may be employed in which the video signal reception portion 606 and the decoder circuit 605 generate a signal transmitted to the image processing circuit 604 using the broadcasting data received with data transmission technology through a computer network. At this time, in the case where the received signal is a digital signal, the video signal reception portion 606 does not necessarily include a demodulation circuit, an AD converter circuit, and the like.

The image processing circuit 604 has a function of generating a video signal outputted to the timing controller 607, on the basis of a video signal inputted from the decoder circuit 605.

In addition, the timing controller 607 has a function of generating a signal (a signal such as a clock signal or a start pulse signal) outputted to the gate driver 609 and the source driver 608 on the basis of a synchronization signal included in a video signal or the like on which the image processing circuit 604 performs processing. Moreover, the timing controller 607 has a function of generating a video signal outputted to the source driver 608, as well as the above signal.

The display panel 620 includes a plurality of pixels 621. Each pixel 621 is driven by a signal supplied from the gate driver 609 and the source driver 608. Here, an example of a display panel whose number of pixels is 7680×4320, with the resolution corresponding to the standard of 8K4K, is shown. Note that the resolution of the display panel 620 is not limited thereto, and the display panel 620 may have a resolution corresponding to the standard such as full high-definition (the number of pixels is 1920×1080) or 4K2K (the number of pixels is 3840×2160).

A structure in which, for example, a processor is included can be employed for the control portion 601 or the image processing circuit 604 illustrated in FIG. 20(A). For example, a processor functioning as a CPU can be used for the control portion 601. In addition, another processor such as a DSP (Digital Signal Processor) or a GPU (Graphics Processing Unit) can be used for the image processing circuit 604, for example. Furthermore, a structure in which the above processor is obtained with a PLD (Programmable Logic Device) such as an FPGA (Field Programmable Gate Array) or an FPAA (Field Programmable Analog Array) may be employed for the control portion 601 or the image processing circuit 604.

The processor interprets and executes instructions from various programs to process various kinds of data and control programs. The programs that might be executed by the processor may be stored in a memory region included in the processor or a memory device which is additionally provided.

Furthermore, two or more functions among the functions of the control portion 601, the memory portion 602, the communication control portion 603, the image processing circuit 604, the decoder circuit 605, the video signal reception portion 606, and the timing controller 607 may be aggregated in one IC chip to form a system LSI. For example, a system LSI including a processor, a decoder circuit, a tuner circuit, an AD converter circuit, a DRAM, an SRAM, and the like may be employed.

Note that a transistor that includes an oxide semiconductor in a channel formation region and that achieves an extremely low off-state current can be used in an IC or the like included in the control portion 601 or another component. Since the transistor has an extremely low off-state current, the transistor is used as a switch for holding electric charge (data) which flows into a capacitor functioning as a memory element, whereby a long data retention period can be ensured. Utilizing this characteristic for a register or a cache memory of the control portion 601 or the like enables normally-off computing where the control portion 601 operates only when needed and data on the previous processing is stored in the memory element in the other case. Thus, power consumption of television device 600 can be reduced.

Note that the structure of the television device 600 exemplified in FIG. 20(A) is just an example, and all of the components are not necessarily included. It is acceptable as long as the television device 600 includes at least necessary components among the components illustrated in FIG. 20(A). Furthermore, the television device 600 may include a component other than the components illustrated in FIG. 20(A).

For example, the television device 600 may include an external interface, an audio output portion, a touch panel unit, a sensor unit, a camera unit, or the like besides the configuration illustrated in FIG. 20(A). Examples of the external interfaces include an external connection terminal such as a USB (Universal Serial Bus) terminal, a LAN (Local Area Network) connection terminal, a power reception terminal, an audio output terminal, an audio input terminal, a video output terminal, and a video input terminal; a transceiver for optical communication using infrared rays, visible light, ultraviolet rays, or the like; a physical button provided on a housing; and the like. In addition, examples of the audio input/output portions include a sound controller, a microphone, and a speaker.

The image processing circuit 604 is described in detail below.

The image processing circuit 604 preferably has a function of executing image processing on the basis of a video signal inputted from the decoder circuit 605.

Examples of the image processing include noise removal processing, grayscale conversion processing, tone correction processing, and luminance correction processing. Examples of the tone correction processing or the luminance correction processing include gamma correction.

Furthermore, the image processing circuit 604 preferably has a function of executing processing such as pixel interpolation processing in accordance with up-conversion of the resolution or frame interpolation processing in accordance with up-conversion of the frame frequency.

As the noise removing processing, various noise such as mosquito noise which appears near outline of characters and the like, block noise which appears in high-speed moving images, random noise causing flicker, and dot noise caused by up-conversion of the resolution are removed, for example.

The grayscale conversion processing converts the grayscale of an image to a grayscale corresponding to output characteristics of the display panel 620. For example, in the case where the number of grayscale levels is increased, gradation values of pixels are interpolated to an input image with a small number of gray levels and assigned to the pixels, so that processing for smoothing a histogram can be executed. In addition, a high-dynamic range (HDR) processing for increasing the dynamic range is also included in the grayscale conversion processing.

In addition, the pixel interpolation processing interpolates data which does not actually exist when resolution is up-converted. For example, with reference to pixels around the target pixel, data is interpolated to display intermediate color therebetween.

In addition, the tone correction processing corrects the tone of an image. The luminance correction processing corrects the brightness (luminance contrast) of an image. For example, a type, luminance, color purity, and the like of a lighting in a space where the television device 600 is provided are detected, and luminance and tone of images displayed on the display panel 620 are corrected to be optimal in accordance with the detection. Alternatively, a function of comparing a displayed image to images of various scenes in an image list stored in advance, and then correcting luminance and tone of the displayed image to be suitable to the images of the closest scene of the image can be included.

In the case where the frame frequency of the displayed video is increased, the frame interpolation processing generates an image for a frame that does not exist actually (an interpolation frame). For example, an image for an interpolation frame which is interposed between certain two images is generated from a difference between the two images. Alternatively, images for a plurality of interpolation frames can be generated between the two images. For example, when the frame frequency of a video signal inputted from the decoder circuit 605 is 60 Hz, a plurality of interpolation frames are generated, and the frame frequency of a video signal outputted to the timing controller 607 can be increased twofold to 120 Hz, fourfold to 240 Hz, or eightfold to 480 Hz, for example.

Furthermore, the image processing circuit 604 preferably has a function of executing image processing utilizing a neural network. In FIG. 20(A), an example in which the image processing circuit 604 includes a neural network 610 is illustrated.

For example, with the neural network 610, features can be extracted from image data included in a video, for example. In addition, the image processing circuit 604 can select an optimal correction method in accordance with the extracted feature or select a parameter used for the correction.

Alternatively, the neural network 610 itself may have a function of performing image processing. In other words, a structure may be employed in which image data not subjected to image processing is inputted to the neural network 610 so that image data subjected to image processing is outputted.

Furthermore, data of a weight coefficient used for the neural network 610 is stored in the memory portion 602 as a data table. The data table including the weight coefficient can be updated by the communication control portion 603 through the computer network, for example. Alternatively, a structure in which the image processing circuit 604 has a learning function and enable the update of the data table including the weight coefficient may be employed.

Figure 20B:
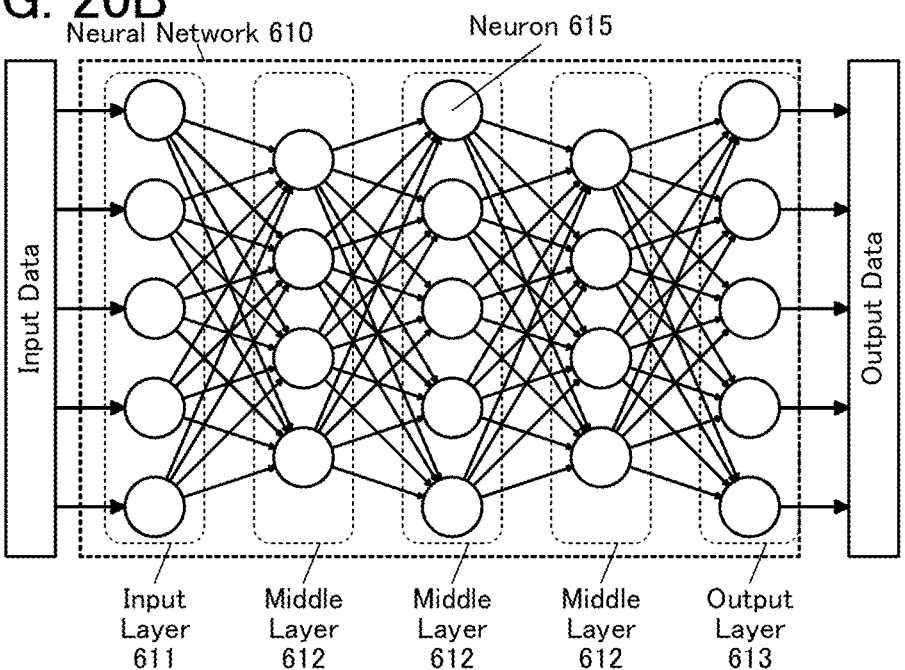

In FIG. 20(B), a schematic view of the neural network 610 included in the image processing circuit 604 is illustrated.

Note that in this specification and the like, the neural network indicates a general model having the capability of solving problems, which is modeled on a biological neural network and determines the connection strength of neurons by the learning. The neural network includes an input layer, a middle layer (also referred to as hidden layer), and an output layer. Among neural networks, a neural network having two or more middle layers is referred to as deep neural network (DNN), and the learning using a deep neural network is referred to as "deep learning".

In addition, in the description of the neural network in this specification and the like, to determine a connection strength of neurons (also referred to as weight coefficient) from the existing data is referred to as "learning" in some cases. Moreover, in this specification and the like, to draw a new conclusion from the neural network formed using the connection strength obtained by the learning is referred to as "inference" in some cases.

The neural network 610 includes an input layer 611, one or more middle layers 612, and an output layer 613. Input data is inputted to the input layer 611. Output data is outputted from the output layer 613.

Each of the input layer 611, the middle layer 612, and the output layer 613 includes neurons 615. The neuron 615 indicates here a circuit element that might execute product-sum operation (product-sum operation element). In FIG. 20(B), directions of inputting/outputting data between two neurons 615 in two layers are denoted by arrows.

The arithmetic processing in each layer is executed by the product-sum operation of an output of the neuron 615 in the previous layer and a weight coefficient. For example, when the output from an i-th neuron in the input layer 611 is denoted by $x_i$, and the connection strength (weight coefficient) between the output $x_i$, and a j-th neuron in the next middle layer 612 is denoted by $w_{ji}$, the output from the j-th neuron in the middle layer can be denoted by $y_j = f(\Sigma w_{ji} \cdot x_i)$. Note that i and j are each an integer greater than or equal to 1. Here, f(x) represents an activation function, and a sigmoid function, a threshold function, or the like can be used therefor. In this manner, the output of the neuron 615 in each layer is a value obtained from the activation function with respect to the result of product-sum operation of the output from the neuron 615 in the previous layer and the weight coefficient. Furthermore, the connection between layers may be a full connection where all of the neurons are connected or a partial connection where some of the neurons are connected.

In FIG. 20(B), an example including three middle layers 612 is illustrated. Note that the number of the middle layers 612 is not limited thereto and it is acceptable as long as one or more middle layers are included. In addition, the number of neurons included in one middle layer 612 may be changed as appropriate depending on the specifications. For example, the number of the neurons 615 included in one middle layer 612 may be larger or smaller than the number of the neurons 615 included in the input layer 611 or the output layer 613.

The weight coefficient serving as an indicator of the connection strength between the neurons 615 is determined by learning. Although the learning may be executed by the processor included in the television device 600, it is preferable to execute with a calculator having high arithmetic processing properties, such as a dedicated server or a cloud. The weight coefficient determined by the learning is stored in the memory portion 602 as the data table and used by being read out by the image processing circuit 604. Furthermore, the table can be updated as needed through the computer network.

The above is the description of the neural network.

At least part of this embodiment can be implemented in combination with the other embodiments described in this specification as appropriate.

Example 1

In this example, a stacked-layer structure of a metal oxide film and an oxide insulating film was subjected to plasma treatment under different conditions to examine the released amount of oxygen from the oxide insulating film and the resistance of the metal oxide film.

[Sample Fabrication]

First, a sample fabricated in this example will be described. In this example, two kinds of samples (Sample A1 and Sample A2) which are different in conditions of plasma treatment were fabricated.

First, as a metal oxide film, two layers of IGZO films were deposited in an atmosphere containing oxygen. The deposition of the metal oxide films was performed by a sputtering method using an In—Ga—Zn oxide target (In:Ga:Zn=4:2:4.1 [atomic ratio]) under the conditions of a substrate temperature of 130° C., a pressure of 0.6 Pa, and a power supply of 2.5 kW. Here, after an approximately 10-nm-thick IGZO film was deposited under the condition where the oxygen flow rate ratio was 10%, an approximately 25-nm-thick IGZO film % was deposited under the condition where the oxygen flow rate ratio was 100%.

Subsequently, after heat treatment was performed at 350° C. in a nitrogen gas atmosphere for one hour, another heat treatment was performed at 350° C. in a mixed gas atmosphere of a nitrogen gas and an oxygen gas for one hour.

Subsequently, as an oxide insulating film, an approximately 50-nm-thick silicon oxynitride film was deposited by a plasma CVD method. The substrate temperature at the deposition of the silicon oxynitride film was set to 350° C.

Next, plasma treatment was performed in an atmosphere containing an oxygen gas (also referred to as oxygen plasma treatment). Plasma treatment was performed on Sample A1 under the conditions of a temperature of 350° C., a pressure of 40 Pa, a power supply of 3000 W, an oxygen flow rate ratio of 100%, and a treatment time of 600 seconds. Plasma treatment was performed on Sample A2 under the conditions of a temperature of 220° C., a pressure of 40 Pa, a power supply of 3000 W, an oxygen flow rate ratio of 100%, and a treatment time of 600 seconds. On Sample A1, plasma treatment was successively performed in vacuum after the silicon oxynitride film was deposited.

[Analysis]

Figure 21:
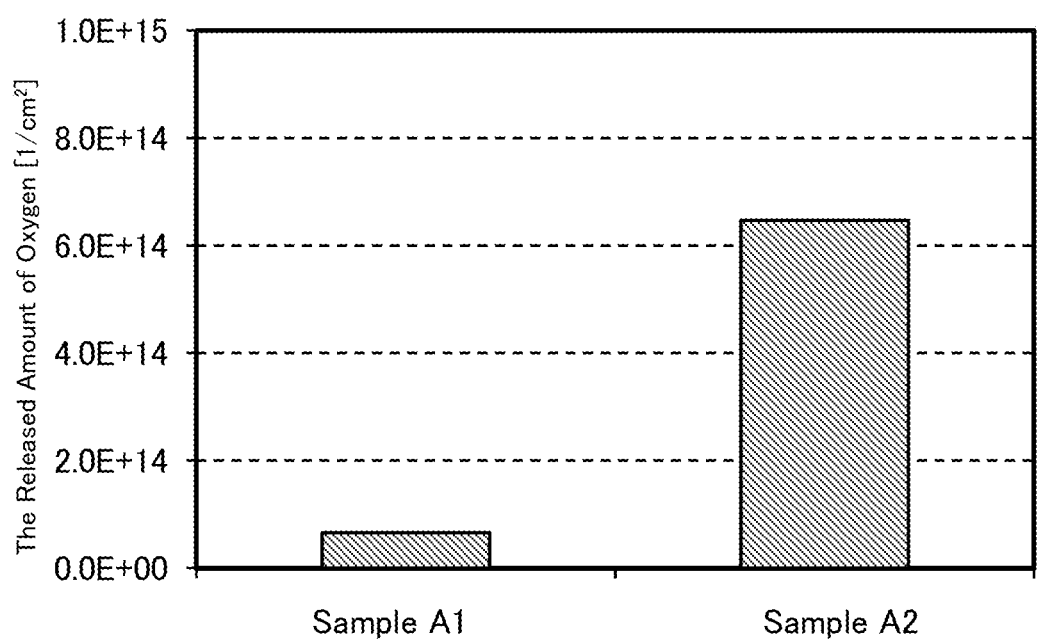
FIG. 21 TDS analysis results of Example 1.

Then, TDS (thermal desorption spectroscopy) analysis was performed on each of the fabricated samples. FIG. 21 shows the released amount of oxygen in each sample.

As compared with Sample A1 which was subjected to oxygen plasma treatment at the temperature of 350° C., in Sample A2 which was subjected to plasma treatment at the temperature of 220° C., a larger released amount of oxygen from the silicon oxynitride film was observed and it was found that the amount of oxygen supplied to the silicon oxynitride film was larger. It is considered that, when the temperature of the oxygen plasma treatment is low, oxygen is less likely to be released from the silicon oxynitride film during the oxygen plasma treatment and oxygen (excess oxygen) is likely to remain in the silicon oxynitride film.

Figure 22:
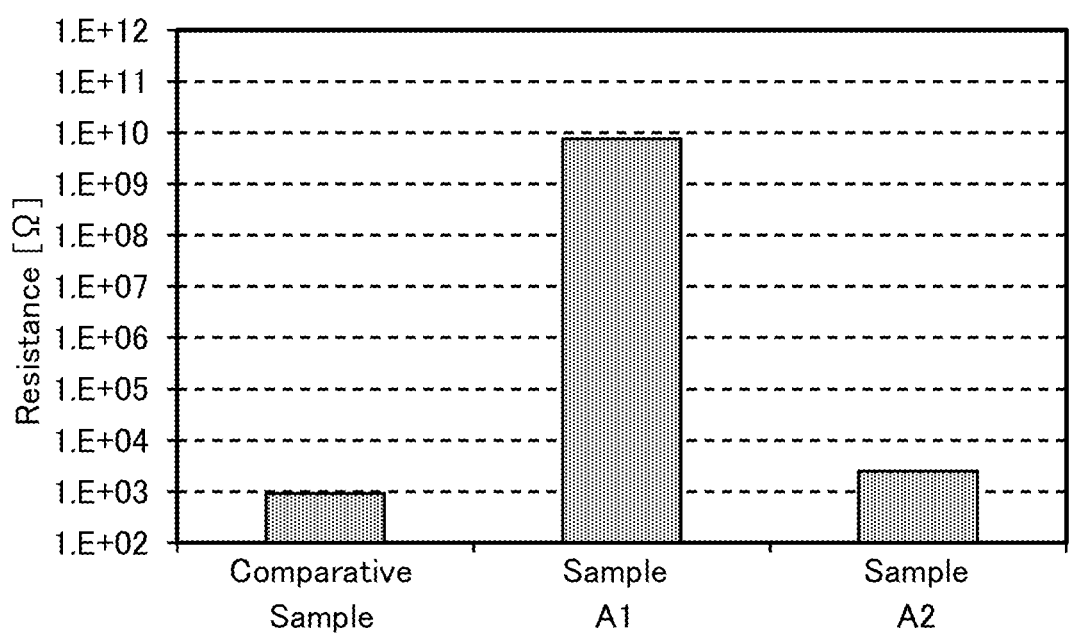
FIG. 22 Results of resistance measurement of Example 1.

Furthermore, the resistance of the metal oxide film in each of the fabricated samples was measured. In the samples used for measurement, the substrate was cut out into 1 cm squares and then the insulating film positioned at the corner portions is removed to expose the metal oxide film, where a titanium film was deposited to serve as electrodes. FIG. 22 shows the resistance of the metal oxide film in each sample. In FIG. 22, resistance of a metal oxide film in a sample not subjected to oxygen plasma treatment is shown as a comparative sample.

In Sample A1 in which the temperature of the oxygen plasma treatment was 350° C., the resistance of the metal oxide film was increased (made to be i-type). On the other hand, in Sample A2 in which the temperature of the oxygen plasma treatment was 220° C., the resistance of the metal oxide film was not increased as compared with Sample A1 regardless of an increase in oxygen in the silicon oxynitride film. Accordingly, it was found that, in Sample A1, the amount of oxygen supplied to the metal oxide film by the oxygen plasma treatment was larger than that in Sample A2.

It was found from the results of this example that, as the temperature of the oxygen plasma treatment, 220° C. was preferred to 350° C. to supply oxygen to the oxide insulating film. Furthermore, it was found that, as the temperature of the oxygen plasma treatment, 350° C. was preferred to 220° C. to supply oxygen to the metal oxide film. Therefore, it was indicated that oxygen can be supplied to both the oxide insulating film and the metal oxide film by using plasma treatment under two kinds of temperature conditions in combination.

Example 2

In this example, transistors of one embodiment of the present invention were fabricated and the electrical characteristics thereof were evaluated.

[Sample Fabrication]

A fabricated sample will be described. First, an approximately 100-nm-thick tungsten film was deposited over a glass substrate by a sputtering method and processed to obtain a gate electrode. Subsequently, as a gate insulating layer, an approximately 400-nm-thick silicon nitride film was formed by a plasma CVD method. The substrate temperature at the deposition of the gate insulating layer was set to 350° C. Plasma treatment was successively performed in vacuum in an atmosphere containing an oxygen gas after the gate insulating layer was deposited. The plasma treatment was performed under the conditions of a temperature of 350° C., a pressure of 40 Pa, a power supply of 3000 W, an oxygen flow rate ratio of 100%, and a treatment time of 300 seconds. Subsequently, heat treatment was performed at 350° C. for 5 minutes.

Then, two layers of metal oxide films were deposited over the gate insulating layer in an atmosphere containing oxygen, and the stacked metal oxide films were processed to obtain a semiconductor layer. The deposition of the metal oxide films was performed by a sputtering method using an In—Ga—Zn oxide target (In:Ga:Zn=4:2:4.1 [atomic ratio]) under the conditions of a substrate temperature of 130° C., a pressure of 0.6 Pa, and a power supply of 2.5 kW. Here, after an approximately 10-nm-thick metal oxide film was deposited under the condition where the oxygen flow rate ratio was 10%, an approximately 25-nm-thick metal oxide film was deposited under the condition where the oxygen flow rate ratio was 100%.

Subsequently, after heat treatment was performed at 350° C. in a nitrogen atmosphere for one hour, another heat treatment was performed at 350° C. in a mixed gas atmosphere of nitrogen and oxygen for one hour.

Then, a tungsten film, an aluminum film, and a titanium film were deposited in this order by a sputtering method and processed to obtain a source electrode and a drain electrode. Here, an approximately 50-nm-thick tungsten film, an approximately 400-nm-thick aluminum film, and an approximately 100-nm-thick titanium film were formed in this order.

Next, the surface of the exposed semiconductor layer (on the back channel side) was cleaned using phosphoric acid.

Subsequently, plasma treatment was performed in an atmosphere containing an oxygen gas. The conditions of the plasma treatment were a temperature of 350° C., a pressure of 40 Pa, a power supply of 3000 W, an oxygen flow rate ratio of 100%, and a treatment time of 300 seconds.

Next, an approximately 50-nm-thick silicon oxynitride film was formed by a plasma CVD method as a first protective insulating layer over the gate insulating layer, the semiconductor layer, the source electrode, and the drain electrode. The substrate temperature at the deposition of the first protective insulating layer was set to 350° C. Subsequently, plasma treatment was performed twice in an atmosphere containing an oxygen gas. The first plasma treatment was successively performed in vacuum after the deposition of the silicon oxynitride film, and the conditions were a temperature of 350° C., a pressure of 40 Pa, a power supply of 3000 W, an oxygen flow rate ratio of 100%, and a treatment time of 600 seconds. The second plasma treatment was performed under the conditions of a temperature of 220° C., a pressure of 40 Pa, a power supply of 3000 W, an oxygen flow rate ratio of 100%, and a treatment time of 600 seconds. Then, as a second protective insulating layer, an approximately 100-nm-thick silicon nitride film was formed over the first protective insulating layer by a plasma CVD method. The substrate temperature at the deposition of the second protective insulating layer was set to 350° C.

Then, an approximately 1.5-μm-thick acrylic resin film was deposited over the second protective insulating layer and processed to obtain a planarization film. The acrylic resin film was formed by baking an acrylic photosensitive resin at 250° C. in a nitrogen atmosphere for one hour. Subsequently, an approximately 100-nm-thick oxide conductive film was deposited over the planarization film and processed to obtain a conductive layer. The oxide conductive film was formed by a sputtering method using an indium tin oxide target containing silicon. Then, heat treatment was performed at 250° C. in a nitrogen atmosphere for one hour.

<Electrical Characteristics of Transistor>

Next, Id-Vg characteristics of transistors of the fabricated samples were measured. As measurement conditions of the Id-Vg characteristics of the transistors, the gate voltage (Vg) was applied from −15 V to +20 V in increments of 0.25 V. In addition, the source voltage (Vs) was set to 0 V, and the drain voltage (Vd) was set to 0.1 V and 20 V. The number of measurements was 10 for each sample.

Figure 23A:
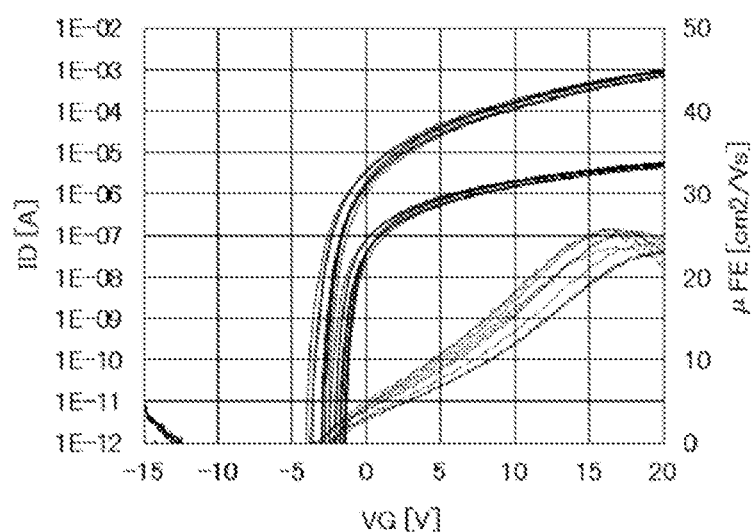
Figure 23B:
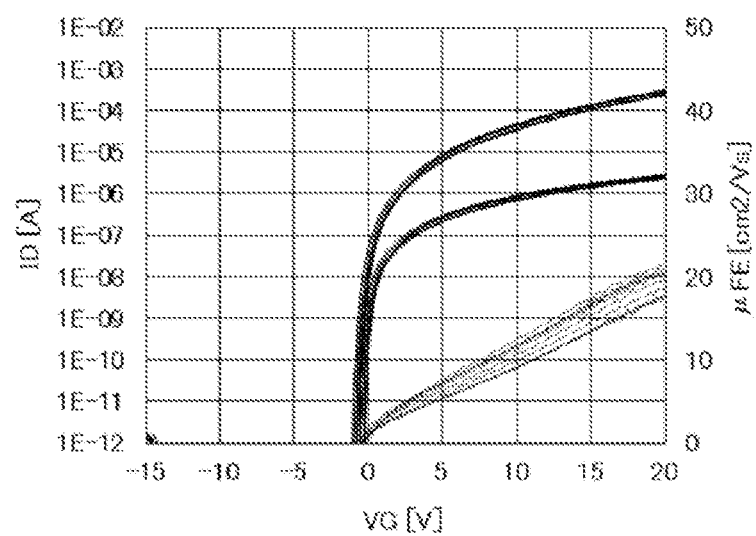

FIGS. 23(A) and (B) show the electrical characteristics of the transistors of each sample. FIG. 23(A) shows results of transistors with a channel length L of 3 μm and a channel width W of 50 μm, and FIG. 23(B) shows results of transistors with a channel length L of 6 μm and a channel width W of 50 μm.

As shown in FIGS. 23(A) and (B), it was observed that favorable electrical characteristics were obtained under both of the conditions.

In addition, a gate bias-temperature stress test (GBT test) was performed on another sample fabricated under conditions similar to the above-described fabrication conditions. Here, as the GBT test, a substrate over which the transistor was formed was held at 60° C., a voltage of 0 V was applied to a source and a drain of the transistor, and a voltage of 30 V or −30 V was applied to a gate; this state was held for one hour. Here, a test in which a positive voltage is applied to the gate and the test environment is dark is referred to as positive GBT or PBTS, and a test in which a negative voltage is applied to the gate and the test environment is dark is referred to as negative GBT or NBTS. In addition, a positive GBT in a state where a sample is irradiated with light is referred to as PBITS, and a negative GBT in the state is referred to as NBITS. For the light irradiation, white LED light with approximately 10000 1x was used.

Figure 24:
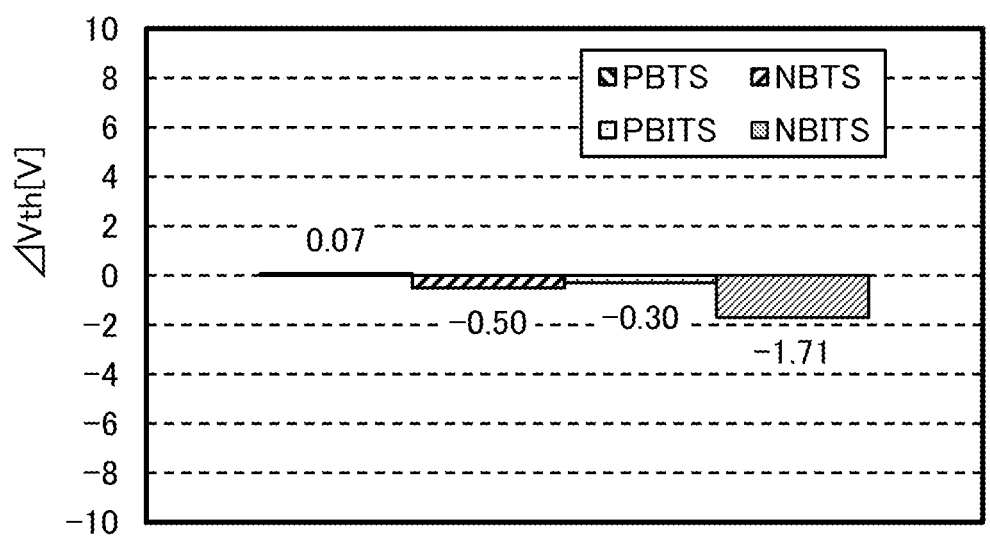
FIG. 24 GBT test results of transistors of Example 2.

FIG. 24 shows the GBT test results of the transistors having a channel length of 3 μm and a channel width of 50 μm. The vertical axis represents the amount of change in the threshold voltage (Vth). It was observed that, in the samples of this example, the change in the threshold voltage of the transistors is extremely small in any test.

From the results in this example, oxygen was supplied to the metal oxide film by the oxygen plasma treatment at 350° C. and oxygen is supplied to the oxide insulating film by the oxygen plasma treatment at 220° C., so that a transistor with favorable electrical characteristics was able to be fabricated. As described above, the transistor with favorable electrical characteristics was able to be fabricated by using the plasma treatment under two kinds of temperature conditions in combination.

Example 3

In this example, results of rough estimation of data writing time of an 8K4K liquid crystal display module including a pixel area with a diagonal of 65 inches will be described.

Note that the resolution of the 8K4K display is significantly high: the horizontal resolution is 7680 and the vertical resolution is 4320. ITU-R BT.2020 is an international standard for 8K4K displays. In this standard, the driving method is a progressive method and the maximum frame frequency is 120 Hz.

In this example, in addition to a configuration in which a selection signal was supplied to each gate line and pixels in a column direction were selected one by one, a configuration in which a selection signal was supplied to two gate lines at a time and two pixels that adjoin in the column direction were selected at a time was considered. The two pixels that were selected at a time are connected to different source lines. That is, two source lines were arranged for each column. In this example, rough estimation of data writing time was performed with the use of a layout of pixels with such a configuration.

In addition, in this example, the case of using amorphous silicon for a semiconductor layer of a transistor and the case of using a metal oxide for a semiconductor layer of a transistor were examined.

In the case of using amorphous silicon for the semiconductor layer, the data writing time was estimated with the use of a pseudo parameter obtained by changing field-effect mobility that is a design parameter from an actually measured value of a transistor fabricated using microcrystalline silicon.

As to the semiconductor layer using a metal oxide, the following two types of structures were considered. As the metal oxide, an In—Ga—Zn oxide was used. A first type was the case where a single layer of a metal oxide with an atomic ratio of In to Ga and Zn being In:Ga:Zn=1:1:1 was used as a semiconductor layer. A second type was the case where a stacked-layer structure of a metal oxide with an atomic ratio of In to Ga and Zn being In:Ga:Zn=4:2:3 was used as a semiconductor layer. Specifically, the case where a CAC-OS (Cloud-Aligned Composite oxide semiconductor) film was used for a first metal oxide layer and a CAAC-OS (c-axis-aligned crystalline oxide semiconductor) film was used for a second metal oxide layer was assumed.

Table 1 shows parameters of each layer used in this example. These were parameters assuming a transistor in which a metal oxide was used for a semiconductor layer; however, in this example, the same parameters were used in the case where amorphous silicon was used for a semiconductor layer.

TABLE 1

|  | Material | Thickness | Sheet resistance | Relative dielectric constant |
|---|---|---|---|---|
| Counter electrode | ITSO | 100 nm | 100 Ω/square | — |
| Liquid crystal layer | Liquid crystal material | 3200 nm | 0.011 fF/μm² | 4 |
| Pixel electrode | ITSO | 100 nm | 100 Ω/square | — |
| Planarization film | acrylic | 3000 nm | 0.012 fF/μm² | 4 |
| Passivation film 2 | SiN | 100 nm | 0.620 fF/μm² | 7 |
| Passivation film 1 | SiON\SiON | 430 nm | 0.082 fF/μm² | 4 |
| SD wiring* | Cu | 600 nm*** | 0.050 Ω/square | — |
| Semiconductor layer | IGZO or a-Si | 40 nm | — | — |
| Gate insulating layer** | SiON | 280 nm | 0.127 fF/μm² | 4 |
| Gate wiring* | Cu | 600 nm*** | 0.050 Ω/square | — |
| Substrate | glass | — | — | — |

*The equivalent value based on sheet resistance 0.1 Ω/square of TaN_10 nm\Cu_300 nm
**The equivalent value of an SiON single layer based on SiN_400 nm\SiON_50 nm
***Estimated at 700 nm in the case of using IGZO for the semiconductor layer and selecting two pixels at a time <Case where Pixels are Selected One by One>

Figure 25A:
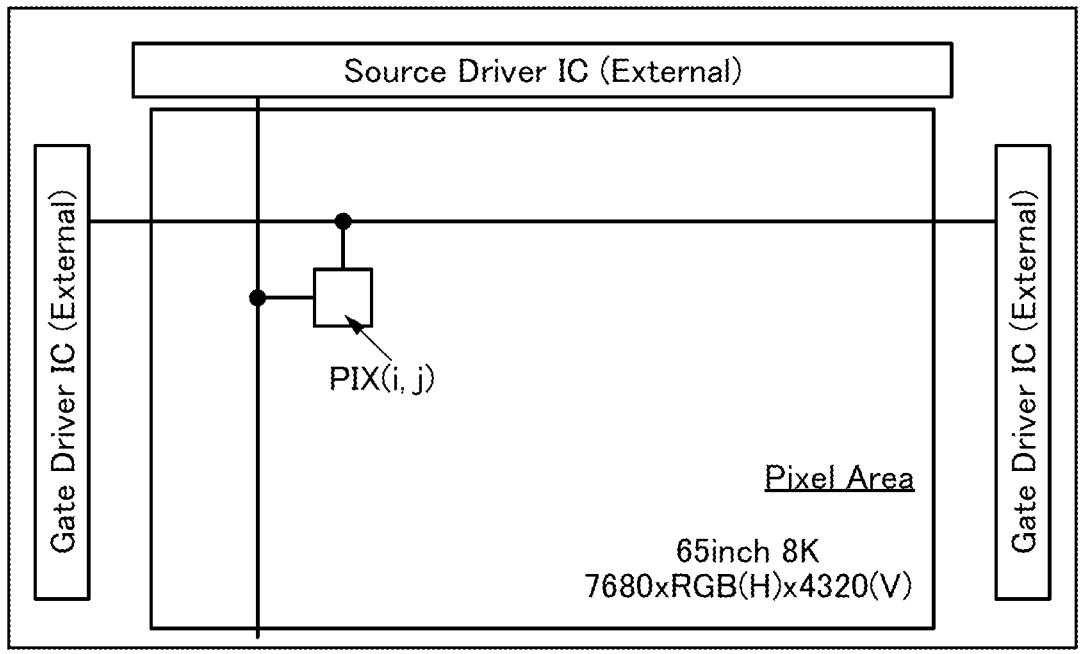

FIG. 25(A) is a block diagram showing a configuration of a display module used in this example. In this configuration, a selection signal is supplied to each gate line and pixels are selected one by one. A gate driver and a source driver are both external circuits. A gate line is supplied with the same signal from two gate driver ICs (Gate Driver IC (External)). A source line is supplied with a signal from one source driver IC (Source Driver IC (External)). A pixel area is not divided. The pixel area has a diagonal of 65 inches, and the number of effective pixels is 7680×RGB (H)×4320 (V).

Figure 25B:
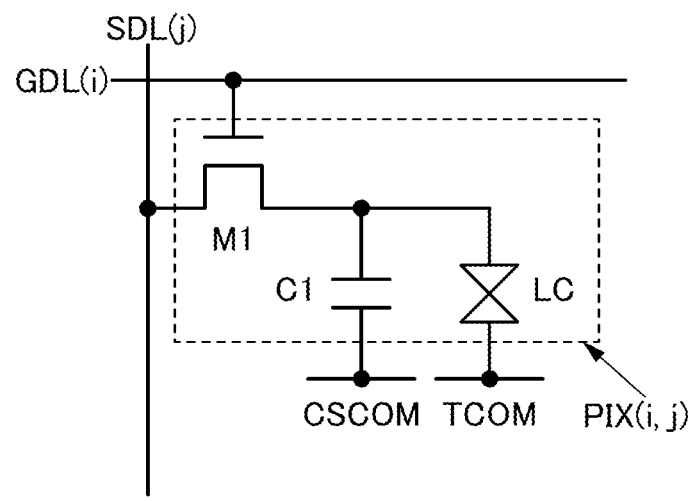

FIG. 25(B) is a circuit diagram of a pixel PIX(i, j). The pixel PIX(i, j) includes a transistor M1, a capacitor C1, and a liquid crystal element LC. A gate of the transistor M1 is connected to a gate line GDL(i). One of a source and a drain of the transistor M1 is connected to a source line SDL(j), and the other is connected to one electrode of the capacitor C1 and one electrode of the liquid crystal element LC. The other electrode of the capacitor C1 is connected to a wiring CSCOM. The other electrode of the liquid crystal element LC is connected to a wiring TCOM.

Figure 26A:
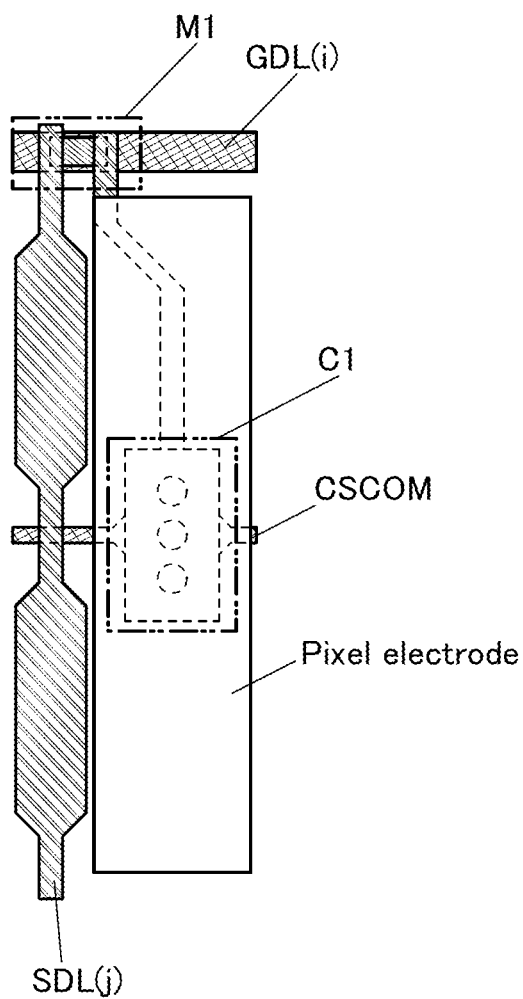
Figure 26B:
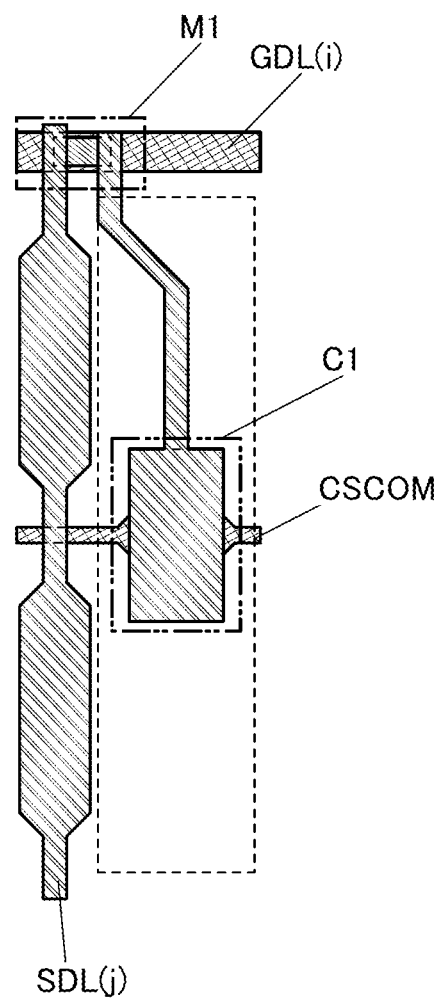

A pixel layout of a display module in the case where pixels are selected one by one is illustrated in FIGS. 26(A) and (B). FIG. 26(A) is a top view in which a stacked-layer structure including components from the gate line GDL(i) to the pixel electrode is seen from the pixel electrode side. FIG. 26(B) is a top view excepting the pixel electrode in FIG. 26(A).

The pixel size is 62.5 μm x 187.5 μm. The transistor M1 is a channel-etched transistor with a bottom-gate top-contact structure. The transistor M1 has a channel length L of 4 μm, a channel width W of 8 μm, and a region where the source or the drain overlaps with the gate (hereinafter referred to as an overlap region $L_{ov}$) of 2 μm. The gate line GDL(i) has a width of 10 μm, and the wiring CSCOM has a width of 3.5 μm. The source line SDL(j) has a width of 10 μm, but has a width of 4 μm at a portion crossing another wiring (the gate line GDL(i) or the wiring CSCOM). The aperture ratio is 45.6%.

First, rough estimation of data writing time in the case where a metal oxide is used for a semiconductor layer will be described with reference to FIG. 27.

A period for charging a gate line of a pixel and a period for charging a source line and a pixel were roughly estimated in such a manner that the parasitic resistance and the parasitic capacitance were extracted from the pixel layout in FIG. 26(A) and only a parameter of the field-effect mobility of the transistor was changed. In this example, the data writing time corresponds to the sum of the period for charging a gate line and the period for charging a source line and a pixel. Moreover, in this example, the period for charging a gate line is a time until the potential of the gate line reaches 75% of the maximum input voltage, and the period for charging a source line and a pixel is a time until the potential of the source line reaches 99% of the maximum input voltage.

In addition, here, a normalized value (normalized mobility) was used assuming that the field-effect mobility in the case where a stacked-layer structure of a metal oxide with an atomic ratio of In to Ga and Zn being In:Ga:Zn=4:2:3 was used for a semiconductor layer was 1. The transistor size was not changed. The load of the whole pixel area is described below. A parasitic resistance Rgl of the gate line is 3.60 kΩ, a parasitic capacitance Cgl of the gate line is 255 pF, a parasitic resistance Rsl of the source line is 5.80 kΩ, a parasitic capacitance Csl of the source line is 147 pF, and a parasitic capacitance Cpix of the pixel is 216.6 fF. Note that in this example, the parasitic capacitance Cpix of the pixel includes storage capacitance of a capacitor, capacitance of a liquid crystal element, and parasitic capacitance of a node A. Note that in this example, the node A is a node at which a source or a drain of a transistor, one electrode of a capacitor, and one electrode of a liquid crystal element are connected in each pixel.

Figure 27:
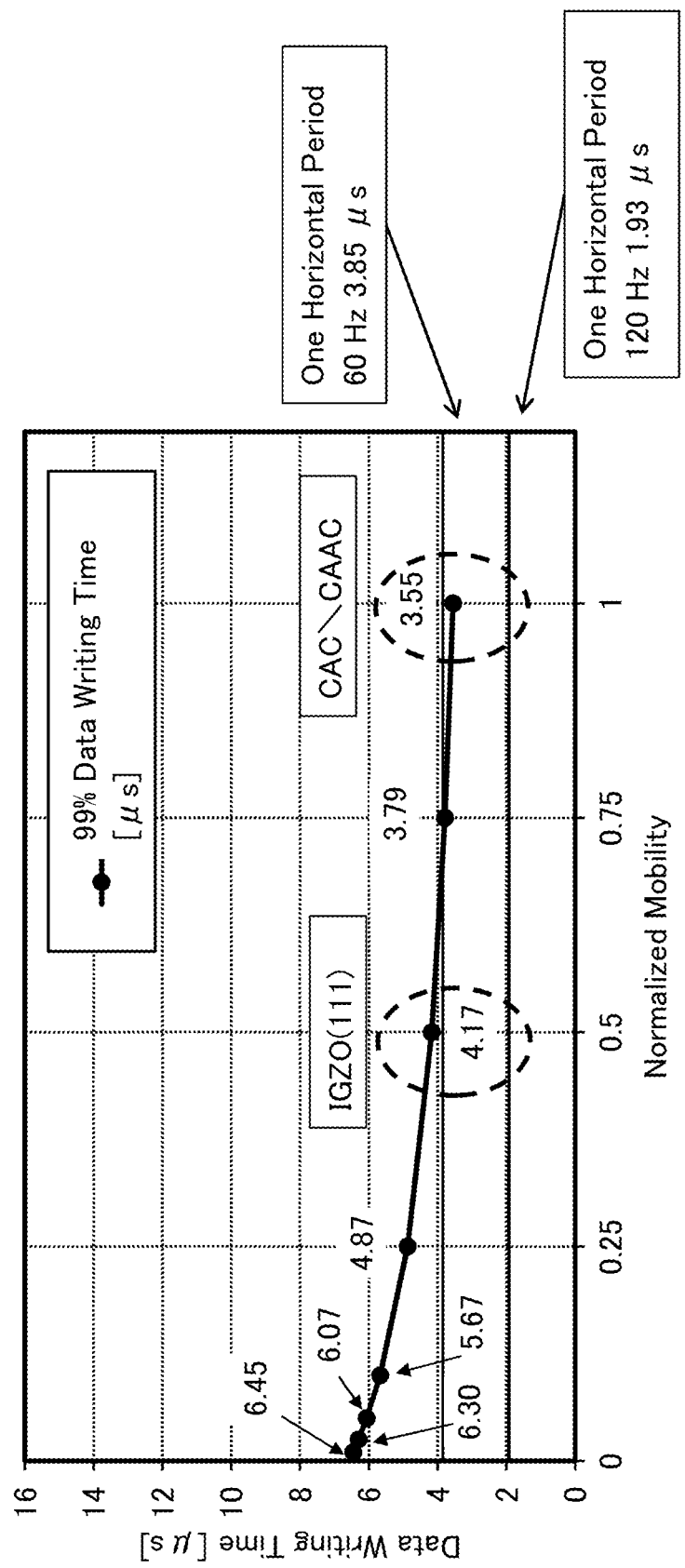
FIG. 27 Results of rough estimation of data writing time of Example 3.

The result of normalized mobility of 1 in FIG. 27 corresponds to the case where a stacked-layer structure of a metal oxide with an atomic ratio of In to Ga and Zn being In:Ga:Zn=4:2:3 is used for a semiconductor layer (denoted as "CAC\CAAC" in FIG. 27). At this time, the data writing time was 3.55 µs, which was shorter than one horizontal period 3.85 µs in 60-Hz driving; thus, it was estimated that operation was possible in 60-Hz driving. Furthermore, this data writing time was longer than one horizontal period 1.93 µs in 120-Hz driving; thus, it was estimated that 120-Hz driving was difficult.

The result of normalized mobility of 0.5 in FIG. 27 corresponds to the case where a single layer of a metal oxide with an atomic ratio of In to Ga and Zn being In:Ga:Zn=1:1:1 is used for a semiconductor layer (denoted as "IGZO (111)" in FIG. 27). At this time, the data writing time was 4.17 µs, which was longer than one horizontal period 3.85 µs in 60-Hz driving; thus, it was estimated that not only 120-Hz driving but also 60-Hz driving was difficult.

Next, rough estimation of data writing time in the case where amorphous silicon is used for a semiconductor layer will be described with reference to FIG. 28.

A period for charging a gate line of a pixel and a period for charging a source line and a pixel were roughly estimated in such a manner that the parasitic resistance and the parasitic capacitance were extracted from the pixel layout in FIG. 26(A) and the field-effect mobility which is a design parameter was changed from the actually measured value of the transistor fabricated using microcrystalline silicon. The transistor size and storage capacitance were not changed. In the case where amorphous silicon is actually used for a semiconductor layer, a larger transistor and storage capacitor are needed, and thus the data writing time needs to be longer than that shown as the result in this example. The load of the whole pixel area is described below. A parasitic resistance Rgl of the gate line is 3.60 kΩ, a parasitic capacitance Cgl of the gate line is 255 pF, a parasitic resistance Rsl of the source line is 5.80 kΩ, a parasitic capacitance Csl of the source line is 147 pF, and a parasitic capacitance Cpix of the pixel is 216.6 fF.

Figure 28:
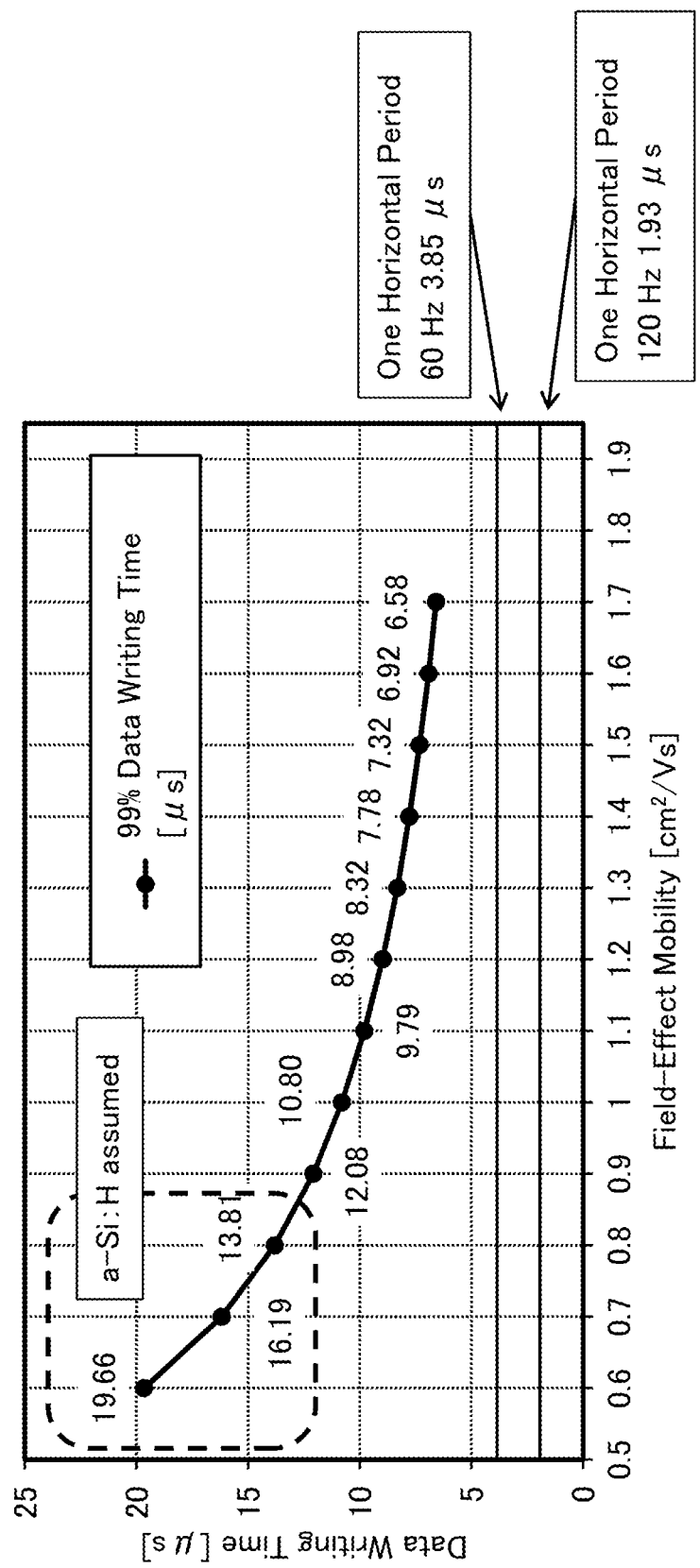
FIG. 28 Results of rough estimation of data writing time of Example 3.

The results of field-effect mobility of 0.6, 0.7, and 0.8 [cm$^2$/Vs] in FIG. 28 correspond to the case where amorphous silicon is used for a semiconductor layer. At this time, the data writing time were 19.66 µs, 16.19 µs, and 13.81 µs, respectively, which were longer than one horizontal period 1.93 µs in 120-Hz driving and one horizontal period 3.85 µs in 60-Hz driving; thus, it was estimated that not only 120-Hz driving but also 60-Hz driving was difficult.

<Case where Two Pixels are Selected at a Time>

Figure 29A:
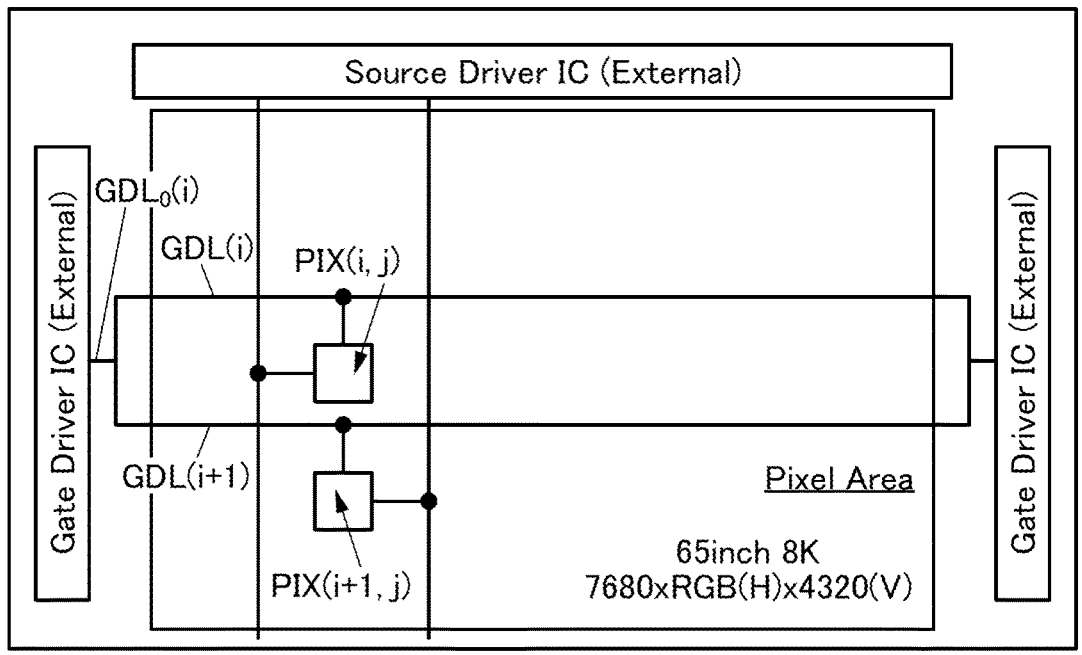
FIGS. 29A and 29BJ A block diagram illustrating a display module of Example 3 and a circuit diagram illustrating a pixel of Example 3.

FIG. 29(A) is a block diagram showing a configuration of a display module used in this example. With this configuration, a selection signal is supplied to two gate lines at a time, and two pixels that adjoin in the column direction are selected at a time. A gate driver and a source driver are both external circuits. A gate line is supplied with the same signal from two gate driver ICs. The gate line GDL$_0$(i) is electrically connected to the gate line GDL(i) and the gate line GDL(i+1), and pixels in two rows of the i-th row and the (i+1)-th row are driven at a time. A signal is supplied to a source line from one source driver IC. A pixel area is not divided. The pixel area has a diagonal of 65 inches, and the number of effective pixels is 7680×RGB (H)×4320 (V).

Figure 29B:
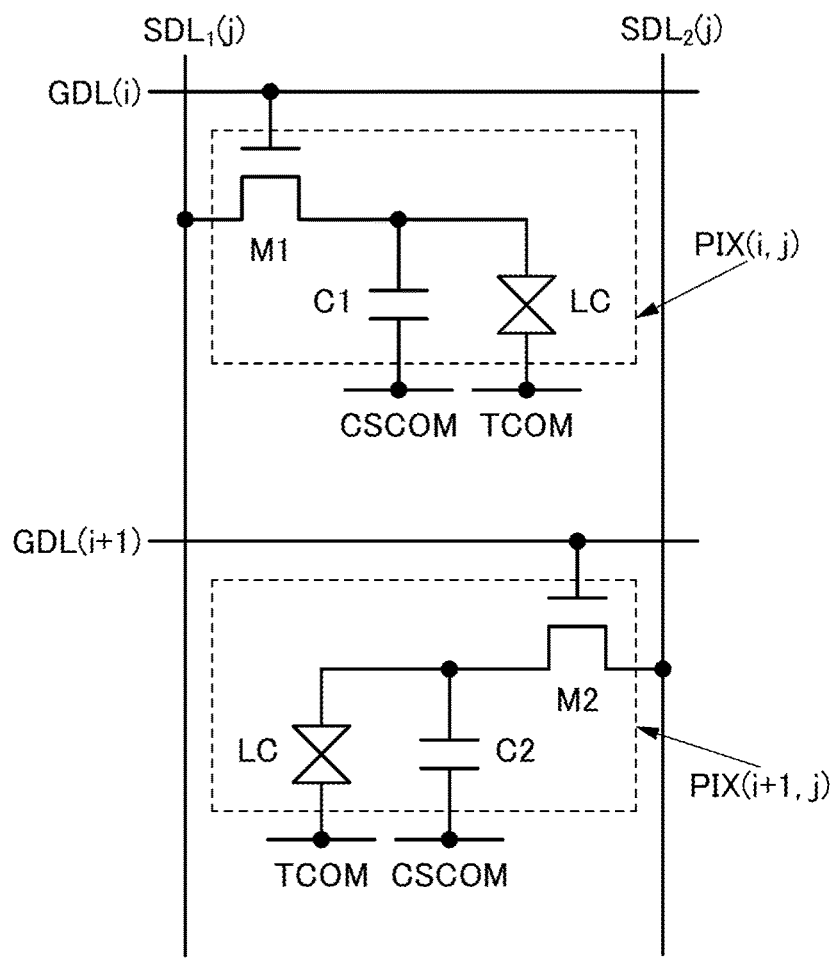

A circuit diagram of the pixel PIX(i, j) and a pixel PIX(i+1, j) is shown in FIG. 29(B). First, a configuration of the pixel PIX(i, j) will be described. The pixel PIX(i, j) includes the transistor M1, the capacitor C1, and the liquid crystal element LC. The gate of the transistor M1 is connected to the gate line GDL(i). One of the source and the drain of the transistor M1 is connected to a source line SDL$_1$(j), and the other is connected to one electrode of the capacitor C1 and one electrode of the liquid crystal element LC. The other electrode of the capacitor C1 is connected to the wiring CSCOM. The other electrode of the liquid crystal element LC is connected to the wiring TCOM.

Next, a configuration of the pixel PIX(i+1, j) will be described. The pixel PIX(i+1, j) includes a transistor M2, a capacitor C2, and the liquid crystal element LC. A gate of the transistor M2 is connected to the gate line GDL(i+1). One of a source and a drain of the transistor M2 is connected to a source line SDL$_2$(j), and the other is connected to one electrode of the capacitor C2 and one electrode of the liquid crystal element LC. The other electrode of the capacitor C2 is connected to the wiring CSCOM. The other electrode of the liquid crystal element LC is connected to the wiring TCOM.

Figure 30A:
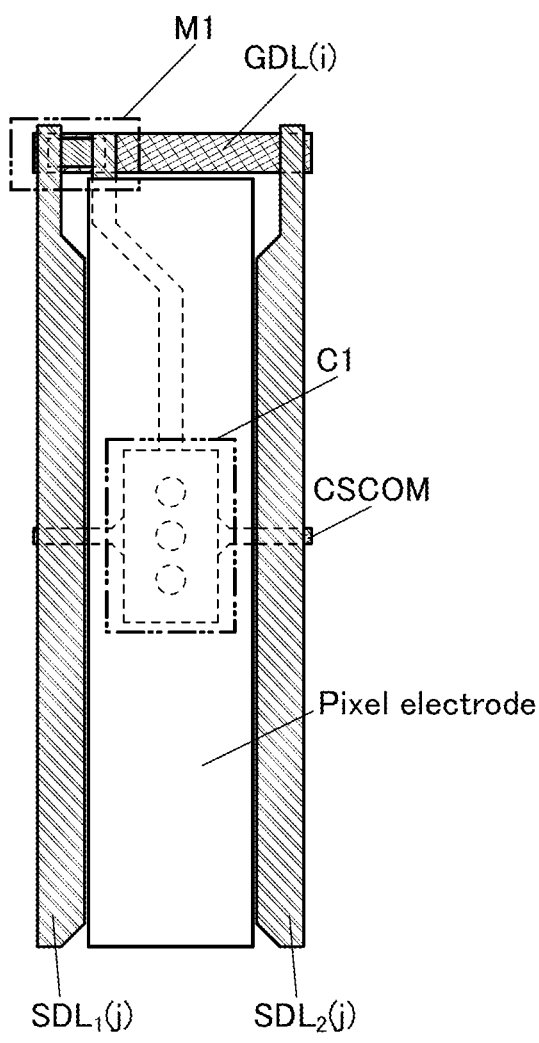
FIGS. 30A and 30BJ Top views illustrating pixel layouts of Example 3.
Figure 30B:
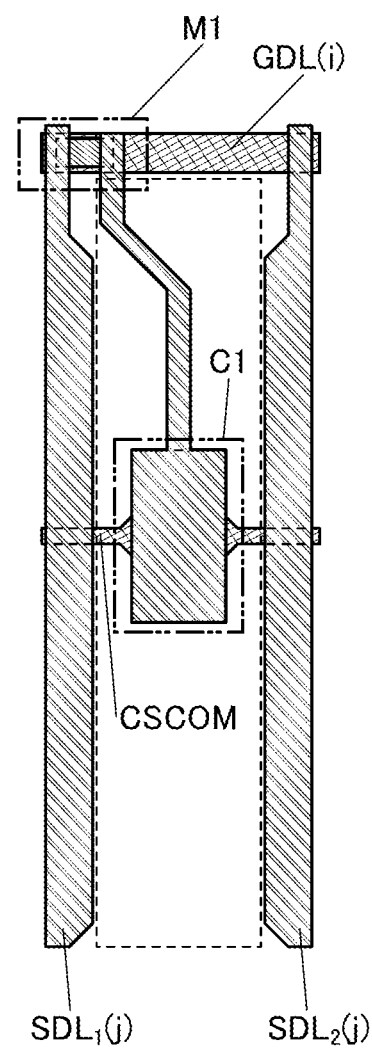

A pixel layout of a display module in the case where two pixels are selected at a time is illustrated in FIGS. 30(A) and (B). FIG. 30(A) is a top view in which a stacked-layer structure including components from the gate line GDL(i) to the pixel electrode is seen from the pixel electrode side. FIG. 30(B) is a top view excepting the pixel electrode in FIG. 30(A).

The pixel size is 62.5 µm×187.5 µm. The transistor M1 is a channel-etched transistor with a bottom-gate top-contact structure. The transistor M1 has a channel length L of 4 µm, a channel width W of 8 µm, and an overlap region L$_{ov}$ of 2 µm. The gate line GDL(i) has a width of 10 µm, and the wiring CSCOM has a width of 3.5 µm. Each of the source line SDL$_1$(j) and the source line SDL$_2$(j) has a width of 10 µm, but has a width of 4 µm at a portion crossing the gate line. The aperture ratio is 37.3%.

First, rough estimation of data writing time in the case where a metal oxide is used for a semiconductor layer will be described with reference to FIG. 31.

A period for charging a gate line of a pixel and a period for charging a source line and a pixel were roughly estimated in such a manner that the parasitic resistance and the parasitic capacitance were extracted from the pixel layout in FIG. 30(A) and only a parameter of the field-effect mobility of the transistor was changed. Here, a normalized value (normalized mobility) was used assuming that the field-effect mobility in the case where a stacked-layer structure of a metal oxide with an atomic ratio of In to Ga and Zn being In:Ga:Zn=4:2:3 was used for a semiconductor layer was 1. The transistor size was not changed. The load of the whole pixel area is described below. A parasitic resistance Rgl of the gate line is 3.60 kΩ, a parasitic capacitance Cgl of the gate line is 364 pF, a parasitic resistance Rsl of the source line is 4.83 kΩ, a parasitic capacitance Csl of the source line is 182 pF, and a parasitic capacitance Cpix of the pixel is 191 fF.

Figure 31:
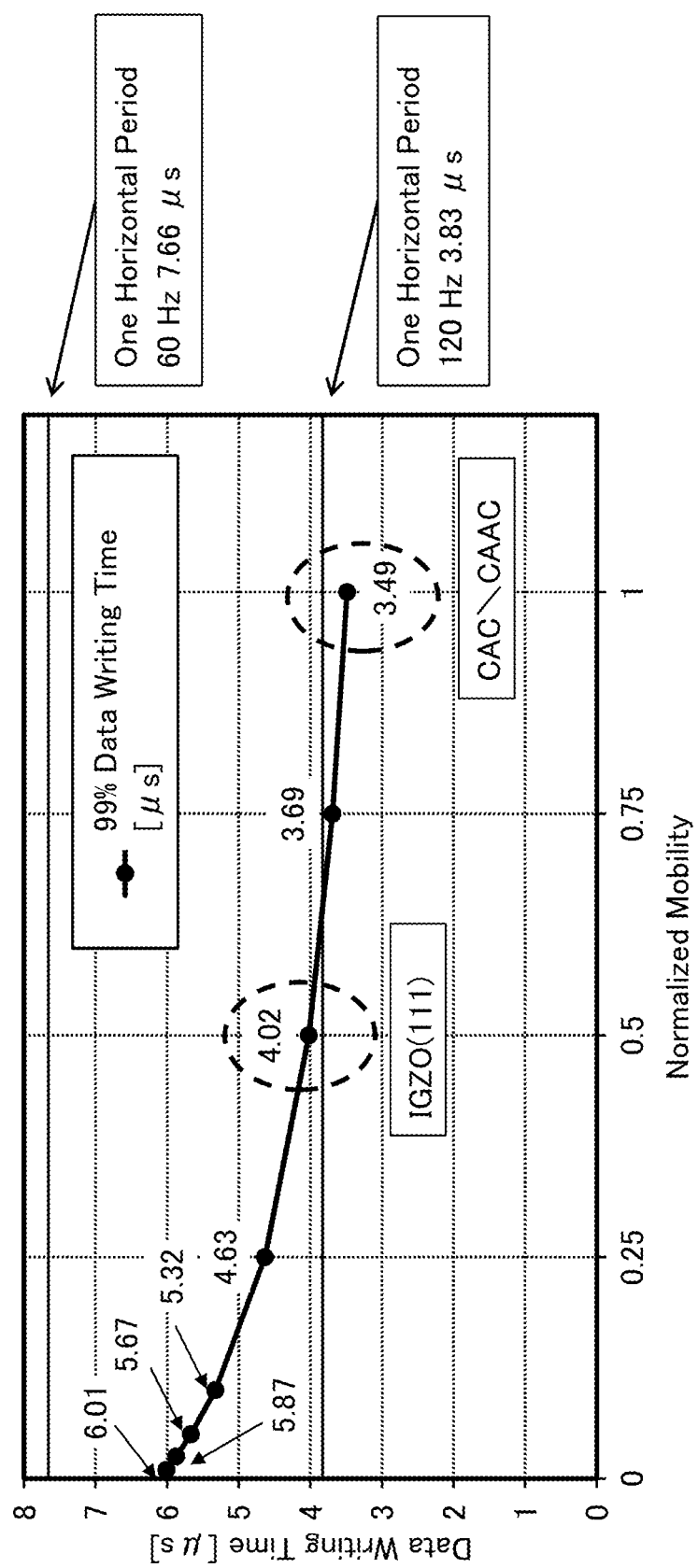
FIG. 31 Results of rough estimation of data writing time of Example 3.

The result of normalized mobility of 1 in FIG. 31 corresponds to the case where a stacked-layer structure of a metal oxide with an atomic ratio of In to Ga and Zn being In:Ga:Zn=4:2:3 is used for a semiconductor layer (denoted as "CAC\CAAC" in FIG. 31). At this time, the data writing time was 3.49 µs, which was shorter than one horizontal period 3.83 us in 120-Hz driving; thus, it was estimated that operation was possible in 120-Hz driving.

The result of normalized mobility of 0.5 in FIG. 31 corresponds to the case where a single layer of a metal oxide with an atomic ratio of In to Ga and Zn being In:Ga:Zn=1:1:1 is used for a semiconductor layer (denoted as "IGZO (111)" in FIG. 31). At this time, the data writing time was 4.02 µs, which was shorter than one horizontal period 7.66 us in 60-Hz driving; thus, it was estimated that operation was possible in 60-Hz driving. Furthermore, this data writing time was longer than one horizontal period 3.83 us in 120-Hz driving; thus, it was estimated that 120-Hz driving was difficult.

In FIG. 31, two gate lines are supplied with the same selection signal, so that the length of one horizontal period can be made twice the length of one horizontal period in FIG. 27. Therefore, a high-resolution display device can be operated easily with the use of a transistor with low field-effect mobility.

It is indicated from the results in FIG. 27 and FIG. 31 that, in the case where CAC\CAAC is used for a semiconductor layer, 120-Hz driving operation, which has been difficult with the configuration in which writing is performed in pixels one by one, is enabled by the configuration in which writing is performed in two pixels at a time.

Moreover, it is indicated from the results in FIG. 27 and FIG. 31 that, in the case where IGZO(111) is used for a semiconductor layer, 60-Hz driving operation, which has been difficult with the configuration in which writing is performed in pixels one by one, is enabled by the configuration in which writing is performed in two pixels at a time.

Next, rough estimation of data writing time in the case where amorphous silicon is used for a semiconductor layer will be described with reference to FIG. 32.

A period for charging a gate line of a pixel and a period for charging a source line and a pixel were roughly estimated in such a manner that the parasitic resistance and the parasitic capacitance were extracted from the pixel layout in FIG. 30(A) and the field-effect mobility which is a design parameter was changed from the actually measured value of the transistor fabricated using microcrystalline silicon. The transistor size and storage capacitance were not changed. The load of the whole pixel area is described below. A parasitic resistance Rgl of the gate line is 3.60 kΩ, a parasitic capacitance Cgl of the gate line is 364 pF, a parasitic resistance Rsl of the source line is 4.83 kΩ, a parasitic capacitance Csl of the source line is 182 pF, and a parasitic capacitance Cpix of the pixel is 191 fF.

Figure 32:
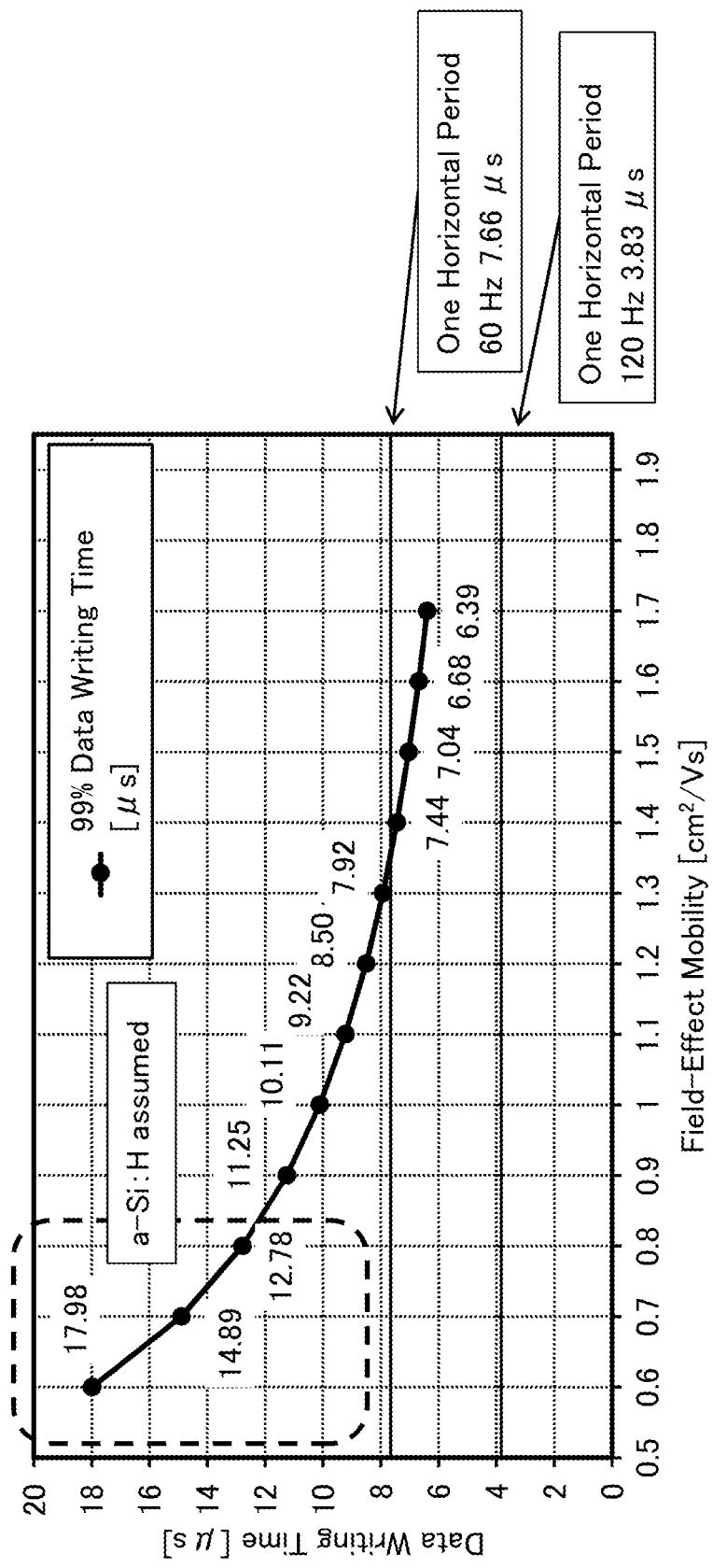
FIG. 32 Results of rough estimation of data writing time of Example 3.

The results of field-effect mobility of 0.6, 0.7, and 0.8 [cm$^2$/Vs] in FIG. 32 correspond to the case where amorphous silicon is used for a semiconductor layer. At this time, the data writing time were 17.98 μs, 14.89 μs, and 12.78 μs, respectively, which were longer than one horizontal period 3.83 μs in 120-Hz driving and one horizontal period 7.66 μs in 60-Hz driving; thus, it was estimated that not only 120-Hz driving but also 60-Hz driving was difficult.

It was estimated from the results in FIG. 32 that, in the case where amorphous silicon was used for a semiconductor layer, 60-Hz driving operation was difficult even with the configuration in which writing was performed in two pixels at a time, which was different from the case where a metal oxide was used for a semiconductor layer (see the result in FIG. 31).

The above rough estimation results are summarized in Table 2. In Table 2, a circle represents conditions where operation is possible, and a cross represents conditions where operation is difficult. Furthermore, a triangle represents conditions where operation is possible when the thickness of the insulating layer is increased.

TABLE 2

| Conditions | | | | IGZO(423) |
|---|---|---|---|---|
| Frequency | Pixel selection | a-Si:H | IGZO(111) | (CAC\CAAC) |
| 60 Hz | One by one | x | x | ○ |
| | Two at a time | x | ○ | ○ |
| 120 Hz | One by one | x | x | Δ |
| | Two at a time | x | x | ○ |

Moreover, rough estimation of data writing time in the case of changing the pixel area size (the screen size) was performed. On the basis of the pixel layout used in the above-described rough estimation, rough estimation was performed on the assumption that the parasitic resistance and the parasitic capacitance were changed in proportion to the pixel area size.

Figure 33:
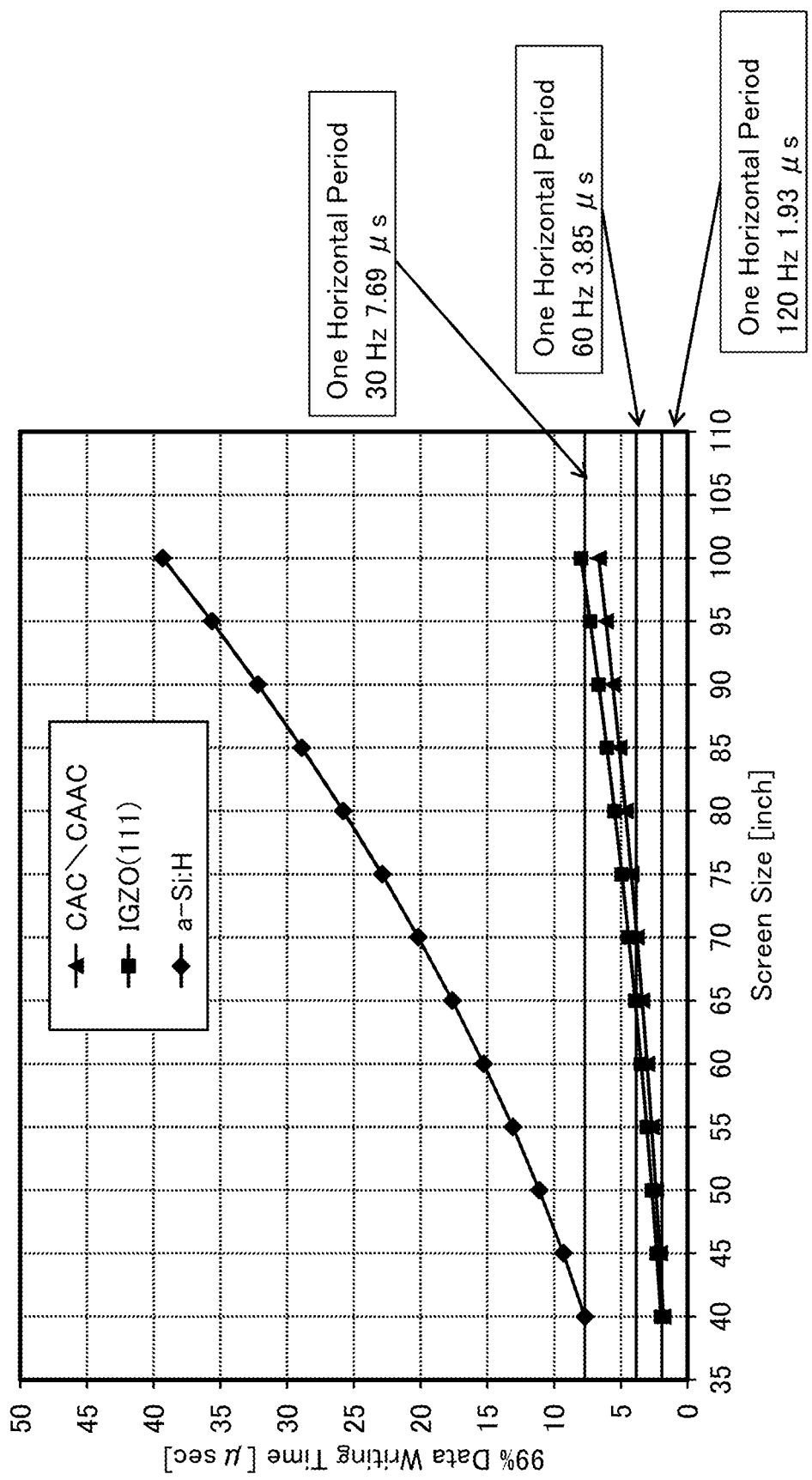
FIG. 33 Results of rough estimation of data writing time of Example 3.
Figure 34:
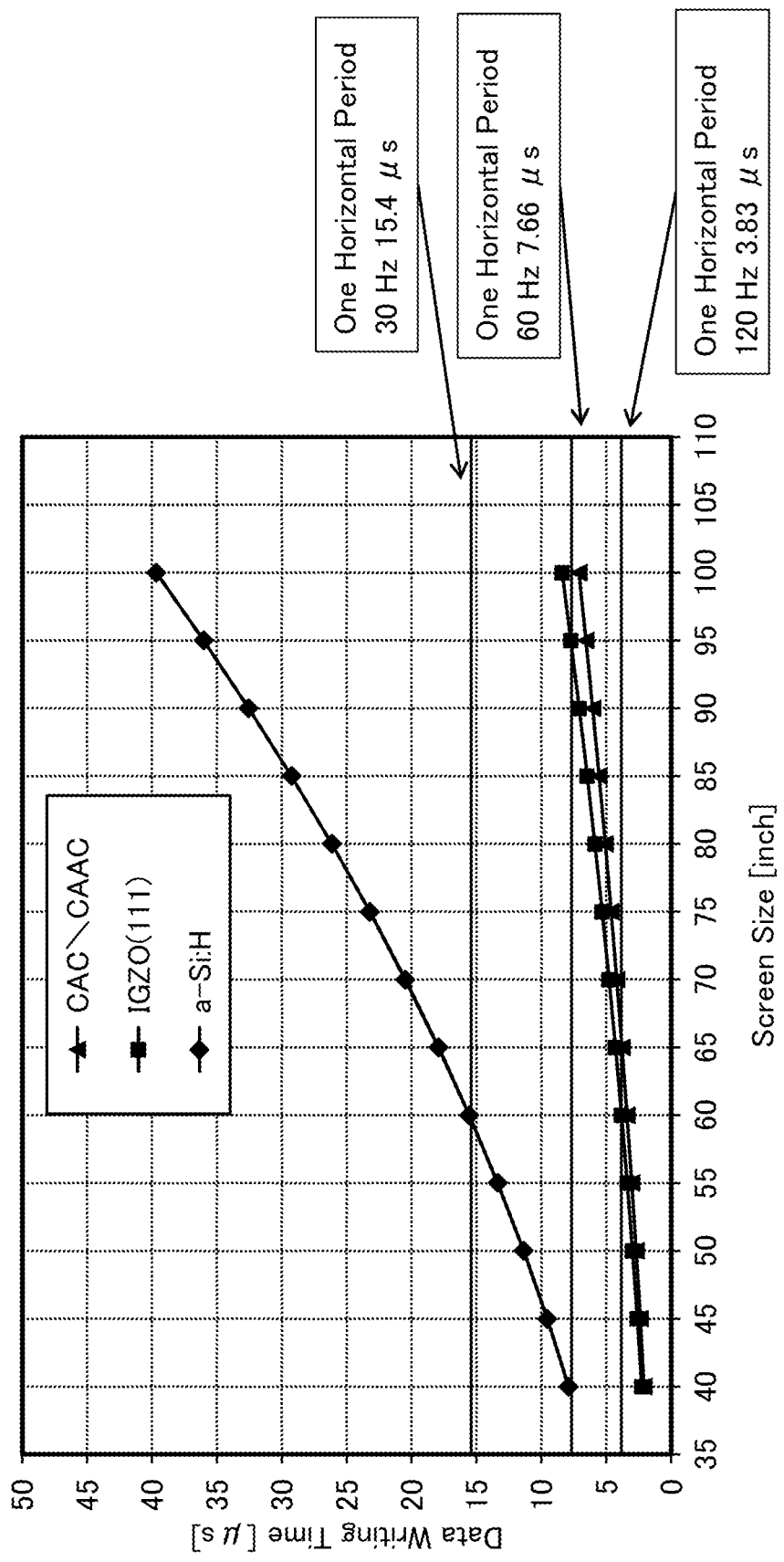
FIG. 34 Results of rough estimation of data writing time of Example 3.

The rough estimation of data writing time in the case where pixels are selected one by one is shown in FIG. 33. The rough estimation of data writing time in the case where two pixels are selected at a time is shown in FIG. 34.

Figure 35:
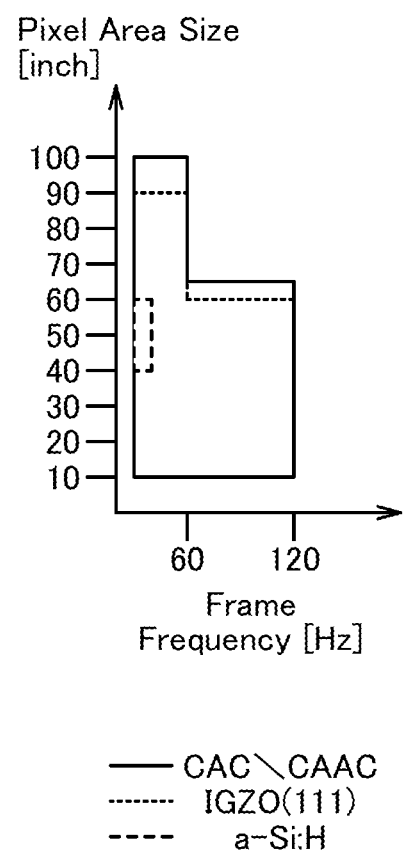
FIG. 35 Results of rough estimation of data writing time of Example 3.

Furthermore, the relationship between the pixel area size and the frame frequency is shown in FIG. 35.

FIG. 35 is a diagram showing the relationship between the pixel area size and the frame frequency in the case where two pixels are selected at a time.

With CAC\CAAC, the operation might be performed up to 100 inches at 60 Hz and up to 65 inches at 120 Hz. With IGZO(111), the operation might be performed up to 90 inches at 60 Hz and up to 60 inches at 120 hz. With a-Si:H, the operation might be performed from 40 inches to 60 inches at 30 Hz.

In addition, results of rough estimation of data writing time of a display module with a configuration shown in Table 3 will be described. Specifically, an 8K4K liquid crystal display module including a pixel area with a diagonal of 55 inches with the use of CAC\CAAC for a semiconductor layer was examined. A source driver is an external circuit and a gate driver is incorporated. Similar to the pixel area shown in FIG. 29(A), a configuration in which a selection signal is supplied to two gate lines at a time and two pixels that adjoin in the column direction are selected at a time was examined.

TABLE 3

| | |
|---|---|
| Pixel area | 55 inches |
| Number of effective pixels | 7680 × RGB(H) × 4320(V): 8K |
| Pixel size | 159 μm × 159 μm |
| Definition | 160 ppi |
| Liquid crystal mode | FFS mode (lateral electric-field mode) |
| FET | CAC\CAAC (channel-etched structure) |
| Frame frequency | 120 Hz |
| Grayscale | 12 bit |
| Gate driver | Incorporated |
| Source driver | External |
| Screen division | No (seamless) |

As a result of the rough estimation, the gate fall time was 1.77 μs and a period for charging a source line and a pixel (a time until the potential of the source line reaches 95% of the maximum input voltage) was 1.82 μs. The total time was 3.59 μs, which was shorter than one horizontal period 3.83 μs in 120-Hz driving; thus, it was estimated that operation was possible in 120-Hz driving.

As described above, it is indicated that in the 8K4K liquid crystal display module including a pixel area with a diagonal of 55 inches with the use of CAC\CAAC for a semiconductor layer of a transistor, even when the gate driver is incorporated, 120-Hz driving operation is enabled by the configuration in which writing is performed in two pixels at a time.

REFERENCE NUMERALS 100 transistor
100A transistor
100B transistor
100C transistor
100D transistor
102 substrate
104 conductive layer
106 insulating layer
106a region
108 semiconductor layer
108a semiconductor layer
108b semiconductor layer
108n region
112a conductive layer
112b conductive layer
114 insulating layer
116 insulating layer
118 insulating layer
120a conductive layer
120b conductive layer
121 conductive layer
121a conductive film
122 conductive layer
122a conductive film
123 conductive layer
123a conductive film
128a metal oxide film
128b metal oxide film
130a oxygen
130b oxygen
130c oxygen
131 resist mask
132 resist mask
142a connection portion
142b connection portion
501 pixel circuit
502 pixel portion
504 driver circuit portion
504a gate driver
504b source driver
506 protection circuit
507 terminal portion
550 transistor
552 transistor
554 transistor
560 capacitor
562 capacitor
570 liquid crystal element
572 light-emitting element
600 television device
601 control portion
602 memory portion
603 communication control portion
604 image processing circuit
605 decoder circuit
606 video signal reception portion
607 timing controller
608 source driver
609 gate driver
610 neural network
611 input layer
612 middle layer
613 output layer
615 neuron
620 display panel
621 pixel
630 system bus
700 display device
700A display device
701 substrate
702 pixel portion
704 source driver circuit portion
705 substrate
706 gate driver circuit portion
708 FPC terminal portion
710 signal line
711 wiring portion
712 sealant
716 FPC
721 source driver IC
722 gate driver circuit
723 FPC
724 printed board
730 insulating film
732 sealing film
734 insulating film
736 coloring film
738 light-blocking film
750 transistor
752 transistor
760 connection electrode
770 planarization insulating film
772 conductive film
773 insulating film
774 conductive film
775 liquid crystal element
776 liquid crystal layer
778 structure body
780 anisotropic conductive film
782 light-emitting element
786 EL layer
788 conductive film
790 capacitor
791 touch panel
792 insulating film
793 electrode
794 electrode
795 insulating film
796 electrode
797 insulating film
7000 display portion
7100 television device
7101 housing
7103 stand
7111 remote controller
7200 laptop personal computer
7211 housing
7212 keyboard
7213 pointing device
7214 external connection port
7300 digital signage
7301 housing
7303 speaker
7311 information terminal
7400 digital signage
7401 pillar
7411 information terminal

The invention claimed is:

1. A method for manufacturing a semiconductor device, comprising:
   a first step of forming a first insulating layer containing silicon and nitrogen;
   a second step of adding oxygen in a vicinity of a surface of the first insulating layer;
   a third step of forming a semiconductor layer containing a metal oxide over and in contact with the first insulating layer;
   a fourth step of forming a second insulating layer containing oxygen over and in contact with the semiconductor layer;
   a fifth step of performing plasma treatment in an atmosphere containing oxygen at a first temperature;
   a sixth step of performing plasma treatment in an atmosphere containing oxygen at a second temperature; and
   a seventh step of forming a third insulating layer containing silicon and nitrogen over the second insulating layer,
   wherein the second temperature is lower than the first temperature.

2. The method for manufacturing a semiconductor device, according to claim 1,
   wherein the first temperature is higher than or equal to 250° C. and lower than or equal to 450° C., and
   wherein the second temperature is higher than or equal to 150° C. and lower than or equal to 300° C.

3. The method for manufacturing a semiconductor device, according to claim 1,
   wherein the fifth step is performed without exposure to atmospheric air after formation of the second insulating layer.

4. The method for manufacturing a semiconductor device, according to claim 1, further comprising:
   an eighth step of performing plasma treatment in an atmosphere containing oxygen at a third temperature between the third step and the fourth step,
   wherein the third temperature is higher than the second temperature.

5. The method for manufacturing a semiconductor device, according to claim 1,
   wherein the second insulating layer is formed at the first temperature.

6. A semiconductor device comprising:
   a first conductive layer;
   a first insulating layer;
   a semiconductor layer;
   a second insulating layer; and
   a third insulating layer,
   wherein the first conductive layer, the first insulating layer, the semiconductor layer, the second insulating layer, and the third insulating layer are stacked in this order,
   wherein the first insulating layer contains silicon and nitrogen,
   wherein the semiconductor layer contains a metal oxide,
   wherein the second insulating layer contains oxygen,
   wherein the third insulating layer contains silicon and nitrogen,
   wherein the first insulating layer comprises a first region including a surface in contact with the semiconductor layer and the other second region, and
   wherein the first region has a higher concentration of oxygen than the second region.

7. The semiconductor device according to claim 6,
   wherein the second insulating layer has a lower concentration of nitrogen than the third insulating layer.

8. The semiconductor device according to claim 6,
   wherein the second insulating layer has a smaller thickness than the third insulating layer.

9. The semiconductor device according to claim 6,
   wherein a first metal oxide film and a second metal oxide film are stacked in the semiconductor layer,
   wherein the first metal oxide film comprises a portion in contact with the first region of the first insulating layer,
   wherein the second metal oxide film comprises a portion in contact with the second insulating layer, and
   wherein the first metal oxide film has lower crystallinity than the second metal oxide film.

10. The semiconductor device according to claim 6, further comprising:
    a second conductive layer; and
    a third conductive layer,
    wherein the second conductive layer and the third conductive layer each comprise a portion in contact with the semiconductor layer and a portion positioned between the first insulating layer and the second insulating layer.

11. The semiconductor device according to claim 6, further comprising:
    a second conductive layer; and
    a third conductive layer,
    wherein the second conductive layer and the third conductive layer each comprise a portion positioned over the second insulating layer and a portion in contact with the semiconductor layer through an opening provided in the second insulating layer.

12. The semiconductor device according to claim 10,
    wherein the second conductive layer and the third conductive layer each comprise a first conductive film, a second conductive film, and a third conductive film,
    wherein the first conductive film comprises a portion in contact with the semiconductor layer,
    wherein the second conductive film is provided over the third conductive film,
    wherein the third conductive film is provided to cover a top surface and a side surface of the second conductive film and comprises a portion in contact with the first conductive film,
    wherein the first conductive film and the second conductive film contain metal elements different from each other, and
    wherein the second conductive film and the third conductive film contain metal elements different from each other.

13. The semiconductor device according to claim 12,
    wherein the first conductive film and the third conductive film contain the same metal element, and
    wherein the second conductive film contains a material having lower resistance than those of the first conductive layer and the third conductive layer.

14. The semiconductor device according to claim 12,
    wherein the first conductive film and the third conductive film each contain titanium or molybdenum, and
    wherein the second conductive film contains copper or aluminum.

* * * * *